United States Patent
Percey et al.

(10) Patent No.: US 6,204,689 B1
(45) Date of Patent: Mar. 20, 2001

(54) INPUT/OUTPUT INTERCONNECT CIRCUIT FOR FPGAS

(75) Inventors: Andrew K. Percey; Trevor J. Bauer; Steven P. Young, all of San Jose, CA (US)

(73) Assignee: Xilinx, Inc., San Jose, CA (US)

( * ) Notice: Subject to any disclaimer, the term of this patent is extended or adjusted under 35 U.S.C. 154(b) by 0 days.

(21) Appl. No.: 09/321,513

(22) Filed: May 27, 1999

Related U.S. Application Data

(63) Continuation-in-part of application No. 08/821,263, filed on Mar. 20, 1997, which is a continuation-in-part of application No. 08/806,997, filed on Feb. 26, 1997, now Pat. No. 5,914,616.

(51) Int. Cl.[7] .......................... H01L 25/00; H03K 19/177
(52) U.S. Cl. .................................. 326/41; 326/38; 326/47
(58) Field of Search .................................. 326/41, 38, 39, 326/47

(56) References Cited

U.S. PATENT DOCUMENTS

| Re. 34,363 | 8/1993 | Freeman . |
| 4,124,899 | 11/1978 | Birkner et al. ..................... 364/716 |
| 4,642,487 | 2/1987 | Carter . |

(List continued on next page.)

FOREIGN PATENT DOCUMENTS

| 0451798A2 | 6/1991 | (EP) . |
| 0 630 115 A2 | 12/1994 | (EP) . |
| 0746107A2 | 12/1996 | (EP) . |
| 0748049A2 | 12/1996 | (EP) . |
| 2 295 738 | 6/1996 | (GB) . |
| 2300951 | 11/1996 | (GB) . |
| WO 93/05577 | 8/1992 | (WO) . |
| WO9410754 | 5/1994 | (WO) . |

OTHER PUBLICATIONS

"The Programmable Logic Data Book", 1996, available from Xilinx Inc., 2100 Logic Drive, San Jose, California, 95124, pp. 4–1 to 4–49.

Neil H. E. Weste and Kamran Eshraghian, "Principles of CMOS VLSI: A Systems Approach", by AT&T Bell Laboratories, Inc, published by Addison–Wesley Publishing Company, copyright 1995, pp. 56.

"The Programmable Gate Array Data Book", 1989, available from Xilinx Inc., 2100 Logic Drive, San Jose, California, 95124, pp. 6–30 through 6–44.

(List continued on next page.)

Primary Examiner—Michael Tokar
Assistant Examiner—Daniel D. Chang
(74) Attorney, Agent, or Firm—E. Eric Hoffman, Esq.; Bever, Hoffman & Harms; Lois D. Cartier

(57) ABSTRACT

An input/output interconnect (IOI) circuit is provided for coupling input/output (IO) blocks to an array of configurable logic tiles in a field programmable gate array (FPGA). Each of the tiles includes a configurable logic block and a programmable interconnect structure that includes a plurality of intermediate-length buses. The intermediate-length buses are staggered, such that only a subset of the intermediate-length buses routed by a logic block is connected to the logic block. The IOI circuit includes routing circuits at the perimeter of the array for terminating the intermediate-length buses. In one embodiment, the routing circuits connect various ends of unidirectional intermediate-length buses in a U-turn configuration, thereby making use of all of the intermediate-length buses, and maintaining a regular pattern of intermediate-length buses in the tiles. In another embodiment, various ends of bi-directional intermediate-length buses are terminated to long lines through programmable interconnection points (PIPs). In another embodiment, PIPs are provided to enable horizontal long lines to be connected to horizontal intermediate-length buses, which in turn, can be connected to vertical long lines, thereby providing a low-skew, high fanout routing network.

21 Claims, 28 Drawing Sheets

U.S. PATENT DOCUMENTS

| | | | |
|---|---|---|---|
| 4,706,216 | 11/1987 | Carter . | |
| 4,750,155 | 6/1988 | Hsieh | 365/203 |
| 4,758,745 | 7/1988 | Elgamal et al. . | |
| 4,821,233 | 4/1989 | Hsieh | 365/203 |
| 4,870,302 | 9/1989 | Freeman . | |
| 5,001,368 | 3/1991 | Cliff et al. | 307/465 |
| 5,073,729 | 12/1991 | Greene et al. . | |
| 5,079,451 | 1/1992 | Gudger et al. | 307/465 |
| 5,122,685 | 6/1992 | Chan et al. | 307/465 |
| 5,144,166 | 9/1992 | Camarota et al. . | |
| 5,148,390 | 9/1992 | Hsieh | 365/95 |
| 5,157,618 | 10/1992 | Ravindra et al. | 364/490 |
| 5,185,706 | 2/1993 | Agrawal et al. | 364/489 |
| 5,198,705 | 3/1993 | Galbraith et al. | 307/465 |
| 5,208,491 | 5/1993 | Ebeling et al. . | |
| 5,231,588 | 7/1993 | Agrawal et al. | 364/489 |
| 5,241,224 | 8/1993 | Pedersen et al. | 307/465 |
| 5,243,238 | 9/1993 | Kean . | |
| 5,245,227 | 9/1993 | Furtek et al. | 307/465 |
| 5,258,668 | 11/1993 | Cliff | 307/465 |
| 5,260,610 | 11/1993 | Pedersen et al. . | |
| 5,260,611 | 11/1993 | Cliff et al. . | |
| 5,260,881 | 11/1993 | Agrawal et al. . | |
| 5,267,187 | 11/1993 | Hsieh et al. . | |
| 5,280,202 | 1/1994 | Chan | 307/465 |
| 5,313,119 | 5/1994 | Cooke et al. | 307/465.1 |
| 5,317,209 | 5/1994 | Garverick et al. | 307/465 |
| 5,319,255 | 6/1994 | Garverick et al. | 307/272.3 |
| 5,323,069 | 6/1994 | Smith, Jr. | 307/465 |
| 5,333,279 | 7/1994 | Dunning | 395/325 |
| 5,343,406 | 8/1994 | Freeman et al. | 364/490 |
| 5,347,519 | 9/1994 | Cooke et al. | 371/22.2 |
| 5,349,250 | 9/1994 | New . | |
| 5,357,153 | 10/1994 | Chiang et al. . | |
| 5,359,242 | 10/1994 | Veenstra | 307/465 |
| 5,365,125 | 11/1994 | Goetting et al. . | |
| 5,455,525 | 10/1995 | Ho et al. . | |
| 5,457,410 | 10/1995 | Ting . | |
| 5,469,003 | 11/1995 | Kean . | |
| 5,481,206 | 1/1996 | New et al. | 326/38 |
| 5,500,609 | 3/1996 | Kean | 326/41 |
| 5,504,440 | 4/1996 | Sasaki | 326/39 |
| 5,537,057 | 7/1996 | Leong et al. | 326/41 |
| 5,543,732 | 8/1996 | McClintock et al. | 326/41 |
| 5,546,018 | 8/1996 | New et al. | 326/38 |
| 5,546,596 | 8/1996 | Geist | 395/200.02 |
| 5,581,199 | 12/1996 | Pierce et al. . | |
| 5,583,450 | 12/1996 | Trimberger et al. | 326/41 |
| 5,629,886 | 5/1997 | New . | |
| 5,635,851 | 6/1997 | Tavana | 326/27 |
| 5,646,546 | 7/1997 | Bertolet et al. | 326/39 |
| 5,682,107 | 10/1997 | Tavana et al. | 326/41 |
| 5,724,276 | 3/1998 | Rose et al. | 364/716.06 |
| 5,740,069 | 4/1998 | Agrawal et al. | 326/47 |
| 5,760,604 | 6/1998 | Pierce et al. | 326/39 |
| 5,900,743 | * 5/1999 | McClintock et al. | 326/41 |
| 5,963,050 | * 10/1999 | Young et al. | 326/41 |

OTHER PUBLICATIONS

"The Programmable Logic Data Book", 1993, available from Xilinx Inc., 2100 Logic Drive, San Jose, California, 95124, pp. 1–1 through 1–7; 2–1 through 2–42; 2–97 through 2–130; and 2–177 through 2–204.

Luis Morales,"Boundary Scan in XC4000 Devices", XAPP 017.001, Oct. 1992, pp. 2–108 and 2–180.

Xilinx, Inc., "The Programmable Logic Data Book", Sep. 1996, available from Xilinx, Inc., 2100 Logic Drive, San Jose, CA 95124, pp. (4–188 to 4–190); (4–294 to 4–295); and (13–13 to 13–15).

Xilinx, Inc., "The Programmable Logic Data Book" 1996, available from Xilinx, Inc., 2100 Logic Drive, San Jose, CA 95124, pp. 4–11 to 4–23 and 4–32 to 4–37.

Lucent Technologies, Microelectronics Group, ORCA, "Field–Programmable Gate Arrays Data Book," Oct. 1996, pp. 2–9 to 2–20.

Altera Corporation, "FLEX 10K Embedded Programmable Logic Family Data Sheet" from the Altera Digital Library, 1996, available from Altera Corporation, 2610 Orchard Parkway, San Jose, CA 95134–2020, pp. 31–53.

* cited by examiner

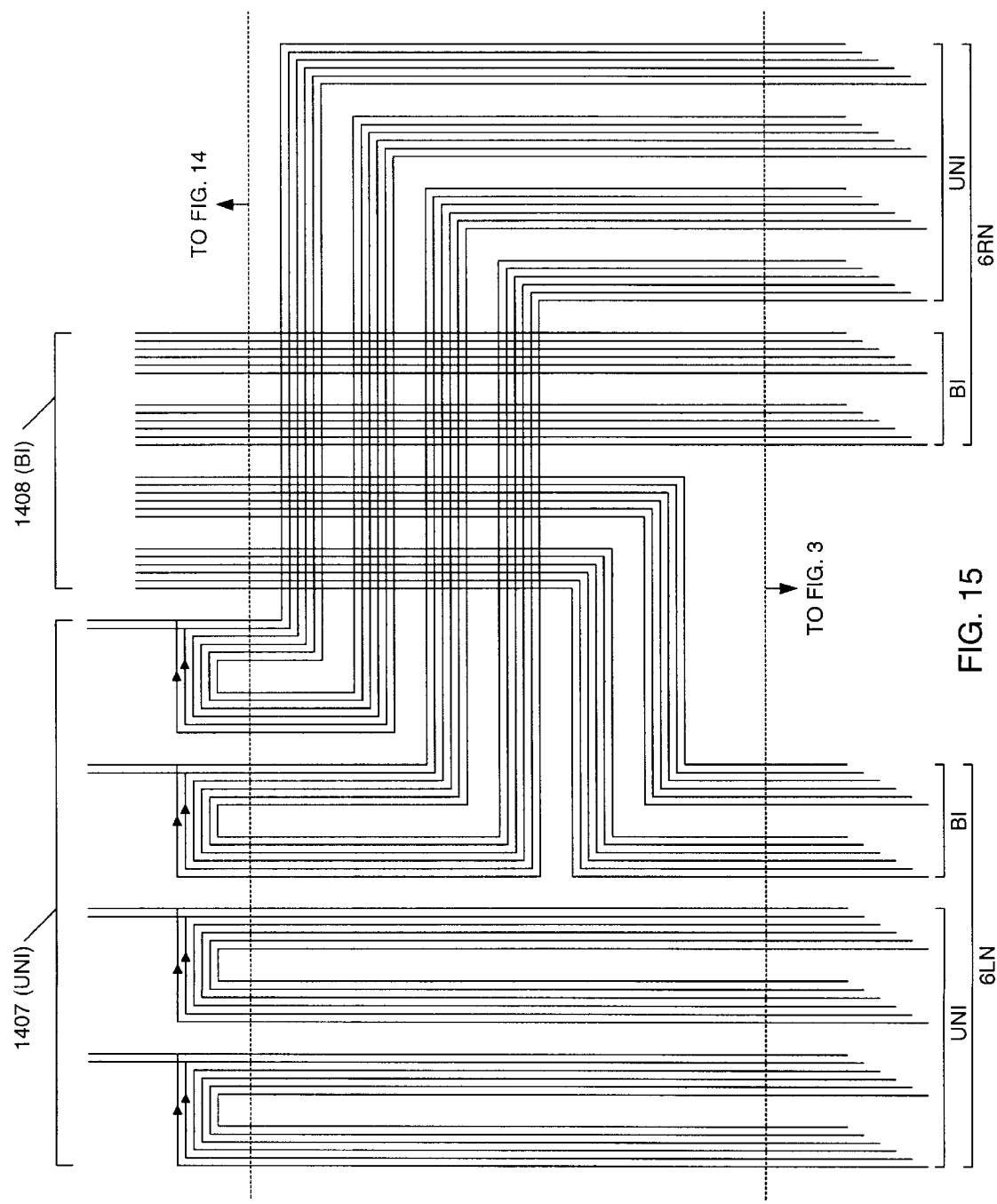

INPUT/OUTPUT INTERCONNECT CIRCUIT FOR FPGAS

CROSS-REFERENCE TO RELATED APPLICATIONS

This application is a continuation-in-part application of commonly assigned co-pending U.S. patent application Ser. No. 08/821,263, invented by Steven P. Young, Trevor J. Bauer, Kamal Chaudhary, and Sridhar Krishnamurthy and filed Mar. 20, 1997, which is a continuation-in-part of commonly assigned U.S. patent application Ser. No. 08/806, 997, now U.S. Pat. No. 5,914,616, invented by Steven P. Young, Kamal Chaudhary, and Trevor J. Bauer and filed Feb. 26, 1997, both of which are incorporated herein by reference.

This application further relates to the following commonly assigned co-pending U.S. patent applications:

1. Ser. No. 08/786,818 invented by Kenneth D. Chapman and Steven P. Young, entitled "CONFIGURABLE LOGIC BLOCK WITH AND GATE FOR EFFICIENT MULTIPLICATION IN FPGAs" and filed Jan. 21, 1997, and
2. Ser. No. 08/754,421 invented by Trevor J. Bauer, entitled "LOOKUP TABLES WHICH DOUBLE AS SHIFT REGISTERS" and filed Nov. 22, 1996, which are also incorporated herein by reference.

BACKGROUND OF THE INVENTION

1. Field of the Invention

The invention relates to programmable integrated circuit devices, more particularly to the interconnect structure in a field programmable logic device.

2. Description of the Background Art

Field programmable gate arrays (FPGAs) include logic blocks connectable through a programmable interconnect structure. The interconnect structure typically provides for connecting each logic block to each other logic block. Early FPGAs accomplished this by providing short interconnect segments that could be joined to each other and to input and output terminals of the logic blocks at programmable interconnection points (PIPs). As these FPGAs become larger and more complex, the interconnect structure must also become both larger and more complex. In order to improve speed (performance), direct connections to adjacent logic blocks have been provided, and for transmitting a signal the distance of many logic blocks, longer lines have been provided. In order to save silicon area, less frequent PIPs have been provided. With fewer PIPs present, the routing is less flexible (for the same number of routing lines), but typically faster due to reduced loading. By removing only those PIPs which are least often used, routing flexibility can be minimally affected. Thus, there is a trade-off between performance, silicon area, number of routing lines, and routing flexibility.

Several U.S. Patents show such structures for interconnecting logic blocks in FPGAs. Freeman in U.S. Reissue Patent Re 34,363 describes the first FPGA interconnect structure, and includes short routing segments and flexible connections as well as global lines for signals such as clock signals. Carter in U.S. Pat. No. 4,642,487 shows the addition of direct connections between adjacent logic blocks to the interconnect structure of Freeman. These direct connections provide fast paths between adjacent logic blocks. Greene et al in U.S. Pat. No. 5,073,729 shows a segmented interconnect structure with routing lines of varied lengths. Kean in U.S. Pat. No. 5,469,003 shows a hierarchical interconnect structure having lines of a short length connectable at boundaries to lines of a longer length extending between the boundaries, and larger boundaries with lines of even longer length extending between those boundaries. Kean shows in particular lines the length of one logic block connecting each logic block to the next, lines the length of four logic blocks connectable to each logic block they pass, and lines the length of sixteen logic blocks connectable at the length-four boundaries to the length-four lines but not connectable directly to the logic blocks. In Kean's architecture, adjacent logic blocks in two different hierarchical blocks (i.e., on either side of the boundaries) connect to each other differently than adjacent logic blocks in the same hierarchical block.

Pierce et al in U.S. Pat. No. 5,581,199 shows a tile-based interconnect structure with lines of varying lengths in which each tile in a rectangular array may be identical to each other tile. In the Pierce et al architecture, an interconnect line is part of the output structure of a logic block. Output lines of more than one length extend past other logic block input lines to which the logic block output lines can be connected. All of the above-referenced patents are incorporated herein by reference, and can be reviewed for more understanding of prior art routing structures in FPGAs.

In the interconnect structures described by Freeman and Greene et al, each path is formed by traversing a series of programmably concatenated interconnect lines, i.e., a series of relatively short interconnect lines are programmably connected end to end to form a longer path. The relatively large number of programmable connections on a given signal path introduces delay into the signal path and therefore reduces the performance of the FPGA. Such interconnect structures are called "general interconnect".

The direct connections first described by Carter and included in the architecture of Kean provide fast paths between adjacent logic blocks, but in Carter's structure general interconnect must still be used to traverse the distance between any two blocks that are not adjacent. Therefore, circuits large enough or complex enough to require interconnecting signals between non-adjacent blocks (which frequently occur) must use the general interconnect to make these connections. For short paths, general interconnect is slower than direct interconnect, because general interconnect must be connected through several PIPs, or, if long lines are used, must be buffered to accommodate long or heavily loaded signals, introducing delay. Additionally, it is inefficient in terms of silicon area to use long lines for short paths that may be traversing only a few logic blocks, since the long lines can otherwise be used for longer paths. Further, since software that implements a logic design in an FPGA typically places interconnected logic in close proximity, structures that take advantage of this placement strategy will work well with the software, resulting in shorter compilation times for routing software and more efficient circuit implementations.

Interconnect lines called "quad lines" are included in the XC4000EX FPGAs from Xilinx, Inc., and described on pages 4-32 through 4-37 of the Xilinx 1996 Data Book entitled "The Programmable Logic Data Book", available from Xilinx, Inc., 2100 Logic Drive, San Jose, Calif. 95124, which are incorporated herein by reference. However, since each quad line contacts every tile that it traverses, these lines have a large number of PIPs, each of which adds RC delay.

Pierce et al provides fast paths between both adjacent logic blocks and logic blocks several tiles apart. The output lines of the Pierce et al architecture can each drive the inputs of a limited set of other logic blocks. However, the possible destinations are limited to selected logic blocks, and the interconnect lines can only access certain specific inputs of the destination logic blocks.

In each of the prior art structures recited above, each interconnect line has programmable connections to the inputs of other logic blocks. However, in the structures of Freeman, Carter, and Pierce et al, a given logic block input can be driven from either horizontal interconnect lines, or vertical interconnect lines, but not both. An alternative approach is to separate the interconnect lines from the logic block inputs by way of a routing matrix, which gives each interconnect line more flexible access to the logic block inputs. Such an architecture is described in U.S. Pat. No. 5,682,107, entitled "FPGA Architecture With Repeatable Tiles Including Routing Matrices and Logic Matrices" by Tavana et al, which is incorporated herein by reference. In the structure of Tavana et al, most interconnect lines entering the tile connect to a routing matrix within the tile, rather than directly to logic block inputs or outputs. Connections between pairs of interconnect lines and between interconnect lines and logic block inputs are made through lines called "tile interconnect lines" that do not leave the tile. The advantage of having an extra interconnect line in a path from the edge of a tile to the logic block in the tile is that the routing matrix is flexible but consumes a relatively small amount of silicon area. A combination of PIPs can allow access from any line entering the tile to any desired input of a destination logic block. Yet the total number of PIPs is smaller than in many other interconnect structures. The disadvantage is that getting on and off the tile interconnect lines inserts a certain amount of delay into the path for each tile traversed. This delay inhibits the fast propagation of signals through the FPGA. Tavana et al have therefore provided long lines connectable to every tile they pass and double-length lines that bypass the tile interconnect lines in one tile. These lines can be used for signals that are traversing one or more tiles without accessing the logic blocks in the traversed tiles.

Kean separates the interconnect lines from the logic block inputs using input multiplexer switches, which provide routing flexibility to the inputs.

Since the slowest signal path between logic blocks typically determines the performance of a circuit, it is advantageous to make the slowest path as fast as possible. One way to accomplish this is to design the interconnect structure such that there is a relatively uniform delay on all signal paths throughout an FPGA. In the above routing structures, a typical distribution of delays on signal paths shows a few signal paths with significantly greater delay than the average. These signal paths are typically those with large "RC trees", i.e., signal paths which traverse a resistor (such as an unbuffered PIP), then have a large capacitance on the destination side of the resistor. An interconnect structure with relatively uniform delay could be better realized if large capacitances on a signal path (e.g., longer interconnect lines) were predictably placed on the source side of the resistor, or as close as possible to the source end of the signal path.

High fanout signals have large capacitance and are often slower than low fanout signals. Prior art routing structures had high-fanout signal routing with relatively large RC delay. An interconnect structure should ideally provide high-fanout signal routing with a delay comparable to that of other signals.

It is therefore desirable to find an interconnect structure that allows: 1) uniformly fast propagation of signals, including high-fanout signals, throughout the FPGA; 2) implementation of localized circuits in non-adjacent as well as adjacent blocks using fast paths; 3) ease of use by software; 4) efficient implementation of commonly used logic functions; and 5) a high degree of routing flexibility per silicon area consumed.

SUMMARY OF THE INVENTION

According to the invention, an FPGA interconnect structure includes a combination of wiring segment lengths and connections to logic blocks such that a given logic block can be connected through fast paths both to adjacent logic blocks and to logic blocks several tiles away. In the preferred mode, the FPGA includes a two-dimensional array of identical tiles. In each tile is a logic block. Also in each tile are programmable interconnection points (PIPs) and segments of interconnect lines that adjoin segments of interconnect lines in adjacent tiles. The adjoined segments form interconnect lines extending through several tiles to PIPs in other tiles some distance away. A combination of lines connecting to adjacent tiles (called single-length lines) and lines at least three tiles long connecting a first tile to at least second and third tiles at least two and three tiles away (called intermediate-length lines) creates an interconnect hierarchy which allows any logic block to be connected to any other logic block, and yet also allows for fast paths both to adjacent tiles and to tiles some distance away. Longer interconnect lines (called long lines) may be included as a third level of hierarchy to permit efficient interconnection of widely separated tiles. Long lines can span the entire width of the tile array, or can be programmably segmented into two or more shorter long lines. In one embodiment, long lines are distinguished from intermediate-length lines in that a pattern of PIPs spanning two or more tiles is repeated along the length of the long line. When the size of the tile array is increased, more instances of the pattern occur. By contrast, intermediate-length lines according to the invention are of a predetermined length that does not alter when the size of the array is increased. When the size of the tile array is increased, additional intermediate-length lines are added.

A unique aspect of the invention is having an interconnect line (specifically an intermediate-length line or a long line) that programmably connects to logic blocks in at least three separate tiles, while extending through at least one tile in which no PIPs connect to the interconnect line. Such an interconnect line is said to be "unconnectable" to the tile in which no PIPs connect to the interconnect line and also "unconnectable" to the logic block in the tile, although connections can be made from the interconnect line to the logic block through PIPs in other tiles. A programmable connection from an interconnect line to a logic block in a given tile may be made: a) directly to a logic block input; b) through one or more PIPs connected to the interconnect line in the same tile; or c) through one or more PIPs connected to the interconnect line in the same tile and through one or more single-length lines. If any such programmable connection from an interconnect line to a logic block in a given tile can be made, the interconnect line is said to be "connectable" to the logic block and to the tile.

In a preferred embodiment, from an originating tile an intermediate-length line connects to the tile three tiles away (i.e., separated by two tiles from the originating tile), then continues and connects to the tile six tiles away (i.e., separated by five tiles from the originating tile). This intermediate-length line (called a "hex line") does not connect to the intervening tiles one, two, four, and five tiles away. Instead, these tiles are reached indirectly by using single-length lines from the originating tile, the third tile, or the sixth tile. Connecting to only three of the seven tiles traversed by the hex line reduces the number of PIPs, and therefore reduces the silicon area required to form the interconnect line (thereby lowering the cost of the FPGA) and also reduces the capacitance added by PIPs (thereby increasing FPGA performance). Yet the combination of this intermediate-length routing, direct connections to neighboring tiles, and long lines to distant tiles allows highly flexible routing of signals.

Many modifications of the interconnect structure of the invention are possible. One such modification is the use of asymmetrical PIP patterns on interconnect lines (intermediate-length lines or long lines) such that the interconnect line connects three logic blocks, with two of the three logic blocks being in adjacent tiles, while the third logic block is in a tile separated from the other two tiles.

As FPGAs grow larger, the amount of routing required per tile grows larger. Therefore, the silicon area required to implement the necessary PIPs tends to grow larger, and the silicon area per tile increases as the number of tiles in an FPGA increases. It is desirable to reduce the number of PIPs required per tile.

In one embodiment, only the single-length lines have connections to the logic block inputs. The intermediate-length lines have connections to each other and to single-length lines, but not to the logic block inputs. The long lines have connections to the intermediate-length lines, but not to the single-length lines or to the logic block inputs. Therefore, the number of PIPs in a tile is reduced. As with the intermediate-length lines, reducing the number of PIPs on a long line reduces both silicon area and capacitance on the long line, thereby reducing RC delay. In some embodiments, special tiles include additional connections between the various interconnect lines to facilitate distribution of high-fanout signals. In some embodiments, global lines having direct access to the logic block inputs are available for global signals such as clocks or other high fanout control signals. In some embodiments, the long lines have connections to each other in the repeatable tile instead of in special tiles.

In some embodiments, the single-length lines are driven by unbuffered PIPs and the intermediate-length and long lines are driven by buffered PIPs. Signals are typically routed on longer buffered interconnect lines first, then fanned out on shorter unbuffered lines. In this manner, large unbuffered RC trees are avoided, making delays on signal paths throughout the FPGA more uniform and improving performance. More uniform delays also make it easier to predict the performance of a circuit earlier in the design cycle.

In accordance with another embodiment of the present invention, an input/output interconnect (IOI) circuit is provided for coupling input/output (IO) blocks to an array of tiles in an FPGA. Each of the tiles includes a configurable logic element (CLE) and a programmable interconnect structure that includes a plurality of intermediate-length buses. The intermediate-length buses are staggered, such that only a subset of the intermediate-length buses routed past a logic block is connected to the logic block. The IOI circuit includes routing circuits at the perimeter of the array for terminating the intermediate-length buses. The routing circuits connect various ends of the intermediate-length buses in a U-turn configuration, thereby making use of all of the intermediate-length buses, and maintaining a regular pattern of intermediate-length buses in the tiles. In a particular embodiment, the intermediate-length buses connected in the U-turn configuration are unidirectional buses.

In another embodiment, a programmable logic device includes an array of configurable logic elements (CLEs) arranged in rows and columns, a set of long lines extending along a column of CLEs in a regular pattern, and a set of intermediate-length buses extending along the column of CLEs in a regular pattern. A first set of programmable interconnection points (PIPs) is provided for coupling the intermediate length buses to the associated CLEs in a regular pattern. A second set of PIPs is provided for coupling the long lines to the intermediate length buses in a regular pattern. A third set of PIPs is provided at a first end of the column to couple the long lines to the intermediate length buses. The third set of PIPs is configured to terminate the long lines to the intermediate length buses such that the regular pattern of connections between the long lines and the intermediate length buses is maintained by the third set of PIPs. Providing a regular pattern of long line to intermediate length bus connections at the edges of the array enables arrays of any size to be implemented without redesigning the IOI circuit.

In another embodiment, an IOI circuit includes a set of horizontal long lines that extend horizontally along the entire length of the array of tiles, a set of lines that connect to vertical long lines (which extend vertically along the entire height of the array of tiles), and plural sets of horizontal intermediate-length lines. One or more PIPs are provided to enable the horizontal long lines to be connected to the horizontal intermediate-length lines. In addition, one or more PIPs are provided to enable the horizontal intermediate-length lines to be connected to the vertical long lines. As a result, a low-skew high-fanout net can be formed using these interconnect lines. This net is provided to enable global signals to be routed throughout the FPGA, with signals being transmitted from the horizontal long lines to the horizontal intermediate-length lines (on the dedicated high fanout lines), and then to the vertical long lines. The global signals can then be routed from the vertical long lines to the CLEs along other various interconnect lines (e.g., vertical intermediate length lines or single length lines).

The present invention will be more fully understood in view of the following description and drawings.

BRIEF DESCRIPTION OF THE DRAWINGS

FIG. 1 is a simplified representation of the embodiment of FIG. 2.

FIG. 15 is a circuit diagram of interconnect circuitry between the top IOI circuit of FIG. 14 and the tile of FIG. 3 in accordance with one embodiment of the present invention.

DETAILED DESCRIPTION OF THE DRAWINGS

The following drawing conventions are used throughout the figures. A small solid black dot at the intersection of two lines indicates a permanent electrical connection between the crossing lines. An open circle enclosing an intersection between two lines, or separating a single line into two line segments, indicates a programmable bi-directional connection between the lines or line segments (for example, a pass transistor which is turned on to make the connection). An open triangle at an intersection of two lines indicates a programmable connection with signal flow going onto the line pointed to by the apex of the triangle. (The signal is of course then present on the full length of the line. Thus, a, triangle pointing in the opposite direction would have the same signal flow because the triangle points to the same line.) A triangle showing a connection between two buses indicates that at least one connection exists between the lines making up the buses. In accordance with one embodiment of the present invention, programmable connections are provided by using programmable interconnection points (PIPs), wherein each PIP includes at least one transistor.

A line which ends within a tile or block structure (i.e., does not extend to the border of a tile or block) is physically terminated within the tile or block. A line which extends to the border of the tile connects to a line on the next tile, which it contacts when two tiles are abutted together. Note that some lines which extend to an edge of a tile and thus into an adjacent tile change names at the tile boundary.

Simplified Representation of the Inventive Concept

Figure 1:
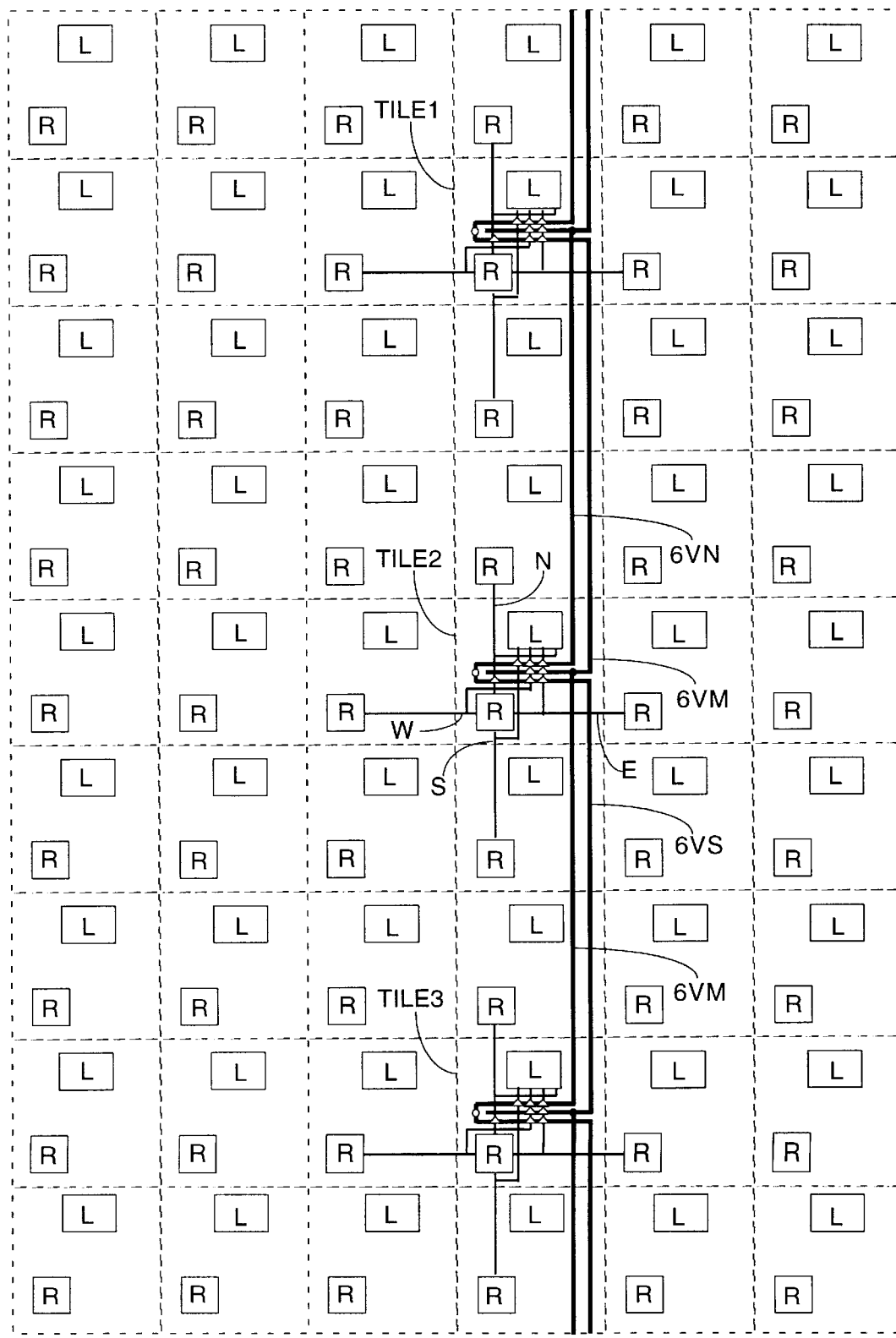
FIG. 1 shows some of the single-length and intermediate-length interconnect lines according to one embodiment of the invention.

FIG. 1 shows in simplified form some of the single-length and intermediate-length interconnect lines according to one embodiment of the invention. FIG. 1 illustrates part of an array of tiles in an FPGA. In each tile is logic block L and a routing or switching structure R. Also in each tile are line segments which connect to line segments in adjacent tiles to form interconnect lines. Most of the interconnect lines in the FPGA are not shown in FIG. 1 so as not to obscure the connectivity of the invention. Three of the tiles, labeled TILE1, TILE2, and TILE3 are shown in more detail, and short- and intermediate-length interconnect lines extending from TILE1, TILE2, and TILE3 are shown. (However, intermediate-length lines extending horizontally are not shown.) Single-length lines N, S, E, and W extend north, south, east, and west, respectively, from TILE2 to the four neighboring tiles. Equivalent lines not labeled extend from TILE1 and TILE3 as well. Identical structures are also present in all other tiles but are not shown in FIG. 1. These single-length lines N, S, E, and W extend between switching structures R in neighboring tiles; and have programmable connections to logic block L.

Intermediate-length lines also extend north, south, east and west from each tile to connect to other tiles three and six tiles away. Therefore in this embodiment the intermediate-length lines are "hex lines" as previously defined. Only the vertically extending (north and south) hex lines are shown, to avoid obscuring the connections. (Later figures show the complete connection pattern.)

From TILE2, hex line 6VN extends to the north a length of six tiles, connecting to TILE1 three tiles to the north and to another tile (not shown) six tiles to the north. Also from TILE2, hex line 6VS extends to the south six tiles, connecting to TILE3 and to another tile (not shown) six tiles to the south. Hex line 6VM connects tile TILE2 to tiles TILE1 and TILE3. Thus, three hex lines extend vertically and connect to TILE2. Also in TILE2, line 6VS is programmably connectable to line 6VN, as indicated by the PIP joining the ends of these two lines. In this manner an easy connection is available to a tile twelve tiles away from the starting tile.

Only one additional connection is needed to extend the connection to another interconnect line six tiles long.

Note that within TILE2, only the single-length lines N, S, E, and W have access to logic block L. Thus a signal on a hex line must transfer to a single-length line to access logic block L in the destination tile. A signal entering TILE2 on line 6VS can connect to lines W, N, or E and thereby to logic block L in TILE2. Further, the signal now on single-length lines W, N or E can also access the logic block L in the tiles to the west, north or east of TILE2. In this embodiment, no connection from hex line 6VS to single-length line S is provided, as eliminating this connection saves silicon area and the tile to the south of TILE2 can be accessed through another path. In the embodiment of FIG. 1, a signal in TILE3 can reach the logic block of the tile to the south of TILE2 either by: 1) traversing two single-length lines to the north; or 2) taking hex line 6VM to TILE2, connecting to single-length line W or E, then entering switching structure R in TILE2 and "bouncing" (moving onto and off of an interconnect line in the same tile) from single-length line W or E to single-length line S inside the switching structure. The second alternative has one more PIP in the signal path than the first alternative, the PIP in switching structure R. In another embodiment, a connection to the south can of course be provided.

Repeatable Tile Representation

Figure 2:
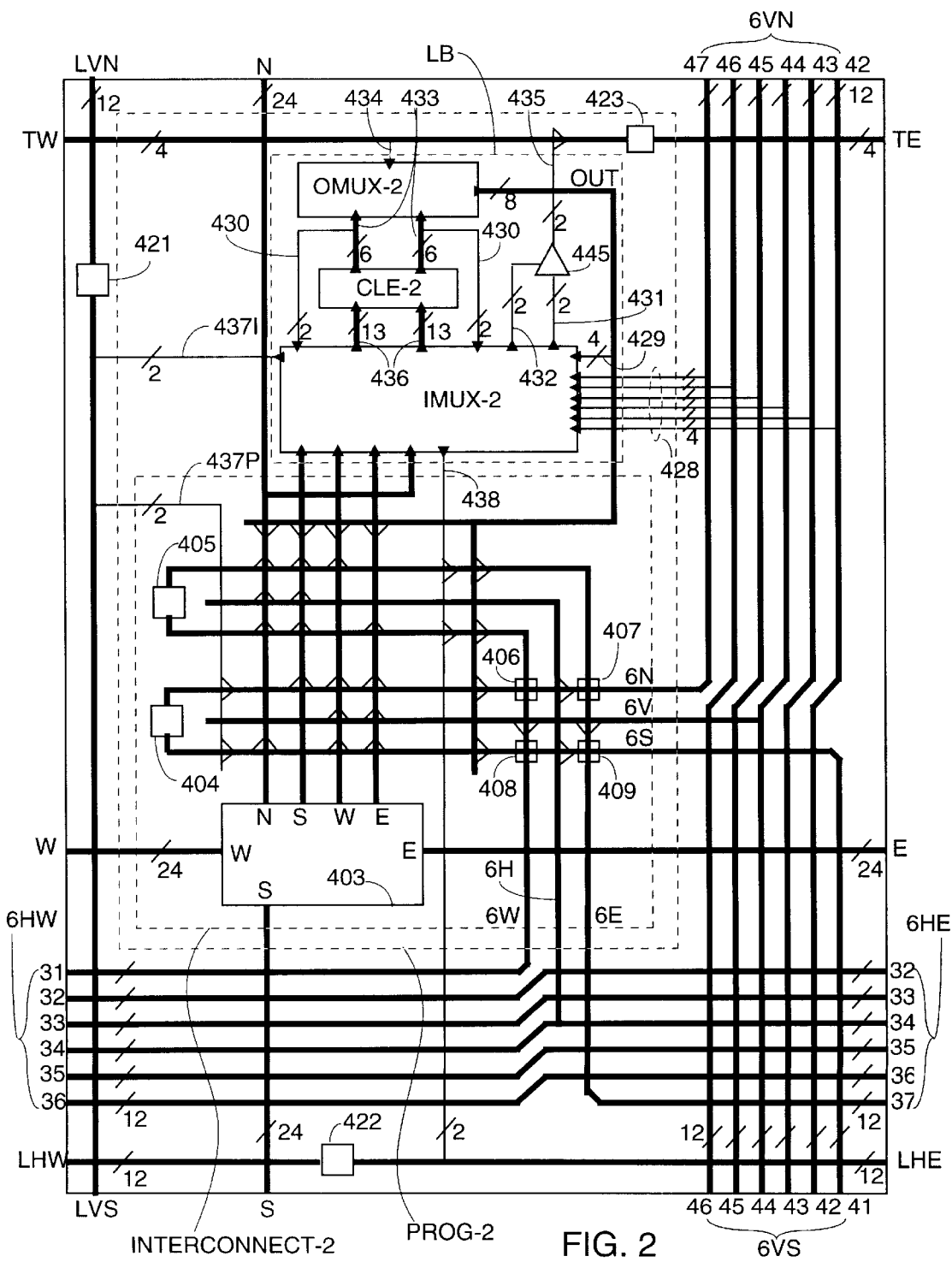
FIG. 2 shows a bus representation of a single tile in which intermediate-length lines are connected to every third and sixth tile (i.e., hex buses are used).

FIG. 2 more completely illustrates a single tile. FIG. 2 shows bus segments of various widths, as indicated by diagonal slash lines having a number indicating the bus width. The number of lines in each bus segment can of course vary in different embodiments. In the embodiment of FIG. 2, the tiles are identical. Since the illustration is of a single tile, complete interconnect lines must be understood by realizing that bus segments extending to the top of FIG. 2 will contact bus segments at the bottom of another copy of FIG. 2 placed adjacent to the north. Similarly, bus segments extending to the right of FIG. 2 will contact bus segments of another copy of FIG. 2 placed adjacent to the right, and so forth. An array such as present in an FPGA is represented by placing many copies of FIG. 2 together.

Hex Buses

In FIG. 2, 12-segment bus 6N extends horizontally through programmable region PROG-2, then turns north to become bus segment 47. Bus segment 47 extends to the top edge of the tile. Another copy of FIG. 2 placed adjacent and to the north of FIG. 2 will have a bus segment 46 extending to the bottom of the copy that contacts bus segment 47. Bus segment 46 extends vertically through the tile, but is offset right by one bus before it reaches the top of the tile, such that bus segment 46 in a given tile contacts bus segment 45 in the tile adjacent to the north. Similarly, at the tile boundary, bus segment 45 contacts bus segment 44, bus segment 44 contacts bus segment 43, bus segment 43 contacts bus segment 42, and bus segment 42 contacts bus segment 41. This offset arrangement results in a hex length bus extending through six adjacent tiles. Bus segment 41 extends into the tile from the bottom, then turns west and extends horizontally through programmable region PROG-2 as bus segment 6S. Bus segment 6V also extends horizontally through programmable region PROG-2, and connects to bus segment 44. Each tile therefore includes three bus segments 6N, 6V, and 6S extending into programmable region PROG-2. These bus segments enable the connections from a given tile to tiles three and six tiles away, which makes these intermediate-length lines hex lines as defined above. Bus segments 41, 42, 43, 44, 45, 46 and 47 together form a 72-line vertical "routing track" designated 6VN at the north end and 6VS at the south end of FIG. 2. Bus segments 42, 43, 44, 45, and 46 are called "interior segments", and bus segments 41 and 47 are called "end segments".

Horizontal 12-segment hex buses are similarly provided, each tile having portions 6W, 6H, and 6E extending into programmable region PROG-2. Bus segment 6E extends from programmable region PROG-2, then turns east and extends as bus segment 37 to the east edge of the tile. Bus segment 37 of a given tile contacts bus segment 36 in the adjacent identical tile to the east. Similarly to bus segments 41–47, bus segments 31–37 provide a hex length bus extending through six adjacent tiles. Bus segment 31 extends into programmable region PROG-2 as bus segment 6W. Bus segment 34 extends into programmable region PROG-2 as bus segment 6H. Bus segments 31, 32, 33, 34, 35, 36 and 37 together form a 72-line horizontal routing track designated 6HW at the west end and 6HE at the east end of FIG. 2.

Note that 72-line hex buses 6VN, 6VS, 6HW, 6HE are not typical buses in that the hex lines making up the buses do not all start in the same tile and end in the same tile, i.e., there is no fixed boundary for the bus. Twelve hex lines end, and another twelve hex lines begin, in each tile. This feature, among others, distinguishes the inventive structure over that of Kean and other hierarchical interconnect structures. In the hierarchical interconnect structures, an FPGA is divided hierarchically with periodic routing structures at the hierarchical boundaries. The present invention uses identical tiles, each of which tiles includes end segments of some of the lines.

Other Buses

Figure 2A:
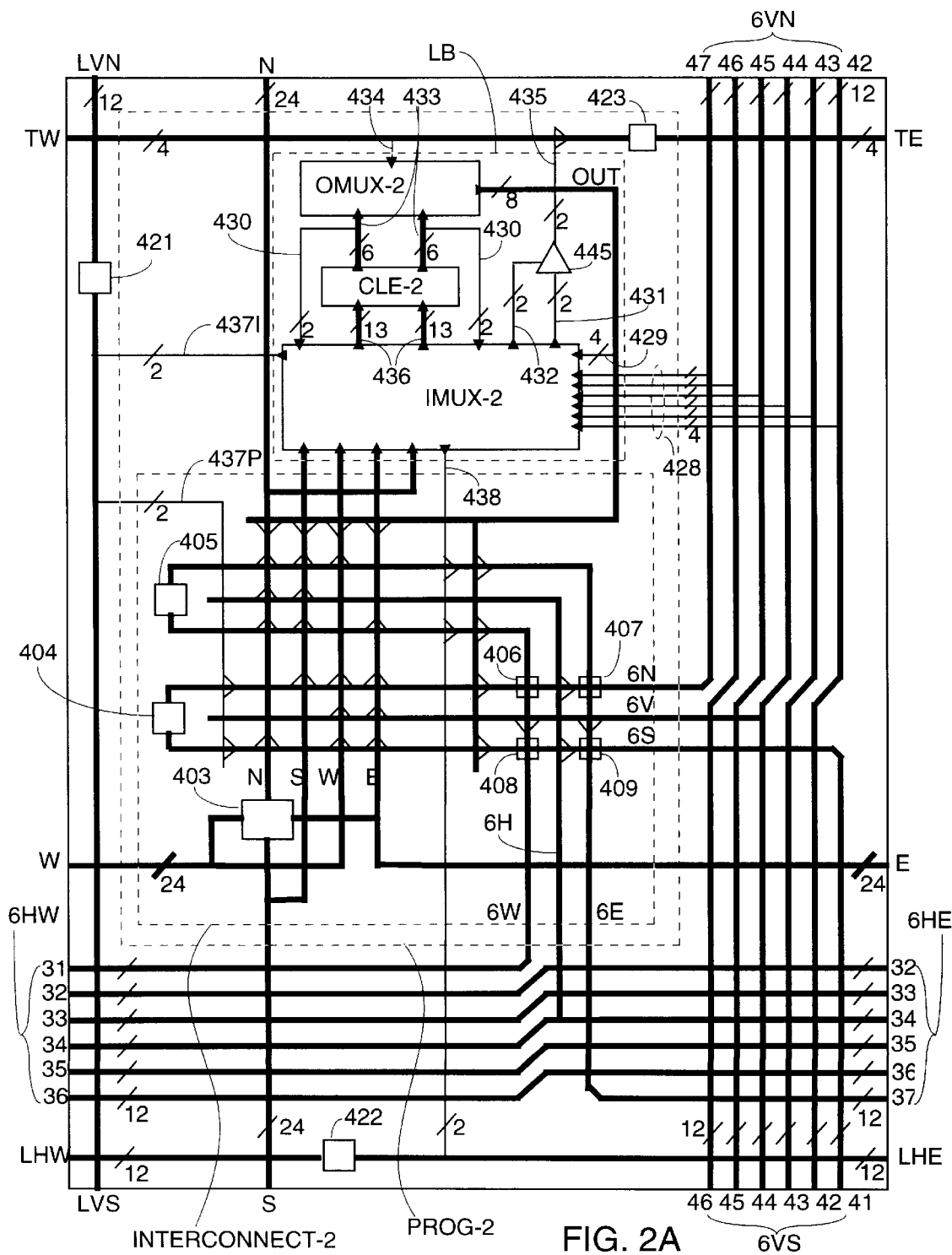
FIG. 2A is a slightly modified version of FIG. 2 showing a different representation of the single-length buses and switching structure 403.

North, south, east, and west single-length buses (N, S, E, and W respectively), each 24 lines wide, are also provided. These single-length buses connect to each other within switching structure 403 located in programmable region PROG-2. In FIG. 2, single-length buses S, W and E are shown entering switching structure 403 in two positions, in order to correspond to FIG. 4. However, the bus segments labeled S, W, and E pass continuously through switching structure 403. The way these bus segments pass through switching structure 403 is clarified in FIG. 2A, which shows a different representation of switching structure 403, but is otherwise the same as FIG. 2.

In this embodiment, each single-length line can be connected to the input multiplexer IMUX-2. Each single-length line can also be connected to some of the hex lines.

FIG. 2 includes another feature: horizontal and vertical long line buses. Each of the two long line buses is 12 lines wide. Two-line buses 437P, 438 (corresponding to lines LV0 and LV6, LH0 and LH6, respectively, in FIGS. 4 and 7) taken from each long line bus extend into programmable region PROG-2 where they can be programmably connected to drive hex lines. The two accessed long lines in each long line bus are separated from each other by six lines, and each long line is accessed every sixth tile. Two-line buses 437I, 438 taken from each long line bus extend from input multiplexer IMUX-2, which can provide signals to the long lines. (Two-line bus 437I includes the same two signals as two-line bus 437P.) The horizontal long line bus is designated LHW at the west end and LHE at the east end of FIG. 2. LHW and LHE extend through an offset region 422 (shown in FIG. 3) which offsets the bus by one line per tile. In this manner, each identical tile accesses two different lines of horizontal long line bus LHW/LHE, and each long line is accessed every sixth tile. Similarly, the vertical long line bus is designated LVN at the north end and LVS at the south end of FIG. 2. LVN and LVS extend through an offset region 421 similar to offset region 422. The long line buses extend the entire length or width of the tile array.

Figure 3:
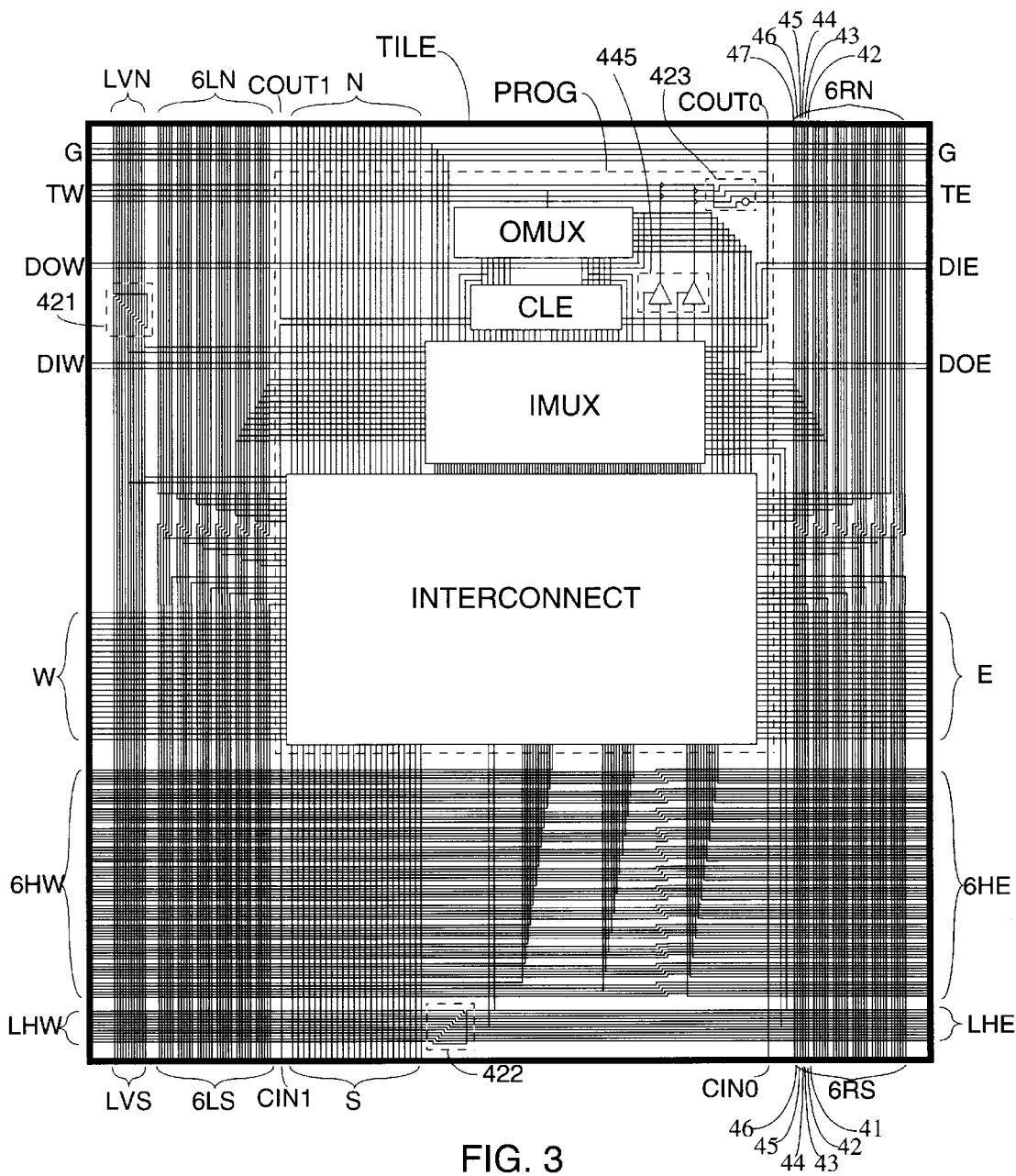
FIG. 3 shows a detailed representation of a single tile in the preferred embodiment. All features shown in FIG. 2 are represented, and some additional features are included.

Another bus extends horizontally through the programmable region PROG-2, a tristate buffer bus, 4 lines wide, designated TW at the west end and TE at the east end of FIG. 2. TW and TE are connected by programmable offset region 423. Programmable offset region 423 is similar to offset regions 421 and 422 in that it offsets the bus by one line; however, programmable offset region 423 is only four lines wide and also includes one programmable bi-directional PIP for extending the length of bus TW or TE. (The internal structure of programmable offset region 423 is shown in FIG. 3.) This PIP can be used either to "break" each line of the tristate bus every fourth tile, or to connect lines together every fourth tile to continue a tristate line up to the full width of the tile array. Two examples of tristate buses that can be used are described in U.S. Pat. No. 5,677,638, "High Speed Tristate Bus with Multiplexers for Selecting Bus Driver", by Steven P. Young et al, and U.S. Pat. No. 5,847,580, "High Speed Bi-directional Bus with Multiplexers", by Bapat et al, both of which are incorporated herein by reference.

Programmable Bus Connections

Programmable bus connections are located in region INTERCONNECT-2, which is part of programmable region PROG-2. Where hex buses cross single-length buses, open triangles indicate programmable connections in which one of the hex lines at the base of the triangle can drive one of the single-length lines at the tip of the triangle. Triangles pointing to hex lines represent buffered connections, and triangles pointing to single-length lines represent unbuffered connections such as simple pass transistors.

Note that not all intersections have triangles. For example, hex bus segment 6V can connect to east and west single-length buses E and W, but not to north and south buses N and S. Similarly, hex bus segment 6H can connect to north and south single-length buses N and S, but not to east and west buses E and W. Hex bus segment 6S coming from the south can connect to east and west single-length buses E and W and also to north bus N. This partial connectivity saves silicon area while still providing useful connections for good routability and performance. Similarly, hex bus segment 6N coming from the north can connect to east and west single-length buses E and W and also to south bus S; hex bus segment 6W coming from the west can connect to north and south single-length buses N and S and also to east bus E; and hex bus segment 6E coming from the east can connect to north and south single-length buses N and S and also to west bus W. In each of these cases, the connection may be limited by hardware or software to being unidirectional such that the hex buses can drive the single-length buses, but the single-length buses cannot drive the hex buses. (In the actual hardware of this embodiment, the connection is a bi-directional pass-gate; whereby the single-length buses can drive the hex buses. However, doing so reduces the speed of the resulting signal path dramatically, and therefore software for programming the FPGA does not select such a path.)

All of the single-length buses can be driven by output multiplexer OMUX-2 by way of output bus OUT. Hex bus segments 6E, 6W, 6N, and 6S can also be driven by output bus OUT.

Figure 4:
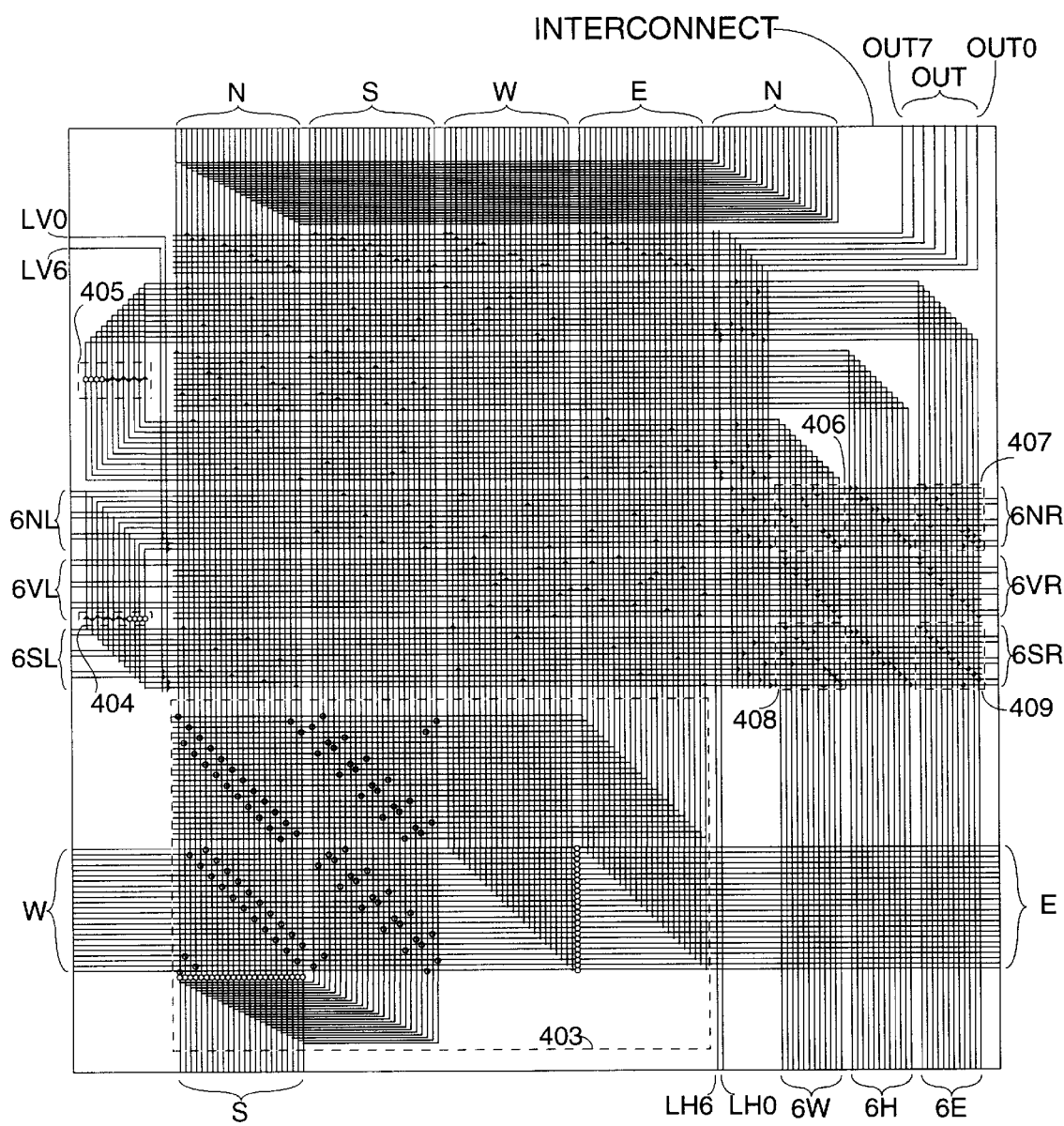
FIG. 4 shows the region of FIG. 3 labeled INTERCONNECT.

Vertical hex bus segments 6N and 6S can be connected together via programmable bus connection 404. (The internal structure of programmable bus connection 404 is shown in FIG. 4.) In this fashion, a line in a vertical hex bus can be continued 12, 18 or more tiles, rather than terminating after 6 tiles. Similarly, horizontal hex bus segments 6W and 6E can be connected together via programmable bus connection 405. Additionally, vertical hex bus segments 6N and 6S can be connected to horizontal hex bus segments 6W and 6E via programmable bus connections 406, 407, 408, and 409. The connectivity of these bus connections is shown in FIG. 4. Note also that hex bus segment 6V (which implements the connection to the third tile in the vertical direction) can drive horizontal hex bus segments 6W and 6E. Similarly, hex bus segment 6H (which implements the connection to the third tile in the horizontal direction) can drive vertical hex bus segments 6N and 6S. By this means, the direction of a signal path is easily changed between horizontal and vertical.

Horizontal hex bus segments 6E and 6W in a given tile can be driven by the two horizontal long lines accessed in the same tile. Vertical hex bus segments 6N and 6S in a given tile can be driven by the two vertical long lines accessed in the same tile. This capability allows a signal on a long line to fan out to an entire row or column of tiles with high speed, as later shown in FIGS. 10–12, by routing from the long line to each hex line (and hence to single lines) rather than propagating serially along the hex lines.

Switching structure 403 allows each single-length bus (N, S, E, W) to be connected to each of the other single-length buses. The connectivity in switching structure 403 is shown in FIG. 4, and is also described and shown in detail in FIG. 6A of U.S. Pat. No. 5,828,230 entitled "FPGA Two Turn Routing Structure with Lane Changing and Minimum Diffusion Area" by Steven P. Young, which is incorporated herein by reference.

Significance of Programmable Bus Connections

The bus connections in FIG. 2 implement an interconnect structure for FPGAs according to the invention. The buses of this embodiment interact in the following ways: 1) long lines can drive hex buses parallel thereto, but cannot drive either perpendicular hex buses or single-length buses except through the parallel hex buses; 2) hex buses can drive single-length buses both parallel and perpendicular thereto, but single-length buses cannot drive hex buses (although in one embodiment hex buses and single-length buses are connected through bi-directional PIPs, so a software limitation is imposed to make these connections unidirectional); 3) hex buses can further drive other hex buses both parallel and perpendicular thereto; and 4) most hex buses cannot connect to the inputs of input multiplexer IMUX-2, although a limited number of lines from the hex buses can make such connections, as is later described. Therefore, in the interconnect structure of FIG. 2, it is preferred to make connections between tiles by placing a signal first on the longest suitable line and from there moving the signal to a shorter line. For example: 1) a connection to a logic block three or six tiles away would be made through a hex line, switching to a single-length line to reach the input multiplexer; 2) a connection to a logic block seven tiles away would be made through first a hex line and then a single-length line (this connection requires no more PIPs than the first example); 3) a connection to a logic block on the other side of the FPGA would be made through first a long line, then a hex line, then transferred to one or more single-length lines before entering the destination input multiplexer. In this manner, large RC trees are avoided, by ensuring that unbuffered PIPs do not drive heavily loaded lines. Further, the various types of signal paths throughout the interconnect structure have similar delays, increasing the overall performance of the circuit.

Of course, many signal paths do not travel only within one column or one row of tiles. To turn a corner, a signal path can move from a given single-length line to a perpendicular single-length line through the switching structure 403, or from a given hex line to a perpendicular hex line.

Programmable Logic Portion of the Tile

The interconnect portion INTERCONNECT-2 of the repeatable tile of FIG. 2 exists only for the purpose of delivering signals between the logic blocks in different tiles. The logic block LB of this embodiment comprises a configurable logic element CLE-2, an output multiplexer OMUX-2, an input multiplexer IMUX-2, and two tristate buffers 445. (The number of tristate buffers can of course vary in other embodiments of the invention.) Configurable logic element CLE-2, input multiplexer IMUX-2, and output multiplexer OMUX-2 in FIG. 2 have small solid black triangles on each input and output. The direction of the apex of the triangle indicates the direction of the signal flow. Thus, a triangle with its apex inside the rectangular box indicates an input line or bus and a triangle with its apex outside the rectangular box indicates an output line or bus.

Input multiplexer IMUX-2 of this embodiment accepts inputs from: 1) each of single-length buses N, S, E, W; 2) four lines 428 of each 12-line vertical hex bus 42, 43, 44, 45, 46, 47; 3) four lines 429 from 8-line output bus OUT from output multiplexer OMUX-2; and 4) a total of four fast-feedback lines 430 from configurable logic element CLE-2. Input multiplexer IMUX-2 can programmably create the following output signals: 1) two 13-line buses 436 that provide input signals to configurable logic element CLE-2; 2) two signal lines 431 that drive the data inputs of tristate buffers 445; 3) two signal lines 432 that enable tristate buffers 445; 4) two lines of vertical long line bus LVS; and 5) two lines of horizontal long line bus LHE.

Configurable logic element CLE-2 accepts only inputs from input multiplexer IMUX-2, and drives 12 output lines shown in FIG. 2 as two 6-line buses 433. Four of these output lines form fast-feedback paths 430 to input multiplexer IMUX-2. Outputs 433 from configurable logic element CLE-2 drive output multiplexer OMUX-2. OMUX-2 gets one additional input 434 from tristate buffer bus TW, and drives 8-line output bus OUT. Each of the two tristate buffers 445 drives two of the tristate lines in tristate buffer bus TW via 2-line bus 435. The connection of tristate buffers 445 to tristate buffer bus TW is shown in more detail in FIG. 3.

Detailed Repeatable Tile Representation

FIGS. 3–12 show the preferred embodiment of a repeatable interconnect structure according to the invention, which embodiment is similar to the embodiment of FIG. 2. FIG. 3 shows a detailed representation of a single tile in the preferred embodiment. All features shown in FIG. 2 are represented, and some additional features are included. Labels in FIG. 3 correspond to the same labels in FIG. 2; thus corresponding structures are easily identified. There is one difference in representation: in FIG. 3, 72-line vertical routing track 6VN/6VS of FIG. 2 is represented as two 36-line vertical routing tracks, 6RN/6RS on the right and 6LN/6LS on the left. Half of the lines of each 12-line hex bus are drawn on each side of programmable region PROG, which corresponds to programmable region PROG-2 in FIG. 2. This representational difference has no effect on the functionality of the tile. In FIG. 3, the horizontal and vertical hex buses are shown with first lines of all buses are grouped together. Only the first lines are labeled. For example, labels 41 through 47 represent the first lines of hex bus segments 41 through 47 of FIG. 2. Hex bus segments 31 through 37 of FIG. 2 are similarly represented, but are not labeled in FIG. 3.

Interconnect region INTERCONNECT of FIG. 3 is functionally the same as interconnect region INTERCONNECT-2 of FIG. 2. Features in the embodiment of FIG. 3 that are not shown in FIG. 2 include: 1) horizontal four-line global bus G along the top of the tile provides four global inputs to input multiplexer IMUX, which global inputs can be used to distribute high-fanout or high-speed global clock signals; 2) two direct output connection lines DOW from output bus OUT (driven by output multiplexer OMUX) exit the tile of FIG. 3 on the west edge, where they are connected to input lines DIE of an adjacent tile to the west; 3) two direct input connection lines DIE from the adjacent tile to the east enter the tile of FIG. 3 on the east edge and go to input multiplexer IMUX; 4). two direct output connection lines DOE from output bus OUT exit the tile of FIG. 3 on the east edge, where they are connected to lines DIW of an adjacent tile to the east; 5) two direct input connection lines DIW from the adjacent tile to the west enter the tile of FIG. 3 on the west edge and go to input multiplexer IMUX; and 6) two carry chains are included in configurable logic element CLE, each carry chain having an input on the south edge of the tile and an output on the north edge of the tile, the inputs designated CIN0 and CIN1 and the outputs designated COUT0 and COUT1, respectively. Some embodiments of the interconnect structure according to the invention do not have these features.

Interconnect Region

FIG. 4 shows interconnect region INTERCONNECT of FIG. 3 in detail. All input and output lines are located in the same relative positions in FIGS. 3 and 4. Input and output lines to interconnect region INTERCONNECT in FIG. 3 can be identified by looking at the corresponding labels in FIG. 4. With the exception of the division of the vertical routing track, as described above, FIG. 4 also corresponds directly to the interconnect region INTERCONNECT-2 of FIG. 2. Numerical labels identify features of the implementation previously shown and described. The connectivity in switching structure 403 is also described and shown in detail in FIG. 6A of U.S. Pat. No. 5,828,230 entitled "FPGA Two Turn Routing Structure with Lane Changing and Minimum Diffusion Area" by Steven P. Young, which is incorporated herein by reference.

Programmable bus connections 404 and 405 in FIG. 4 demonstrate an additional feature of the invention. In programmable bus connections 404 and 405, vertical and horizontal hex buses (respectively) are programmably connected together to enable the continuation of a signal path in the same direction from one hex bus to the next. As shown in FIG. 4, some of these connections can be bi-directional (for example, implemented as pass transistors) while others are unidirectional (such as buffered connections). In one embodiment, the bi-directional hex buses (hex buses that can be programmably driven from either end) have more programmable connections to perpendicular buses than do the unidirectional hex buses (hex buses that can be programmably driven from only one end). Such bi-directional connections will be most flexible, while such unidirectional connections will be faster, since the PIP can be implemented as a single buffer without a programmable enable.

Vertical long lines LV0 and LV6 identify the first and seventh lines, respectively, of vertical long line bus LVS that are accessed in each repeatable tile, as previously described. Similarly, horizontal long lines LH0 and LH6 identify the first and seventh lines, respectively, of the horizontal long line bus LHE.

As previously described, hex bus segments 6N, 6V, and 6S of FIG. 2 are divided in FIG. 3 into hex bus segments 6NR, 6VR, and 6SR, which exit the INTERCONNECT region on the east edge to form 36-line vertical routing track 6RN/6RS of FIG. 3, and hex bus segments 6NL, 6VL, and 6SL, which exit the INTERCONNECT region on the west edge to form 36-line vertical routing track 6LN/6LS of FIG. 3.

Unidirectional and Bidirectional Hex Buses

Figure 4A:
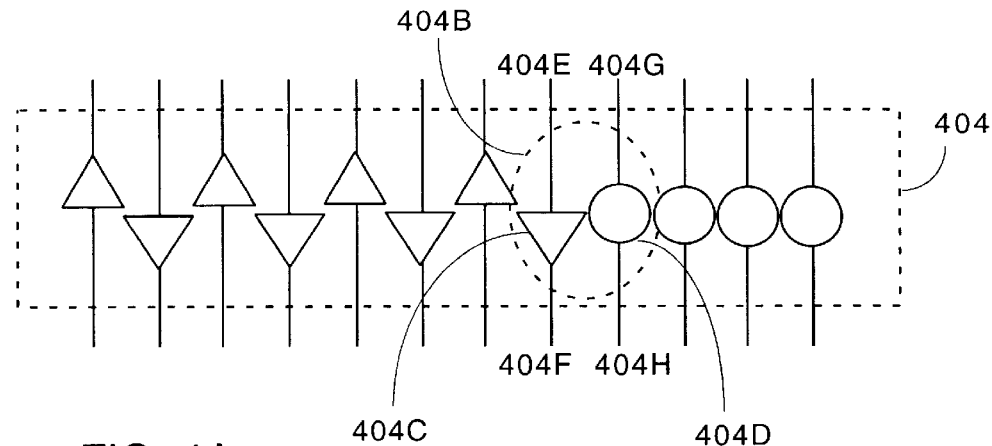
FIG. 4A is a schematic diagram of a programmable bus connection of FIG. 4.

FIG. 4A shows an enlargement of programmable bus connection 404 of FIG. 4. Unidirectional bus connection 404C for programmably connecting interconnect lines 404E and 404F and bidirectional bus connection 404D for programmably connecting interconnect lines 404G and 404H are shown in region 404B of FIG. 4A.

Figure 4B:
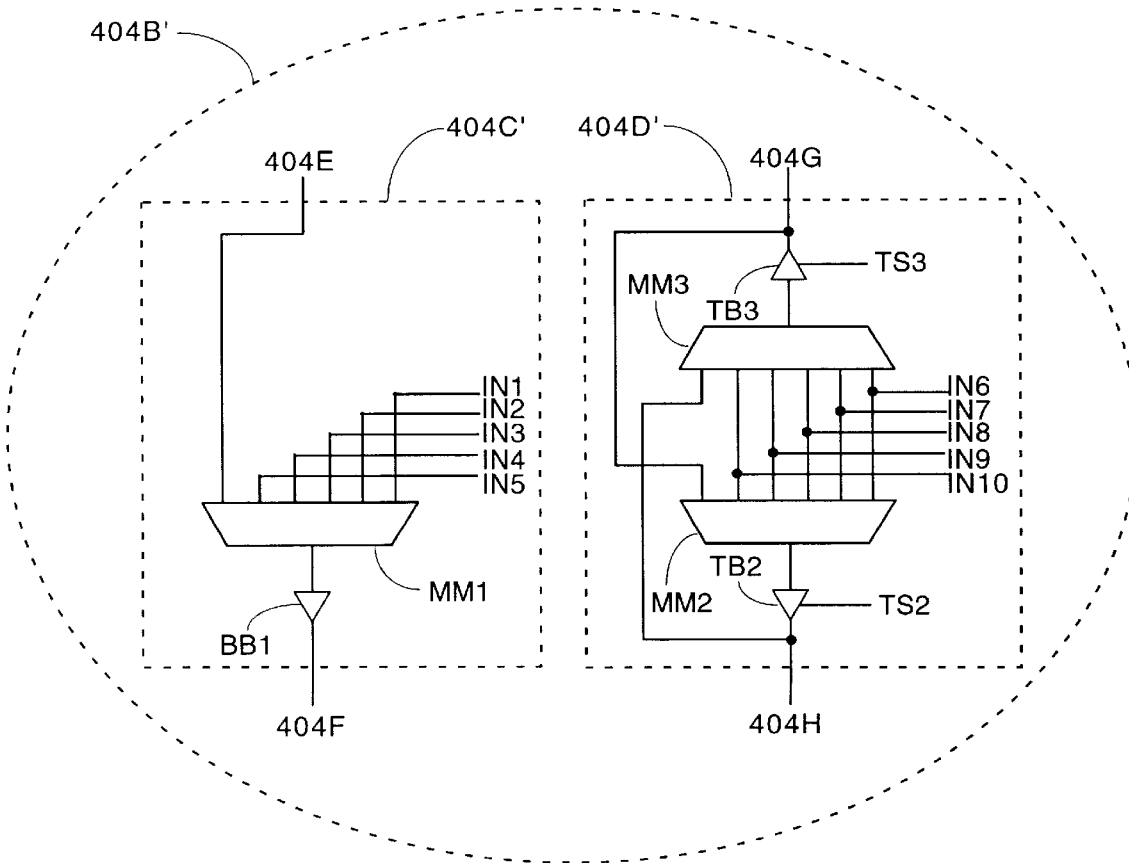
FIG. 4B is a schematic diagram of the programmable bus connection of FIG. 4A.

FIG. 4B shows a different representation of region 404B of FIG. 4A, labeled 404B' in FIG. 4B. Region 404B' includes not only region 404B of FIG. 4A, but also other PIPs shown in FIG. 4 and implemented as part of the same circuit as bus connections 404C and 404D. FIG. 4B includes a logical representation of unidirectional bus connection 404C, with additional PIPs as described above, labeled 404C' in FIG. 4B. FIG. 4B also includes a logical representation of bidirectional bus connection 404D, labeled 404D' in FIG. 4B. Bus connections 404C and 404D are used to interconnect intermediate-length lines in one embodiment of the invention.

Unidirectional bus connection 404C' includes 6-input multiplexer MM1, which can be configured to place the signal on interconnect line 404E onto interconnect line 404F through buffer BB1. Alternatively, multiplexer MM1 can place any of five other signals onto interconnect line 404F. In one embodiment, the five other available signals come from a mixture of intermediate-length lines, output multiplexer outputs, and long lines, as shown in FIG. 4. The number of each of these types of lines used is determined by an analysis of usage in typical FPGA user designs. In one embodiment, the five available signals are shared between pairs of unidirectional bus connections.

As shown in FIG. 4B, bidirectional bus connection 404D' includes more logic than does unidirectional bus connection 404C'. Since signal flow can be in either of two directions, two 6-input multiplexers MM2, MM3 are needed. Input multiplexer MM2 drives interconnect line 404H through tristate buffer TB2, controlled by configurable signal TS2. Similarly, input multiplexer MM3 drives interconnect line 404G through tristate buffer TB3, controlled by configurable signal TS3. Each of multiplexers MM2, MM3 can be configured to place the signal from opposite interconnect line 404G, 404H onto interconnect lines 404H, 404G. Alternatively, multiplexers MM2, MM3 can place any of five other signals onto interconnect lines 404H, 404G. In the embodiment of FIG. 4B, the five input signals are shared between multiplexers MM2, MM3 in order to facilitate the use of shared diffusion regions, but some or all of the inputs can be independent, and the number of available inputs can be increased or decreased. These and other modifications are within the scope of this aspect of the invention.

Figure 4C:
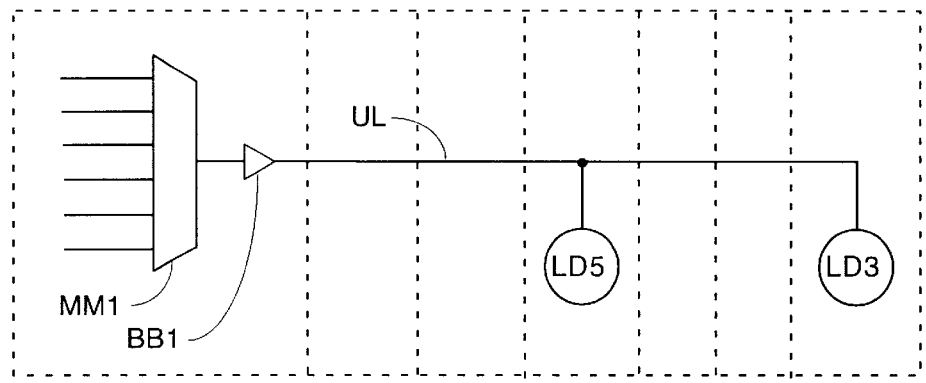
FIGS. 4C and 4D illustrate in simple form the loading for a unidirectional line and a bidirectional line BL, respectively, in one embodiment of the invention.
Figure 4D:
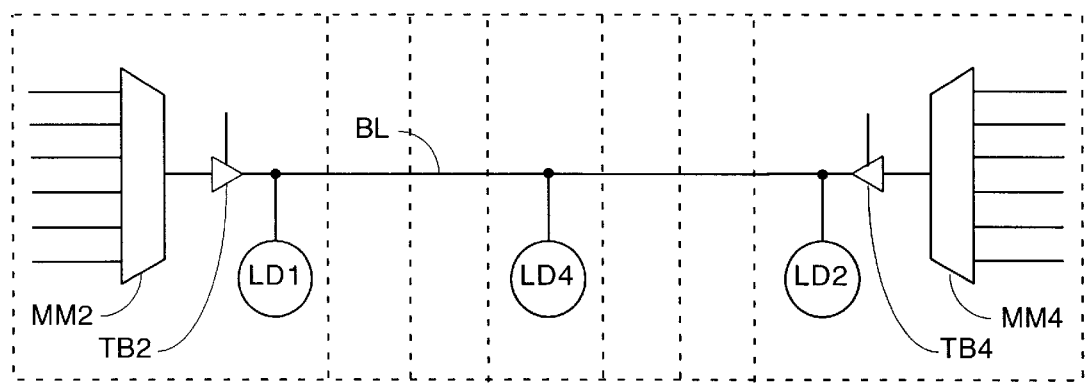

FIGS. 4C and 4D illustrate in simple form the loading for unidirectional line UL and bidirectional line BL, respectively, according to the invention. In FIGS. 4C and 4D, tile boundaries are indicated by dotted lines. As shown in FIG. 4D, bidirectional interconnect line BL is driven at one end by multiplexer MM2 through tristate buffer TB2 and at the other end by multiplexer MM4 through tristate buffer TB4. At most one of tristate buffers TB2 and TB4 is enabled at a given time. In the embodiment of FIG. 4C, bidirectional interconnect line BL drives loads LD1, LD2 at either end of interconnect line BL. As shown in FIG. 4C, unidirectional interconnect line UL is driven by multiplexer MM1 through nontristate buffer BB1, and drives load LD3 at only one end. (In the embodiment of FIGS. 4C and 4D, both bidirectional and unidirectional lines (BL, UL) also drive loads (LD4, LD5, respectively) at the midpoint of the interconnect line. In other embodiments, interconnect lines drive loads at other intermediate points.) Each of loads LD1, LD2, LD3, LD4, LD5 typically comprises many PIPs. In addition, when an unbuffered PIP is turned on, the capacitive load on the other side of the PIP becomes part of the load on interconnect lines BL, UL. Therefore, loading is typically larger on bidirectional interconnect lines, slowing these lines with respect to unidirectional lines.

More silicon area is required to implement a bidirectional than a unidirectional interconnect line, as shown by the addition of structures LD1, TB4 and MM4 for bidirectional line BL in FIG. 4D, as compared to unidirectional line UL in FIG. 4C. Further, a signal passing through a tristate buffer, as required for a bidirectional interconnect line, is typically slower than a signal through a non-tristate buffer. The additional logic required to implement a tristate buffer slows passage of the signal through the buffer. Therefore, a mixture of unidirectional and bidirectional lines provides a balance of flexibility and performance.

Output Multiplexer OMUX

Figure 5:
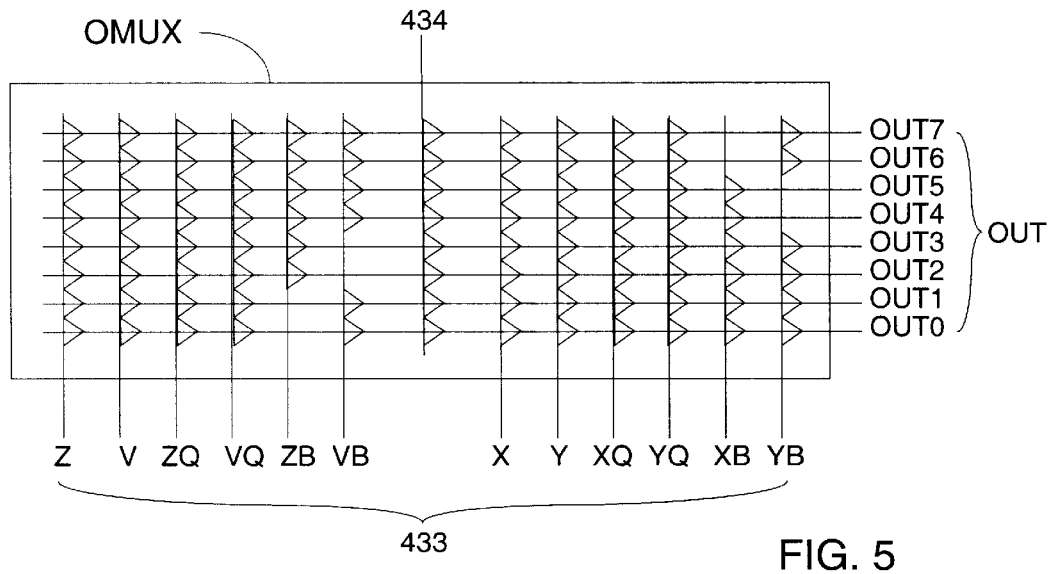
FIG. 5 shows the output multiplexer (OMUX) of FIG. 3.
Figure 6:
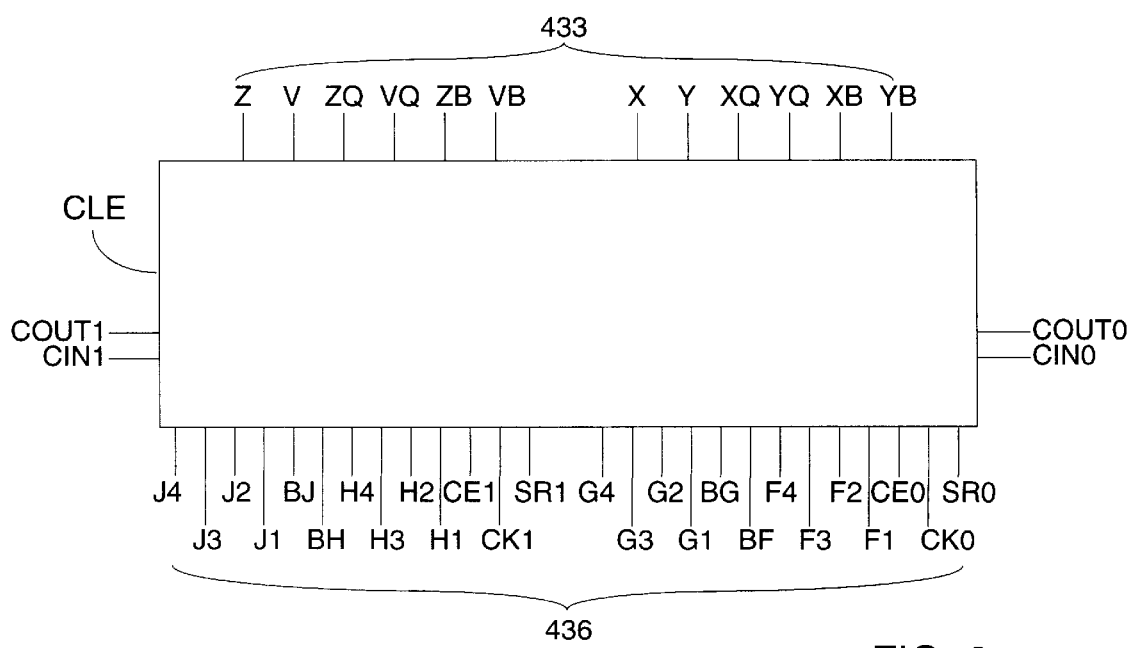
FIG. 6 shows the input and output signals for the configurable logic element (CLE) of FIG. 3.
Figure 7:
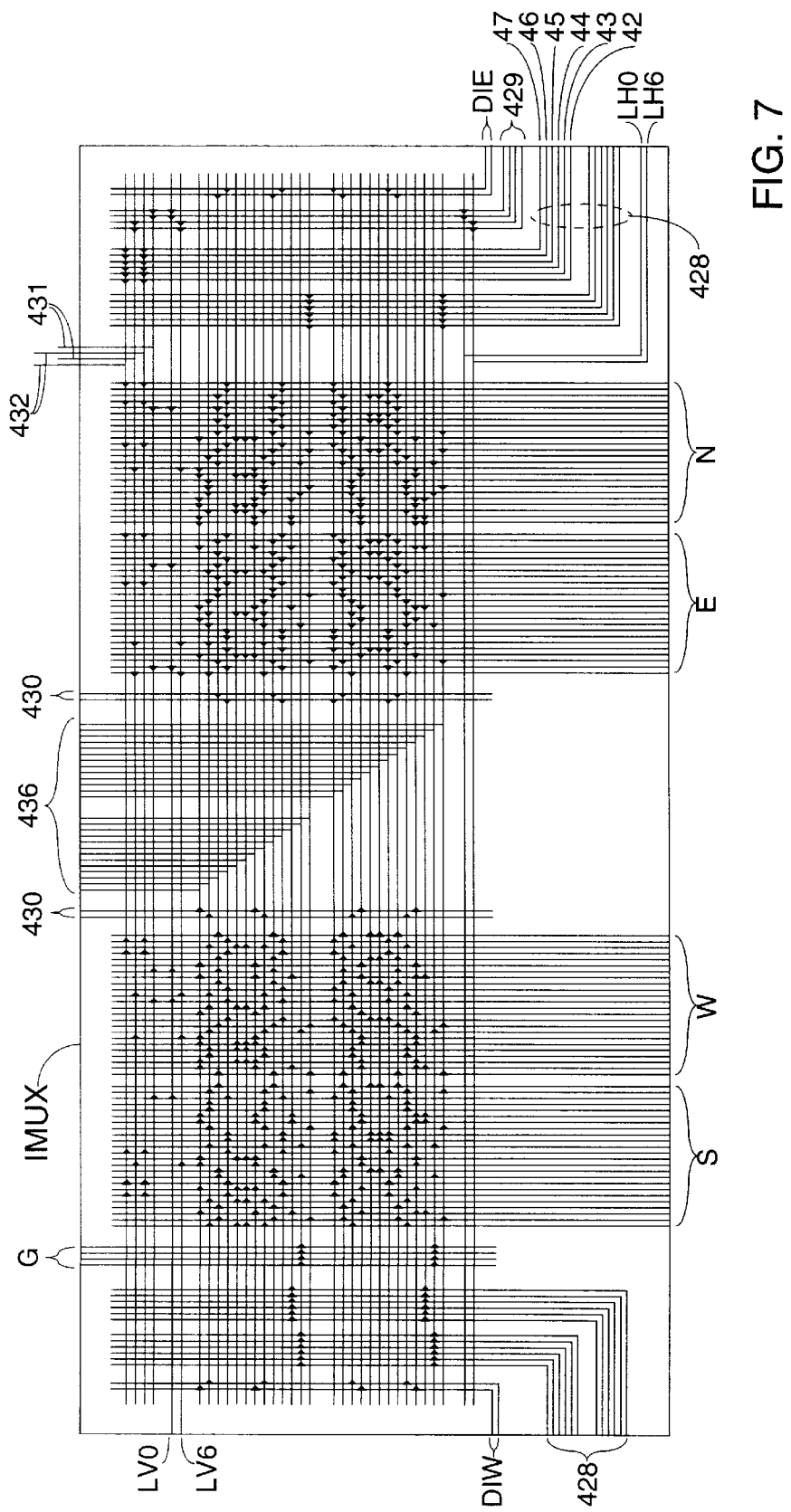
FIG. 7 shows the input multiplexer (IMUX) of FIG. 3.

FIGS. 5, 6 and 7 show the output multiplexer (OMUX), configurable logic element (CLE) and input multiplexer (IMUX), respectively, of the embodiment shown in FIG. 3. All input and output lines are physically located in the same relative positions in FIGS. 3, 5, 6 and 7, thus input and output lines may readily be traced between the figures. The PIP patterns shown in FIGS. 5 and 7 form only one of many possible patterns. The implementation of these three blocks, and the connections between the blocks, may differ widely in different embodiments of the invention, provided that the three blocks are compatible with each other. For example, the number of connections between the blocks may be increased or decreased. Further, two or more of these blocks may be combined, or one or both of the input or output multiplexers may be eliminated. Although these variations are not further described herein, such modifications are encompassed by the inventive concept. It will be apparent to one skilled in the art after reading this specification that the present invention may be practiced within these and other architectural variations.

FIG. 5 shows details of the interior of output multiplexer OMUX. As shown in FIG. 5, the input lines (the outputs of logic block CLE) are selectively programmed to drive a series of eight outputs (OUT0 to OUT7). Not all inputs can drive all outputs; a selection of how many PIPs to provide and where they should be located is typically made based on the trade-off constraints of performance, silicon area, and routing flexibility.

Configurable Logic Element CLE

FIG. 6 shows the input and output signals for the configurable logic element (CLE) of the embodiment shown in FIG. 3. Many configurable logic elements can be used with the interconnect structure of the invention. For example, pages 4-11 through 4-23 of the Xilinx 1996 Data Book entitled "The Programmable Logic Data Book", available from Xilinx, Inc., 2100 Logic Drive, San Jose, Calif. 95124, also incorporated herein by reference, describe a configurable logic element used in the XC4000 Series FPGA architecture which is compatible with the invention. Pages 4-294, 4-295, and 13—13 through 13-15 of the same document, also incorporated herein by reference, describe another compatible configurable logic element, used in the XC3000 Series FPGA architecture. Pages 4-188 through 4-190 of the same document, also incorporated herein by reference, describe yet another compatible configurable logic element, used in the XC5200 Family FPGA architecture.

Figure 6A:
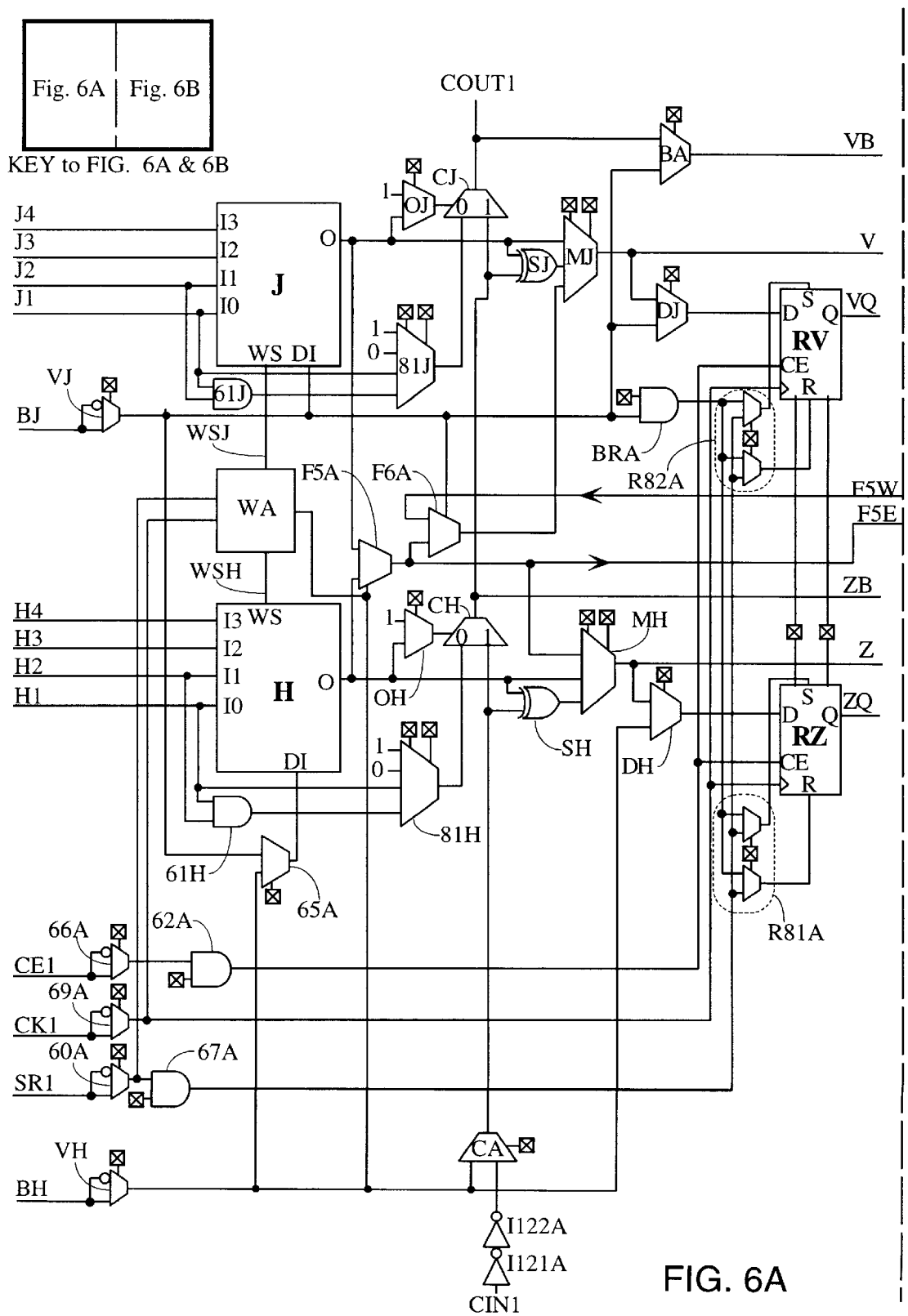
FIGS. 6A and 6B show the internal logic for the CLE of FIG. 3. To view the entire CLE, FIGS. 6A and 6B must be viewed together as shown in the key at the top of FIG. 6A.
Figure 6B:
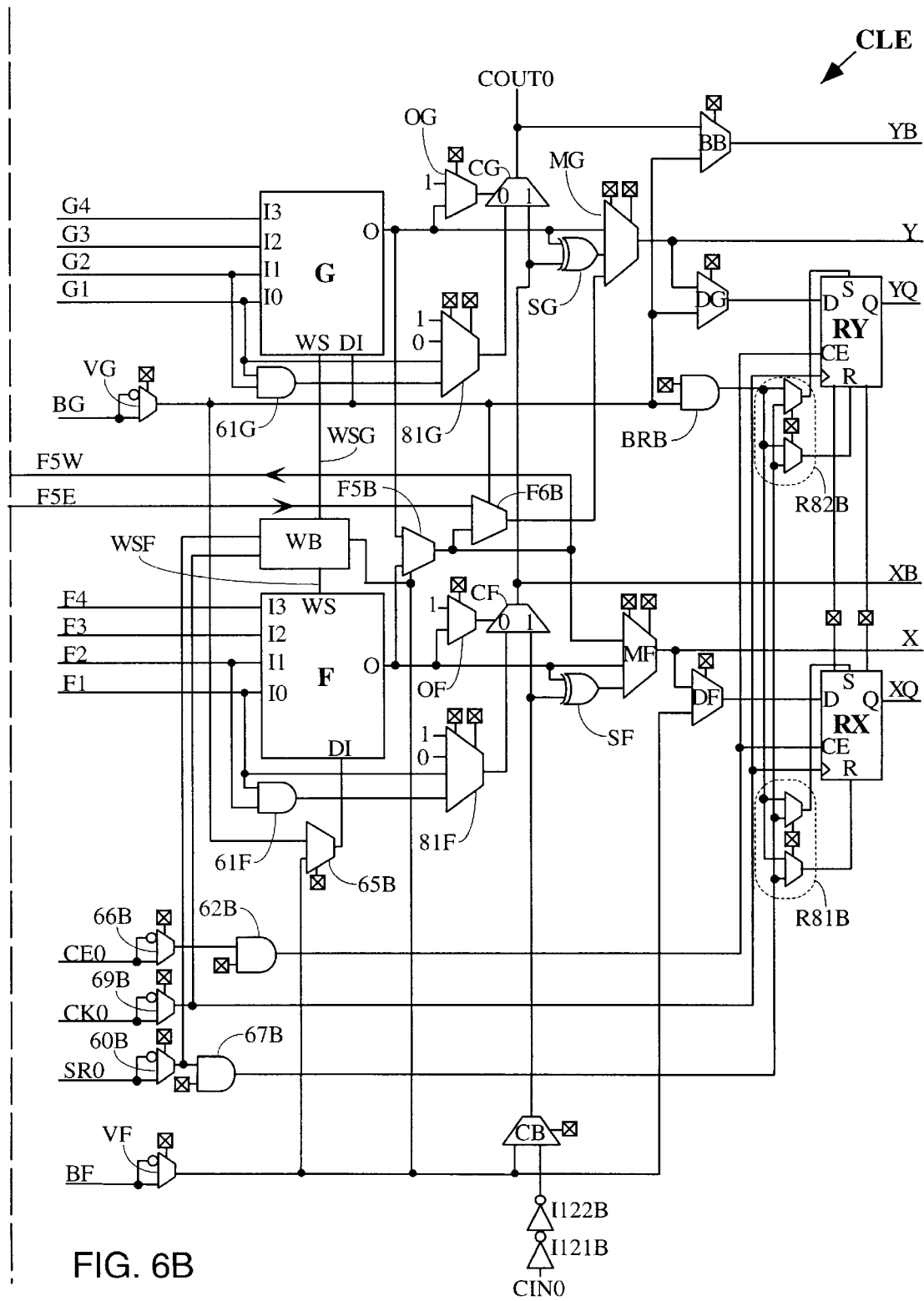

One CLE that can be used with the embodiment of FIG. 3 is shown in FIGS. 6A and 6B. In this embodiment, the CLE is implemented in two similar portions called "slices". To view the entire CLE, FIGS. 6A and 6B, each showing one slice, must be viewed together as shown in the key at the top of FIG. 6A. Programmable (configurable) bits controlling the function of the CLE are shown as small boxes containing an "x".

The details of one function generator compatible with the interconnect structure of the invention are shown and described in commonly assigned, co-pending U.S. application Ser. No. 08/786,818 entitled "Configurable Logic Block with AND Gate for Efficient Multiplication in FPGAs" by Chapman et al, which is referenced above and incorporated herein by reference.

One CLE compatible with the interconnect structure of the invention is the CLE of FIGS. 6A and 6B, which includes four function generators: F and G in FIG. 6B, and H and J in FIG. 6A. Function generator F has four inputs F1, F2, F3, F4; function generator G has four inputs G1, G2, G3, G4; function generator H has four inputs H1, H2, H3, H4; and function generator J has four inputs J1, J2, J3, J4. Each of function generators F, G, H, J also has a data-in input DI and an output O. In addition, each function generator F, G has a write strobe WS input WSF, WSG, respectively, generated in write strobe generator WB from clock input signal CK0 optionally inverted by multiplexer 69B, set/reset input signal SR0 optionally inverted by multiplexer 60B, and input signal BF optionally inverted by multiplexer VF. Each function generator H, J has a write strobe WS input WSH, WSJ, respectively, generated in write strobe generator WA from clock input signal CK1 optionally inverted by multiplexer 69A, set/reset input signal SR1 optionally inverted by multiplexer 60B, and input signal BH optionally inverted by multiplexer VH.

Function generators F, G, H, J of FIGS. 6A and 6B preferably include novel features described by Bauer in commonly assigned, co-pending U.S. patent application Ser. No. 08/754,421 entitled "Lookup Tables Which Double as Shift Registers", which is referenced above and incorporated herein by reference. Briefly, these function generators have the ability to operate as shift registers as well as small RAMs and lookup tables. Write strobe signal WS controls the shifting function and the RAM write cycle. (In one embodiment, write strobe signal WS is implemented as two separate control signals, as described by Bauer.) Data-in port DI carries a data signal (in this embodiment derived from input signals BF, BH, BG, BJ) for writing to an addressed memory cell. When function generators F, G, H, J are configured as shift registers as described by Bauer, the shift register data input signal is taken from BF, BG, BH, BJ, respectively. Write strobe generators WB, WA generate write strobe signals WSF and WSG, WSH and WSJ, respectively. Signals WSF, WSG, WSH, WSJ strobe data into their respective function generators during a write cycle when the function generators are configured as RAM, and cause a shift when the function generators are configured as shift registers. The use of function generators as RAM is described in pages 4-11 through 4-23 of the Xilinx 1996 Data Book entitled "The Programmable Logic Data Book", which pages are incorporated herein by reference.

The function generator of this embodiment can therefore be configured as a look-up table, a shift register, a 16×1 RAM, half of a 16×1 dual-ported RAM (when the two function generators in a slice are paired together), half of a 16×2 RAM, or half of a 32×1 RAM (when the two function generators in a slice are paired together). Not all combinations of function generator configurations are supported in a single slice. The supported combinations are detailed below.

In this embodiment, write strobe signals WSF and WSG are controlled by write strobe generator WB. A High (logic 1) pulse on function generator input WS causes a write to occur to the function generator look-up table, to either the first memory cell of the look-up table (if configured as a shift register) or to an addressed cell (if configured as a RAM). (See commonly assigned, co-pending U.S. patent application Ser. No. 08/754,421 entitled "Lookup Tables Which Double as Shift Registers", which is referenced above and incorporated herein by reference.)

Write strobe generator WB functions as follows in the supported combinations of function generator configurations: a) when function generators F and G are both configured as look-up tables, write strobe signals WSF and WSG are held Low (logic 0); b) when function generator G is configured as a 16×1 RAM or shift register and function generator F is configured as a look-up table, write strobe signal WSF remains Low while write strobe signal WSG pulses High when SR0 is active (Low or High, depending on whether multiplexer 60B is inverting or not) and CK0 makes the proper transition (falling or rising, depending on whether multiplexer 69B is inverting CK0 or not); c) when function generators F and G are configured as a dual-ported 16×1 RAM, a 16×2 RAM, or a pair of shift registers, write strobe signals WSF and WSG pulse High together when SR0 is active and CK0 makes the proper transition; d) when function generators F and G are configured as a single 32×1 RAM, one but not both of write strobe signals WSF and WSG pulses High, when SR0 is active and CK0 makes the proper transition. The generated High pulse occurs on write strobe signal WSF if multiplexer VF is non-inverting and input signal BF is High or if multiplexer VF is inverting and input signal BF is low, otherwise the High pulse occurs on write strobe signal WSG. As can be seen from the above description, SR0 acts as a write enable and CK0 acts as a clock to a synchronous RAM or shift register, while BF serves as a fifth address bit when the two function generators in a slice are configured as a 32-bit RAM.

Write strobe signals WSH and WSJ are generated by write strobe generator WA and controlled by input signals SR1, CK1, and BH, in a corresponding fashion.

AND gates 61F, 61G, 61H, 61J and multiplexers 81F, 81G, 81H, 81J, CF, CG, CH, CJ implement multiplier and carry logic functions as described in commonly assigned, co-pending U.S. patent application Ser. No. 08/786,818 entitled "Configurable Logic Block with AND Gate for Efficient Multiplication in FPGAs" by Chapman et al, which is referenced above and incorporated herein by reference. In FIGS. 6A and 6B, each of multiplexers 81F, 81G, 81H, 81J has separate programmable memory cells that determine the multiplexer output. In another embodiment, the two multiplexers in each slice (81F and 81G, 81H and 81J) share memory cells and therefore have the same programmed functionality.

In the embodiment of FIGS. 6A and 6B, each slice has a separate carry chain. One carry chain is from input signal CIN0 to output signal COUT0 and incorporates the outputs of function generators F and G. The other carry chain is from input signal CIN1 to output signal COUT1 and incorporates the outputs of function generators H and J. In one embodiment, the two carry chains are implemented as described in U.S. Pat. No. 5,629,886, entitled "Method and Structure for Providing Fast Propagation of a Carry Signal in a Field Programmable Gate Array" by Bernard J. New, which is incorporated herein by reference.

Each slice further includes five-input-function multiplexer F5A, F5B and six-input-function multiplexer F6A, F6B. In FIG. 6A, multiplexer F6A receives an input signal on west-going line F5W from the output of multiplexer F5B in FIG. 6B. In FIG. 6B, six-input-function multiplexer F6B receives an input signal on east-going line F5E from the output of multiplexer F5A in FIG. 6A. Multiplexer F6A receives a second input signal from multiplexer F5A, and multiplexer F6B receives a second input signal from multiplexer F5B. Multiplexer F5A receives inputs from outputs O of function generators H and J. Multiplexer F5B receives inputs from outputs O of function generators F and G.

The CLE of this embodiment receives four extra control signals on lines BF, BH, BG, and BJ. These lines can be programmably inverted using multiplexers VF, VH, VG, and VJ, respectively, and control several useful functions. The five-input function multiplexers F5A, F5B are controlled by lines BH, BF, respectively. The six-input function multiplexers F6A, F6B are controlled by lines BJ, BG, respectively. A user can form a four-input multiplexer using multiplexer F5A and the outputs of function generators H and J, with function generators H and J each configured as a two-input multiplexer. Similarly, a four-input multiplexer can be formed using multiplexer F5B and the outputs of function generators F and G. A user can form an eight-input multiplexer using either multiplexer F6A or multiplexer F6B receiving inputs from both multiplexers F5A and F5B, each of which is receiving outputs from its respective function generators. Further, with multiplexer F5A, the memory cells in function generators H and J can operate as a 32-bit RAM. With multiplexer F5B, the memory cells in function generators F and G can operate as a 32-bit RAM. Lines BF, BH, BG, BJ serve as multiplexer control lines or RAM address lines, in addition to other functions as later described.

Registers RX, RY, RZ, RV generate outputs XQ, YQ, ZQ, VQ, respectively. Clock inputs to registers RX, RY, RZ, RV are designated by open triangles with apexes pointing into these registers. Clock enable inputs CE can be disabled using AND-gates 62A, 62B. (AND-gates 62A, 62B are controlled by a programmable memory cell that provides one of the inputs to each AND-gate.) Registers RX, RY, RZ, RV can be set or reset either synchronously or asynchronously through set port S or reset port R. (The choice of synchronous or asynchronous is made by a programmable memory cell shared between the two registers in each slice.) Set/reset input signals SR0, SR1 are controlled by multiplexers 60A, 60B and AND-gates 67A, 67B. Inputs SR0, SR1 (if enabled by AND-gates 67A, 67B) can set or reset the registers. Set/reset control units R81B, R82B, R81A, R82A are programmably controlled to either set or reset registers RX, RY, RZ, RV, respectively. Registers RX, RY, RZ, RV can also be configured as latches, the choice being made by a programmable memory cell shared between the two registers in each slice.

XOR gates SF, SG, SH, SJ generate the sum portion of an addition or multiplication, as described in commonly assigned, co-pending U.S. patent application Ser. No. 08/754,421 entitled "Lookup Tables Which Double as Shift Registers", which is referenced above and incorporated herein by reference.

Multiplexers MF, MG, MH, MJ select between signals to place onto output lines X, Y, Z, V, respectively. Multiplexers MF and MH select between the related function generator output signal, sum output signal, and five-input function multiplexer output signal. Multiplexers MG and MJ select between the related function generator output signal, sum output signal, and six-input function multiplexer output signal. The function generator F, G, H, J output signal is selected when a logical function of up to four inputs is chosen. The five-input function multiplexer F5A, F5B output signal is selected when one of a limited set of nine-input functions is chosen, including any logical function of five inputs, a 4-to-1 multiplexer, and any other function that can be implemented as two four-input functions feeding a 2-to-1 multiplexer. The six-input function multiplexer F6A, F6B output signal is selected when one of a limited set of 18-input functions is chosen, including any logical function of six inputs, an 8-to-1 multiplexer, and any other function that can be implemented as the output of two five-input function multiplexers F5A, F5B feeding a 2-to-1 multiplexer. The sum output signal of XOR gates SF, SG, SH, SJ is selected when an appropriate arithmetic operation such as addition, subtraction or multiplication is implemented.

Multiplexers OF, OG, OH, OJ allow the carry chain to bypass the related function generator. Multiplexers OF, OG, OH, OJ select whether the respective carry multiplexer CF, CG, CH, CJ is controlled by the function generator output signal O or whether the carry chain bypasses the function generator by propagating the carry-in signal to the next stage along the carry chain. Multiplexers CA, CB allow additional access onto their respective carry chains by selecting either a carry-in signal CIN0, CIN1 (buffered in this embodiment by inverters I121B and I122B, I121A and I122A, respectively) or an input signal BF, BH as the starting point for the carry chain in the CLE.

Multiplexers DF, DH select a signal to be loaded into related registers RX, RZ either from the outputs of multiplexers MF, MH, or from input signals BF, BH, respectively. Multiplexers DG, DJ select a signal to be loaded into related registers RY, RV either from the outputs of multiplexers MG, MJ, or from input signal lines BG, BJ, respectively.

Multiplexers BB, BA are bypass multiplexers that can apply carry-out signals COUT0, COUT1 to output lines YB, VB, or can forward input signals BG, BJ to output lines YB, VB to route a signal generated on one side of the CLE to a destination on the other side of the CLE.

AND-gates BRB, BRA allow input signals BG, BJ to serve as set/reset signals to registers RX, RY, RZ, RV, or alternatively allows input signals BG, BJ to be decoupled from registers RX, RY, RZ, RV so that input signals BG, BJ can be used for other purposes, such as controlling multiplexers F6B, F6A or providing a DI signal to function generators G, J, without setting or resetting the registers. A logic 0 in the memory cells controlling AND-gates BRB, BRA decouples lines BG, BJ from set/reset control units R81B, R82B, R81A, R82A; while a logic 1 in the associated memory cell enables AND-gates BRB, BRA to use the signals on BG, BJ to set or reset registers RX, RY, RZ, RV as determined by set/reset control units R81B, R82B, R81A, R82A.

Input Multiplexer IMUX

FIG. 7 shows details of the interior of input multiplexer IMUX of the embodiment shown in FIG. 3. As shown in FIG. 7, the input lines in this embodiment (G, 430, DIW, 428, DIE, 429) are selectively programmed to drive a series of 34 outputs (431, 432, 436, LV0, LV6, LH0, LH6). 26 of these outputs drive CLE inputs 436, two drive the data inputs 431 and two drive the enable inputs 432 of tristate buffers 445, two drive LV0 and LV6 (two lines of vertical long line bus LVS), and two drive LH0 and LH6 (two lines of horizontal long line bus LHE). Not all inputs can drive all outputs; a selection of how many PIPs to provide and where they should be located is typically made based on the trade-off constraints of performance, silicon area, and routing flexibility. In one embodiment, any IMUX output not connected to any IMUX input line is connected through a pullup to the positive voltage supply.

Routing Examples

Figure 8:
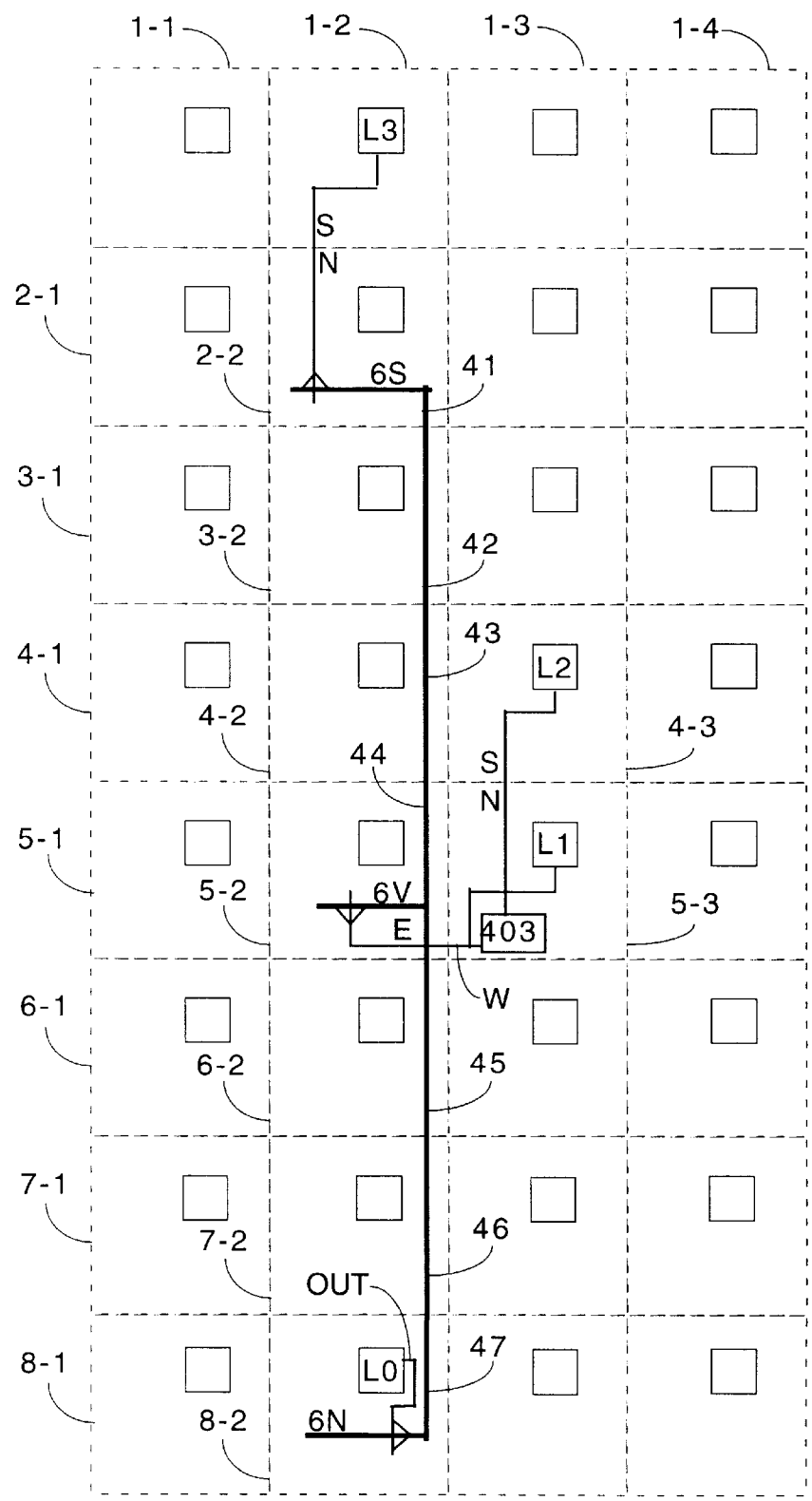
FIG. 8 shows a routing example of a signal path using hex and single-length lines.
Figure 9:
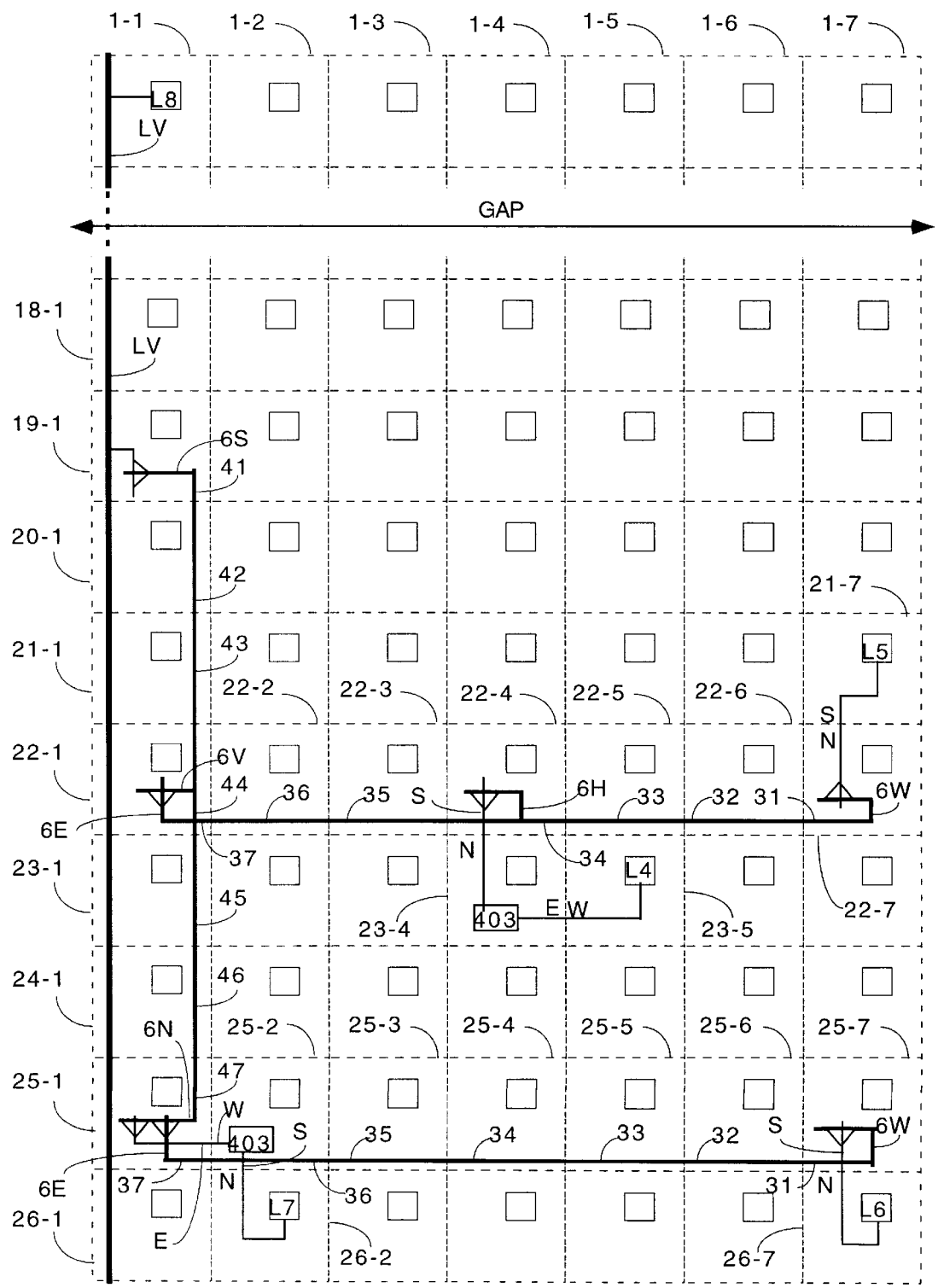
FIG. 9 shows a routing example of a signal path using long lines, hex lines, and single-length lines.

FIGS. 8 and 9 show examples of signal paths implemented in an array of tiles according to the embodiment: shown in FIG. 3. The labeling convention used in FIGS. 8 and 9 is that tiles are identified by a row and column number based on the portion of the array shown in the figure. Within a tile the line labels correspond to the bus labels indicated in FIG. 2. However, in FIGS. 8 and 9, the label indicates a single line rather than the entire bus. Only lines used in the examples are shown and labeled. With this labeling convention, some labels are used more than once. But no ambiguity exists, because all tiles are identical and each tile has a different tile number. The tile numbers distinguish between labels used more than once in the same drawing.

FIG. 8 shows a routing example of a signal path using hex and single-length lines. A signal is sourced by source logic block L0 of tile 8-2, and programmably connected within the tile through line OUT to hex segment 6N. Hex segment 6N turns north and becomes vertical hex segment 47. This signal must fan out to logic blocks at three destinations in tiles 5-3, 4-3, and 1-2. The signal passes through tiles 7-2 through 3-2 on segments 46 through 42. At tile 5-2, the signal is on segment 44, where it fans out to segment 6V. In tile 5-2, segment 6V is programmably connected to single-length line E, which continues east into tile 5-3 as line W. In tile 5-3, line W is an input to the first destination, logic block L1, and also to switching structure 403, where it is programmably connected to line N. Line N of tile 5-3 continues north into tile 4-3 as line S, which is an input to the second destination, logic block L2. The northern end of the vertical hex line is reached in tile 2-2, where the signal is on segment 41. Segment 41 is programmable connected to single-length line N, which continues north into tile 1-2 as line S. In tile 1-2, line S is an input to the third destination, logic block L3.

Thus in FIG. 8 a signal net is formed from source logic block L0 to destination logic blocks L1, L2 and L3. The connections are fast because the PIP onto the hex line is buffered, there is a low capacitance on the hex line due to the small number of PIPs on the hex line, and each path from source to destination has a small total number of PIPs inserting delay into the signal path. In the example of FIG. 8, each signal path between source and destination logic blocks requires at most three PIPs: one buffered PIP onto the hex line and one or two unbuffered PIPs onto single-length lines. (A logic block is the structure designated LB in FIG. 2.)

FIG. 9 shows a routing example of a signal path using a long line, hex lines, and single-length lines. A signal is sourced by source logic block L8 of tile 1-1, and must be routed to logic blocks L4, L5, L6, and L7. The signal from logic block L8 is programmably connected within tile 1-1 to one of the vertical long lines LV accessible from that particular tile. Long line LV extends southward for 18 tiles to tile 19-1, where long line LV is programmably connected to hex segment 6S, then continues southward to drive other hex lines (not shown) south of the portion of the array shown in FIG. 9. (The gap of 18 tiles in FIG. 9 is included to demonstrate that long line LV must carry the signal far enough that a long line is more efficient than concatenated hex lines.) From hex segment 6S in tile 19-1, the signal turns south and becomes vertical hex segment 41. The signal passes through tiles 20-1 through 24-1 on segments 42 through 46. At tile 22-1, the signal is on segment 44, where it fans out to segment 6V and continues south to tile 25-1. From segment 6V in tile 22-1, the signal makes a programmable connection to segment 6E (demonstrating the connection of two perpendicular hex lines). The signal then moves east on segment 37, traversing tiles 22-2 through 22-6 on segments 36 through 32. At tile 22-4, the signal is on segment 34, where it fans out to segment 6H and continues east to tile 22-5. In tile 22-4, the signal makes a programmable connection between segment 6H and single-length line S, which continues south into tile 23-4 as line N. In tile 23-4, line N enters switching structure 403 and connects to line E, which continues east into tile 23-5 on line W, an input to the first destination, logic block L4. From segment 32 in tile 22-6, the signal continues east into tile 22-7 on segment 31, then turns north onto segment 6W. Segment 6W is programmably connected to line N, which continues north into tile 21-7 as line S and is an input to the second destination, logic block L5.

Returning to the vertical hex line, the signal on segment 46 in tile 24-1 continues south into tile 25-1 on segment 47, which turns west on segment 6N. From segment 6N in tile 25-1, the signal makes a programmable connection to segment 6E. The signal then moves east on segment 37, traversing tiles 25-2 through 25-6 on segments 36 through 32. From segment 32 in tile 25-6, the signal continues east into tile 25-7 on segment 31, then turns north onto segment 6W. Segment 6W is programmably connected to line S, which continues south into tile 26-7 as line N and is an input to the third destination, logic block L6. One further connection remains to be made. From the south end of the vertical hexline, in tile 25-1, the signal on segment 6V makes an additional programmable connection to line E. Line E continues east into tile 25-2 on line W. In tile 25-2, line W enters switching structure 403 and connects to line S, which continues south into tile 26-2 on line N, an input to the fourth destination, logic block L7.

Thus in FIG. 9 a signal net is formed from source logic block L8 to destination logic blocks L4, L5, L6 and L7. As in the example of FIG. 8, the connections to long lines and hex lines are buffered and the RC delay of the unbuffered connection is minimized. In this example, these destinations required at most four PIPs in the interconnect path between logic blocks: one or two buffered PIPs onto hex lines, and one or two unbuffered PIPs onto single-length lines. Yet 31 tiles were traversed between source logic block L8 and destination logic block L6.

In all of the above routing examples, alternative paths are available, many of which require more PIPs than the signal paths used in these examples. If some of the interconnect lines on one path are already used by other signals, an alternative path may be used.

High Fanout Routing Examples

Figure 10:
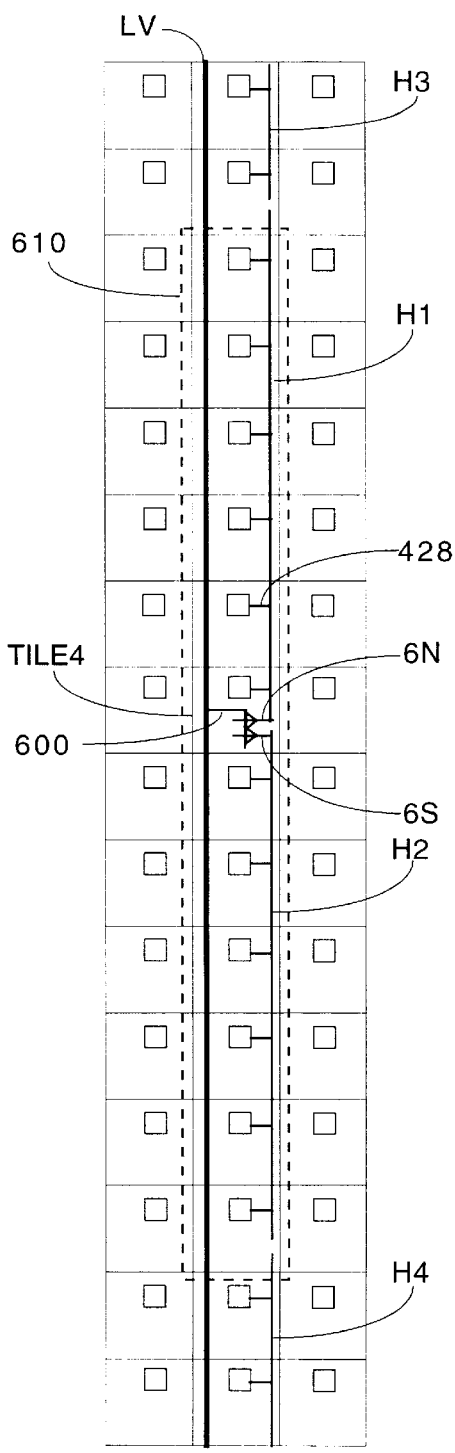
FIG. 10 shows a routing example of a high fanout control signal delivered to a column of tiles.

FIG. 10 shows a routing example of a high fanout control signal, such as a clock (CK), clock enable (CE), set/reset (SR), or tristate enable signal (432) delivered from a vertical long line to a column of tiles. A signal can be placed onto a vertical long line either from outside the tile array, or by using one of lines 437I of FIG. 2. From vertical long line bus LV, in every twelfth tile (TILE4) the high fanout control signal emerges on line 600. Line 600 drives two vertical hex lines, one of which (H1) extends north six tiles from TILE4 and one of which (H2) extends south six tiles from TILE4. From hex lines H1 and H2, lines 428 (shown in FIG. 2) permit four bits of each vertical hex bus to drive the logic block. The input multiplexer (IMUX) of FIG. 7 permits vertical hex lines, through lines 428, to drive control signals CK, CE, SR, and 432 without passing through a single-length line, although signals on other CLE inputs, such as function generator inputs, must always pass through a single-length line to reach the CLE. Hex line H1 drives the logic block in TILE4, plus the five tiles adjacent to the north. Note that in the northernmost tile reached by hex line H1, line 428 does not make contact with hex line H1. Instead, contact is made with hex line H3, which originates 12 tiles north of TILE4. Hex line H2 drives the six logic blocks adjacent to the south of TILE4. North of hex line HI, hex line H3 drives the adjacent six logic blocks. South of hex line H2, hex line H4 drives the adjacent six logic blocks. Each hex line drives a high fanout control signal in six logic blocks. The tiles accessed by hex lines H1 and H2 (labeled 610 in FIG. 10) form a column of 12 tiles that can be vertically repeated to access an entire column of an array of repeating tiles.

FIG. 10 shows that for a high fanout control signal, there is only one PIP between a signal on a vertical long line and any destination logic block in the same column. (However, in the preferred embodiment, there is an additional PIP added to the path in input multiplexer IMUX.) Therefore, there is very little delay on this path. Additionally, this distribution method has the same number of PIPs and the same number of interconnect lines (one long line, one hex line) in the path to each logic block input. Therefore, there is very low skew on this path. Although the global lines (G in FIG. 3) would typically be used for up to four clocks, the distribution method of FIG. 10, by taking advantage of the hierarchical nature of the interconnect scheme according to the invention, produces an excellent additional clock distribution network with high performance and low skew.

Figure 11:
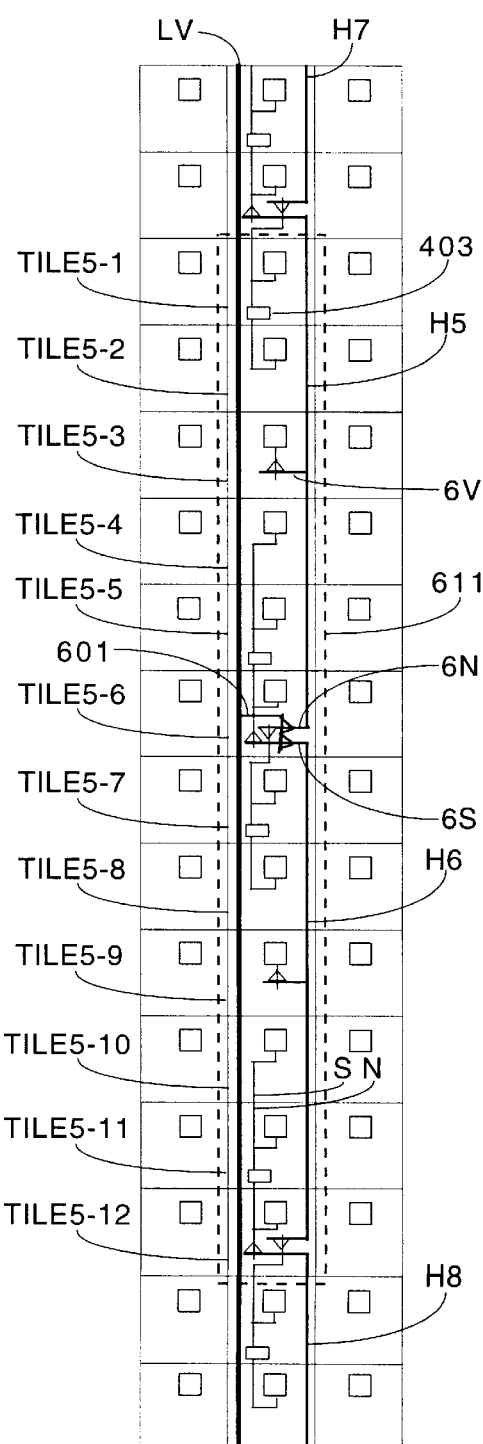
FIG. 11 shows a routing example of a high fanout function generator input signal delivered to a column of tiles.

FIG. 11 shows a routing example of a high fanout function generator input signal (or other non-control signal) delivered from a vertical long line to a column of tiles. A signal can be placed onto a vertical long line either from outside the tile array, or by using one of lines 437I of FIG. 2. From vertical long line bus LV, in every twelfth tile (TILE5-6) the high fanout function generator input signal emerges on line 601. Line 601 drives two vertical hex lines, one of which (H5) extends north six tiles from TILE4 and one of which (H6) extends south six tiles from TILE4. From hex lines H5 and H6, line segments 6S, 6N and 6V are used in conjunction with single-length lines N, S and switching structures 403 to drive the logic blocks, similar to the interconnections in FIGS. 8 and 9. In one embodiment, signals connecting to function generator inputs inside the CLE must always pass through a single-length line to reach the CLE. Hex line H5 drives, through single-length lines, the logic blocks in tiles TILE5-7, TILE5-8, and TILE5-3. In addition, hex line H5 drives, through single-length lines, the logic blocks in the three southernmost tiles of the 12-tile column to the north of column 611 (corresponding to tiles TILE5-10, TILE5-11, and TILE5-12 of column 611). Hex line H6 drives, through single-length lines, the logic blocks in tiles TILE5-4, TILE5-5, TILE5-6, and TILE5-9. In addition, hex line H6 drives, through single-length lines, the logic blocks in the two northernmost tiles of the 12-tile column to the south of column 611 (corresponding to tiles TILE5-1 and TILE5-2 of column 611). Tiles TILE5-1 and TILE5-2 are driven, through single-length lines, by hex line H7, which originates 12 tiles north of TILE5-6. Tiles TILE5-10, TILE5-11, and TILE5-12 are driven, through single-length lines, by hex line H8, which originates 12 tiles south of TILE5-6. Each hex line drives a high fanout function generator input signal in six logic blocks. Thus, by cooperation between adjacent 12-tile columns 611, a repeating pattern is formed that enables the distribution of non-control signals to an entire column of an array of repeating tiles.

Note that other connections of hex lines and single-length lines are possible. For example, the logic block in TILE5-2 can be driven by hex line 6V through a switching structure and single-length line in TILE5-3 (not shown) and hence through an additional switching structure and single-length line in TILE5-2 to drive the logic block in TILE5-1. This or a similar arrangement can be used in the northernmost implementation of 12-tile column 611, to access the two northernmost tiles. Similar connections can be made in the southernmost implementation of 12-tile column 611 to access the three southernmost tiles.

FIG. 11 shows that for a high fanout function generator input signal, there are either two or three PIPs between a signal on a vertical long line and any destination logic block in the same column: one from the long line to a hex line, one from the hex line to a first single-length line, and sometimes one to a second single-length line through the switching structure. (However, in the preferred embodiment, there is an additional PIP added to the path in input multiplexer IMUX.) Only the last one or two PIPs are unbuffered. Therefore, there are no large unbuffered RC trees on this net, no signal path has more than two unbuffered PIPs in series, and the delay on each signal path is minimized.

Figure 12:
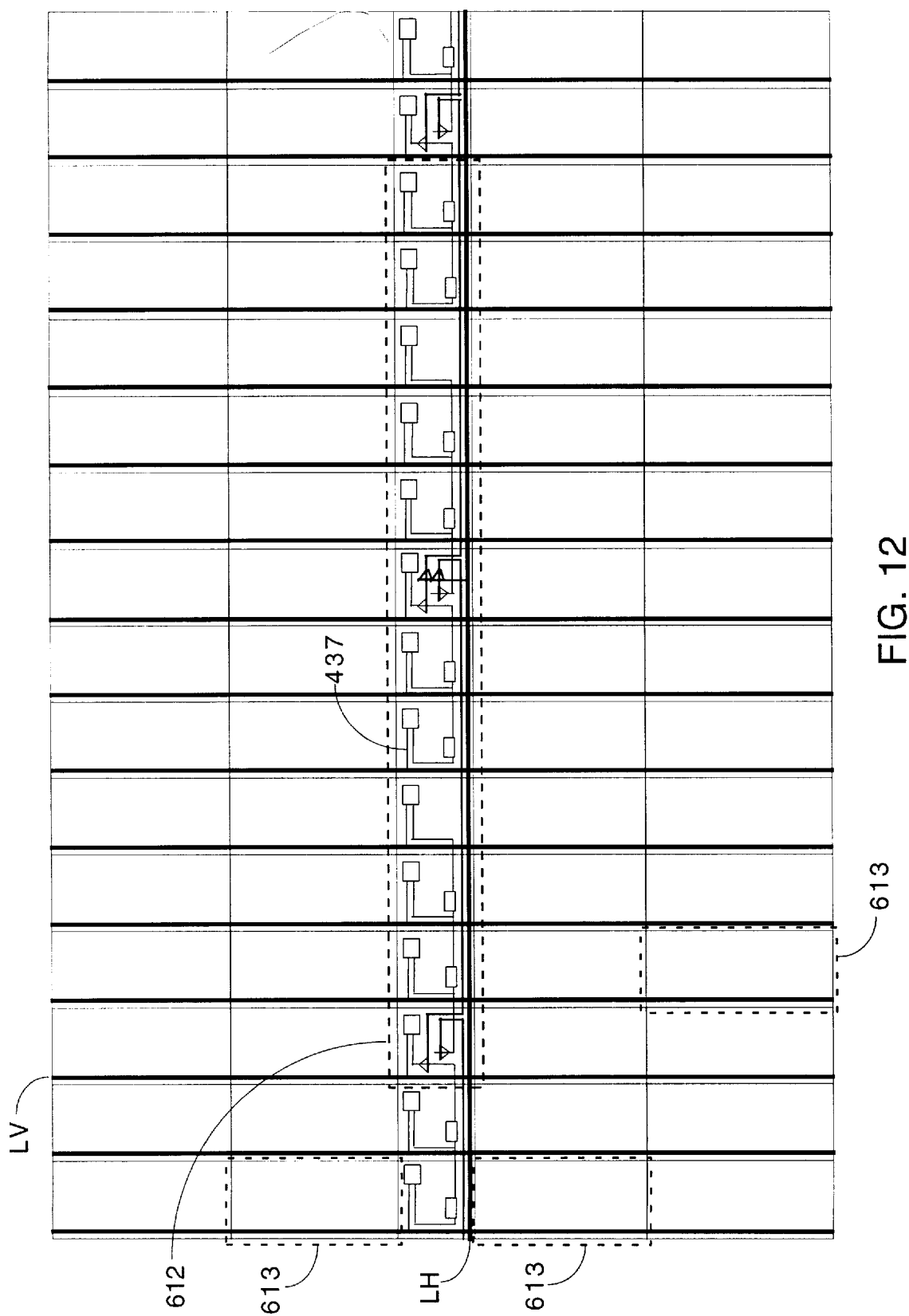
FIG. 12 shows an example of how to combine the interconnect of FIGS. 10 and/or 11 to deliver a high-fanout signal to an array of tiles.

FIG. 12 shows an example of how to combine the interconnect of FIGS. 10 and/or 11 to deliver a high-fanout signal to an array of tiles. A signal can be placed onto a horizontal long line either from outside the tile array, or by using one of lines 438 of FIG. 2. The signal enters the portion of the array shown in FIG. 12 on a line in horizontal long line bus LH. Long line bus LH traverses a row of 12 tiles 612, in which it makes contact with 12 logic blocks through hex lines and single-length lines. The horizontal single-length lines connected to some horizontal hex lines can drive vertical long lines through PIPs in the IMUX. From the logic blocks in the 12 tiles of FIG. 12, lines 437I extend from the input multiplexer (see FIG. 2) in the logic block to drive the vertical long lines LV. Using lines 437I in each of the 12 tiles 612, the signal on horizontal long line bus LH is transferred to 12 vertical long lines LV. Columns of 12 vertical tiles (613) can be implemented by either 12 tiles 610 of FIG. 10 (for control signals) or 12 tiles 611 of FIG. 11 (for function generator or other non-control inputs). Multiple 12-tile columns 613 can be placed to increase the number of accessible tiles. In this manner, high fanout signals can be distributed from an originating tile to any tile in the array.

As an alternative to the distribution scheme of FIG. 12, special tiles can be created that permit, for example, hex lines to drive long lines, thus bypassing the single-length lines used in FIG. 12. Such special tiles can be advantageously placed in rows along the top and bottom edges of the tile array, or at intervals within the array.

SUMMARY

The interconnect structure of the present invention offers uniformly fast signals throughout the FPGA, due to the reduced loading (limited number of PIPs) on each interconnect line, the lack of large RC trees on signal nets, and the relatively small number of PIPs between source and destination on each path. The nearly uniform delays on various interconnect paths greatly mitigate a common situation in FPGAs where a few signal paths, much slower than the average signal path, significantly reduce the overall performance of the circuit. Intermediate-length lines enable the efficient implementation of localized circuits and ease the burden on routing software. The limited number of PIPs, and the judicious arrangement thereof, imparts a high degree of routing flexibility per silicon area consumed. Further routing flexibility is provided by the ability of logic block inputs to contact interconnect lines located on any edge of the logic block. Thus it will be understood that the present invention provides a new and useful interconnect structure for FPGAs.

Input/Output Routing Structures

Figure 13:
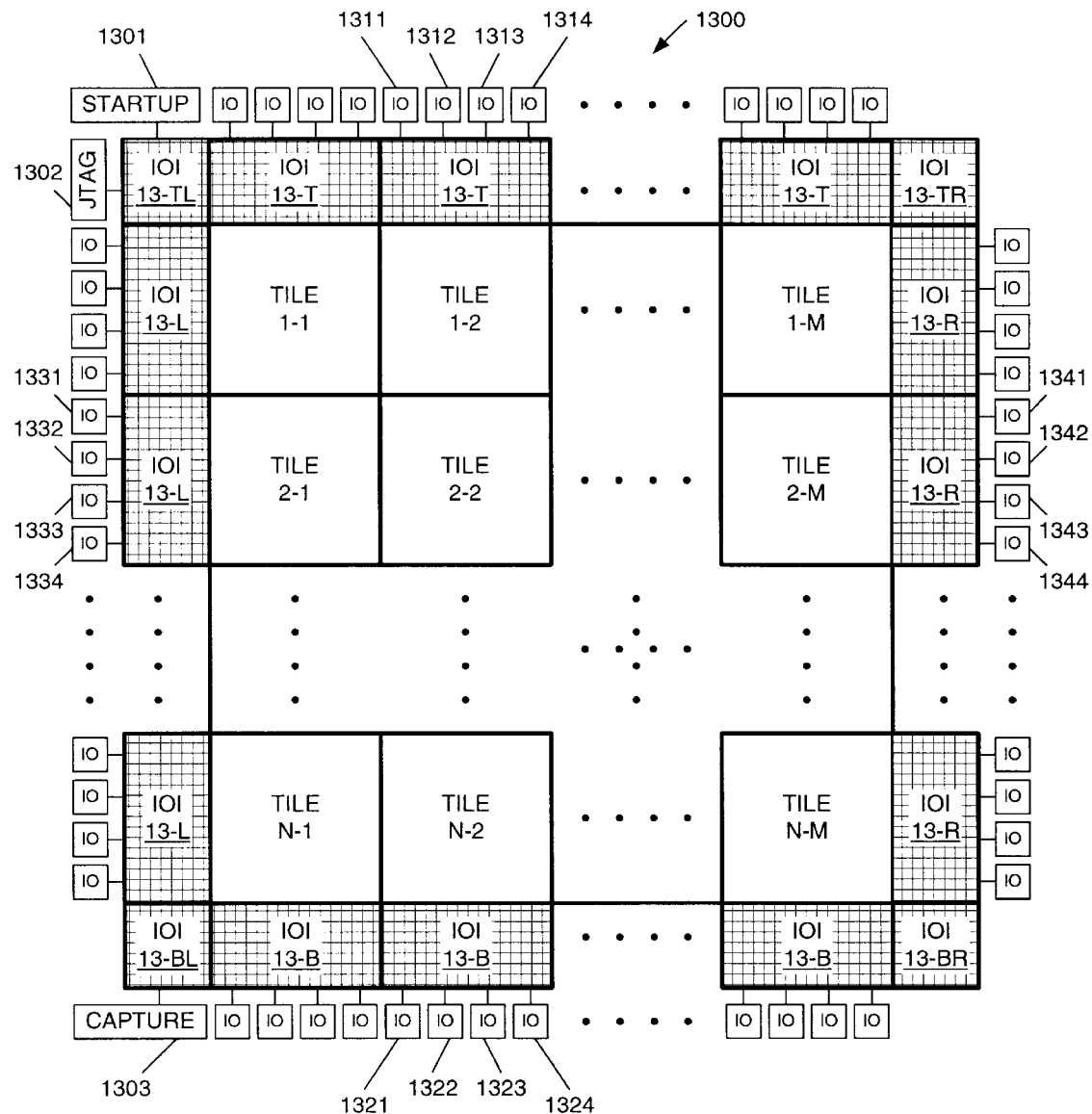
FIG. 13 is a block diagram of an FPGA that includes input/output interface (IOI) circuits and input/output (IO) blocks in accordance with one embodiment of the present invention.

In accordance with another embodiment of the present invention, input/output interface (IOI) circuitry is provided between an array of the above-described tiles (e.g., FIGS. 2 and 3) and a plurality of input/output (IO) blocks. FIG. 13 is a block diagram of a field programmable gate array (FPGA) 1300 that includes such IOI circuitry and IO blocks in accordance with one embodiment of the present invention. FPGA 1300 includes an N×M array of tiles, including tiles 1-1 to N-M, surrounding IOI circuits 13-T, 13-B, 13-L, 13-R, 13-TL, 13-TR, 13-BL and 13-BR, a plurality of IO blocks (e.g., IO blocks 1311–1314), start-up circuit 1301, JTAG circuit 1302 and capture circuit 1303.

The individual tiles in the array are labeled using the format "tile X-Y", where X is the row of the array, and Y is the column of the array. The array has N rows and M columns, where N and M can be any integers. In one embodiment, N and M are equal to 64 and 96, respectively. Not all of the tiles in the array are illustrated in FIG. 13 for purposes of clarity. Tiles that are not illustrated are represented by a plurality of dots. In the described embodiment, each of the tiles in the array is identical to the tile illustrated in FIG. 3.

Each of the outermost tiles of the array is coupled to one or more corresponding IOI circuits. In the described embodiment, there are eight distinct IOI circuits 13-T, 13-B, 13-L, 13-R, 13-TL, 13-TR, 13-BL and 13-BR. The northern portion of each tile in the first row of the array is coupled to a corresponding top IOI circuit 13-T. The southern portion of each tile in the last row of the array is coupled to a corresponding bottom IOI circuit 13-B. The number of top and bottom IOI circuits 13-T and 13-B therefore corresponds to the number of columns in the array.

The western portion of each tile in the first column of the array is coupled to a corresponding left IOI circuit 13-L The eastern portion of each tile in the last column of the array is coupled to a corresponding right IOI circuit 13-R. The number of left and right IOI circuits 13-L and 13-R therefore corresponds to the number of rows in the array.

The IOI circuits that have the same reference numbers are identical. For example, all of the top IOI circuits 13-T located along the top edge of the array are identical, and all of the right IOI circuits IOI 13-R located along the right edge of the array are identical.

Each of IOI circuits 13-T, 13-B, 13-R and 13-L is further coupled to four corresponding IO blocks. As used herein, IO blocks are defined as circuits that provide an interface for external signals passing to and from FPGA 1300. IOI circuits 13-T, 13-B, 13-R and 13-L, and the IO blocks are described in more detail below. In other embodiments, other numbers of IO blocks (i.e., more than four or fewer than four) can be coupled to each of the IOI circuits.

Four additional IOI circuits 13-TL, 13-TR, 13-BL and 13-BR are provided at the four corners of the array. Top left IOI circuit 13-TL couples the top IOI circuit 13-T corresponding to tile 1-1 to the left IOI circuit 13-L corresponding to tile 1-1. Top left IOI circuit 13-TL also provides an interface for startup circuit 1301 and JTAG circuit 1302. Startup circuit 1301 is a conventional circuit similar, for example, to that shown on page 6-55 of "The Programmable Logic Data Book 1999, available from Xilinx, Inc., which is hereby incorporated by reference. JTAG 1302 is a conventional circuit similar, for example, to those described in "Boundary Scan in XC4000 Devices", by Luis Morales, application note XAPP017.001, available from Xilinx, Inc., which is hereby incorporated by reference.

Bottom left IOI circuit 13-BL couples the bottom IOI circuit 13-B corresponding to tile N-1 to the left IOI circuit 13-L corresponding to tile N-1. Bottom left IOI circuit 13-BL also provides an interface for capture circuit 1303. Capture circuit 1303 a circuit that is unrelated to the IOI circuit except that it accesses some of the interconnect lines in the IOI circuit (in this case, the global lines). The presence of capture circuit 1303 demonstrates that unused area in the IOI circuits can be used to implement additional circuitry.

Top right IOI circuit 13-TR couples the top IOI circuit 13-T corresponding to tile 1-M to the right IOI circuit 13-R corresponding to tile 1-M. Similarly, bottom right IOI circuit 13-BR couples the bottom IOI circuit 13-B corresponding to tile N-M to the right IOI circuit 13-R corresponding to tile N-M.

Corner IOI circuits 13-TL, 13-BL, 13-TR and 13-BR are described in more detail below.

Figure 14:
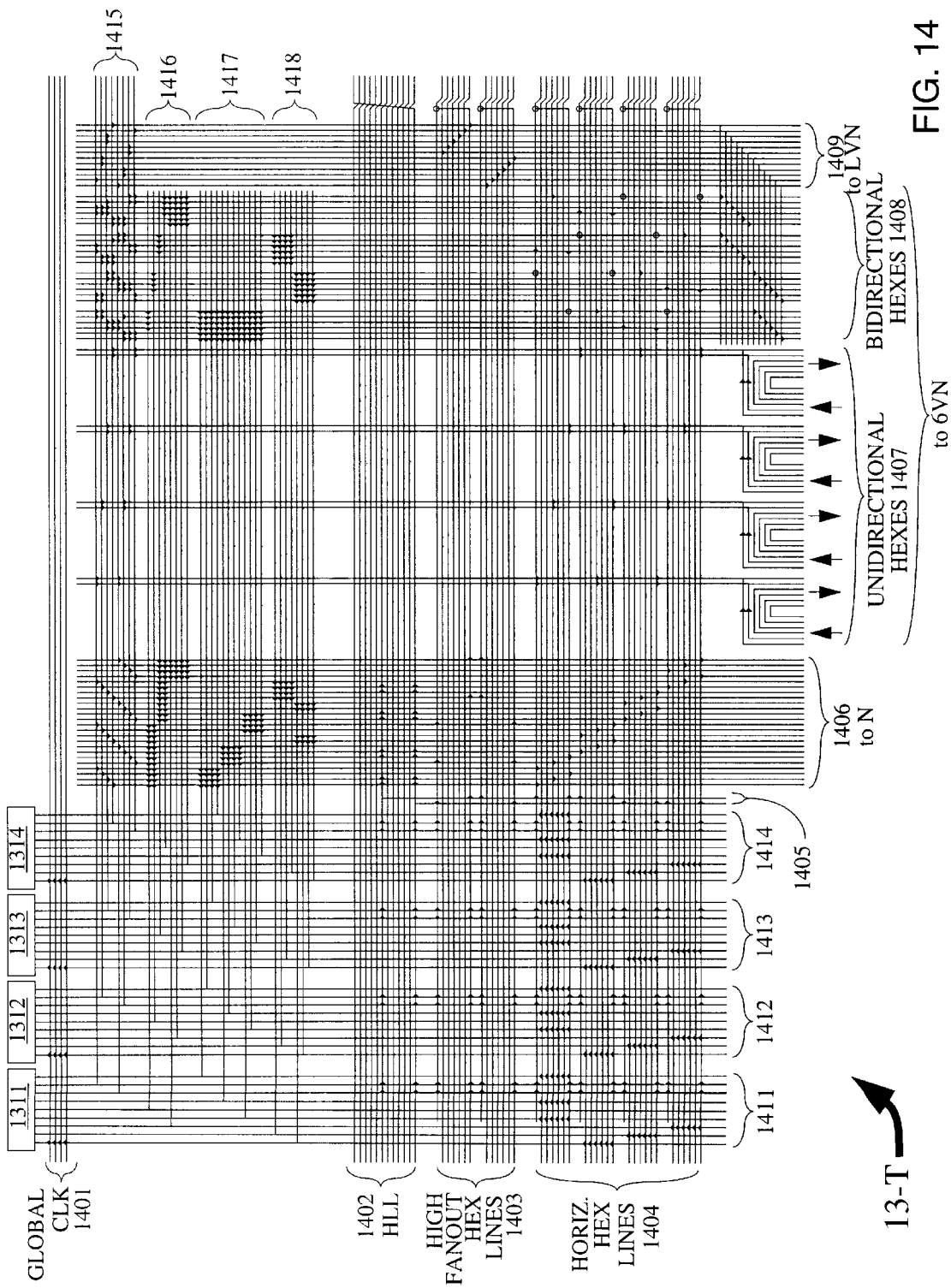
FIG. 14 is a schematic diagram of a top IOI circuit and corresponding IO blocks in accordance with one embodiment of the present invention.

FIG. 14 is a schematic diagram of top IOI circuit 13-T and IO blocks 1311–1314 in accordance with one embodiment of the present invention. Top IOI circuit 13-T provides programmable connections between IO blocks 1311–1314 and the rest of FPGA 1300 in the manner described below.

The routing resources provided by top IOI circuit 13-T include a set of four global clock lines 1401, a set of twelve horizontal long lines 1402, two sets of six bi-directional high-fanout hex lines 1403, and four sets of six bi-directional horizontal hex lines 1404. These sets of lines 1401–1404 extend horizontally across top IOI circuit 13-T, and are connected to corresponding sets of lines in an adjacent top IOI circuit 13-T (or in top left IOI circuit 13-TL or top right IOI circuit 13-TR). Global clock lines 1401 are used to route up to four global clock signals throughout the FPGA with low skew.

A set of PIPs 1405 is configured to provide programmable connections between the first and seventh horizontal long lines 1402 and high fanout hex lines 1403. The set of PIPs 1405 also provides programmable connections between the first and seventh horizontal long lines 1402 and horizontal hex lines 1404.

Horizontal long lines 1402 include an offset region near the right side of FIG. 14 where the horizontal long lines are shifted by one position. As a result, two different horizontal long lines (i.e., the second and the eighth horizontal long lines) are connected via a set of PIPs 1405 to high fanout hex lines 1403 in an adjacent top IOI circuit:. In this manner, each of the horizontal long lines is connected via a set of PIPs 1405 to high fanout hex lines 1403 in every sixth IOI circuit.

Additionally, bi-directional PIPs (designated by open circles) are provided at the east ends of selected hex lines 1403–1404 as illustrated. These bi-directional PIPs enable selected ones of hex lines 1403–1404 to be programmably connected to corresponding hex lines in an eastern adjacent IOI circuit. The bi-directional PIPs are located to provide a programmable connection between the end of one hex line and the beginning of another hex line. As a result, signals can traverse hex lines connected in series.

Top IOI circuit 13-T also includes a plurality of vertical line sets, including a set of twenty-four vertical single length lines 1406, eight sets of six unidirectional hex lines 1407, four sets of six bi-directional hex lines 1408 and one set of twelve vertical long lines 1409. These vertical line sets 1406–1409 are connected to corresponding line sets in tile 1-2. More specifically, the single length lines 1406 connect to single length lines N in FIG. 3. The unidirectional hex lines 1407 and the bi-directional hex lines 1408 connect to hex lines 6LN and 6RN in FIG. 3. Finally, the vertical long lines 1409 connect to vertical long lines LVN in FIG. 3.

The order of the twenty-four single length lines N in tile 1-2 is consistent with the order of the single length lines 1406 in top IOI circuit 13-T. However, the order of the seventy-two hex lines 6LN and 6RN in tile 1-2 is not consistent with the order of the hex lines 1407–1408 of top IOI circuit 13-T.

FIG. 15 is a circuit diagram illustrating the manner in which the hex lines 6LN and 6RN of tile 1-2 (FIG. 3) are coupled to the hex lines 1407–1408 of top IOI circuit 13-T (FIG. 14). As described above, the seventy-two hex lines 6LN and 6RN form six hex buses, with each hex bus having twelve hex lines. Of the twelve hex lines in each hex bus, eight hex lines are unidirectional and four hex lines are bi-directional. This is illustrated by the programmable bus connection 404 of FIG. 4, which includes eight unidirectional drivers and four bi-directional drivers for the hex bus that: includes the hex lines 6NL and 6NR. Note that the eight unidirectional drivers and four bi-directional drivers of programmable bus connection 404 are also used by the hex bus that includes the hex lines 6SL and 6SR.

Turning now to FIG. 3, it is noted that hex lines 6LN are grouped in six sets of hex lines. The four left-most sets of hex lines 6LN include unidirectional hex lines, and the two right-most sets of hex lines 6LN include bi-directional hex lines. Similarly, hex lines 6RN are grouped in six sets of hex lines. The four right-most sets of hex lines 6RN include unidirectional hex lines, and the two left-most sets of hex lines 6RN include bi-directional hex lines.

FIG. 15 indicates the manner in which the unidirectional and bi-directional hex lines of FIG. 3 are connected to the unidirectional and bi-directional hex lines of FIG. 14 in accordance with the described embodiment. It is understood that in other embodiments, the layout of the various elements in the tile of FIG. 3 and/or the IOI circuit 13-T can be modified such that there is no crossing of the interconnect traces as illustrated in FIG. 15. Each of the top IOI circuits 13-T is connected to a corresponding tile in the same manner. FIG. 15 illustrates that the bi-directional hex lines 1408 extend up into top IOI circuit 13-T. However, the ends of the various unidirectional hex lines 1407 are configured in a "U-turn" configuration.

Figure 16A:
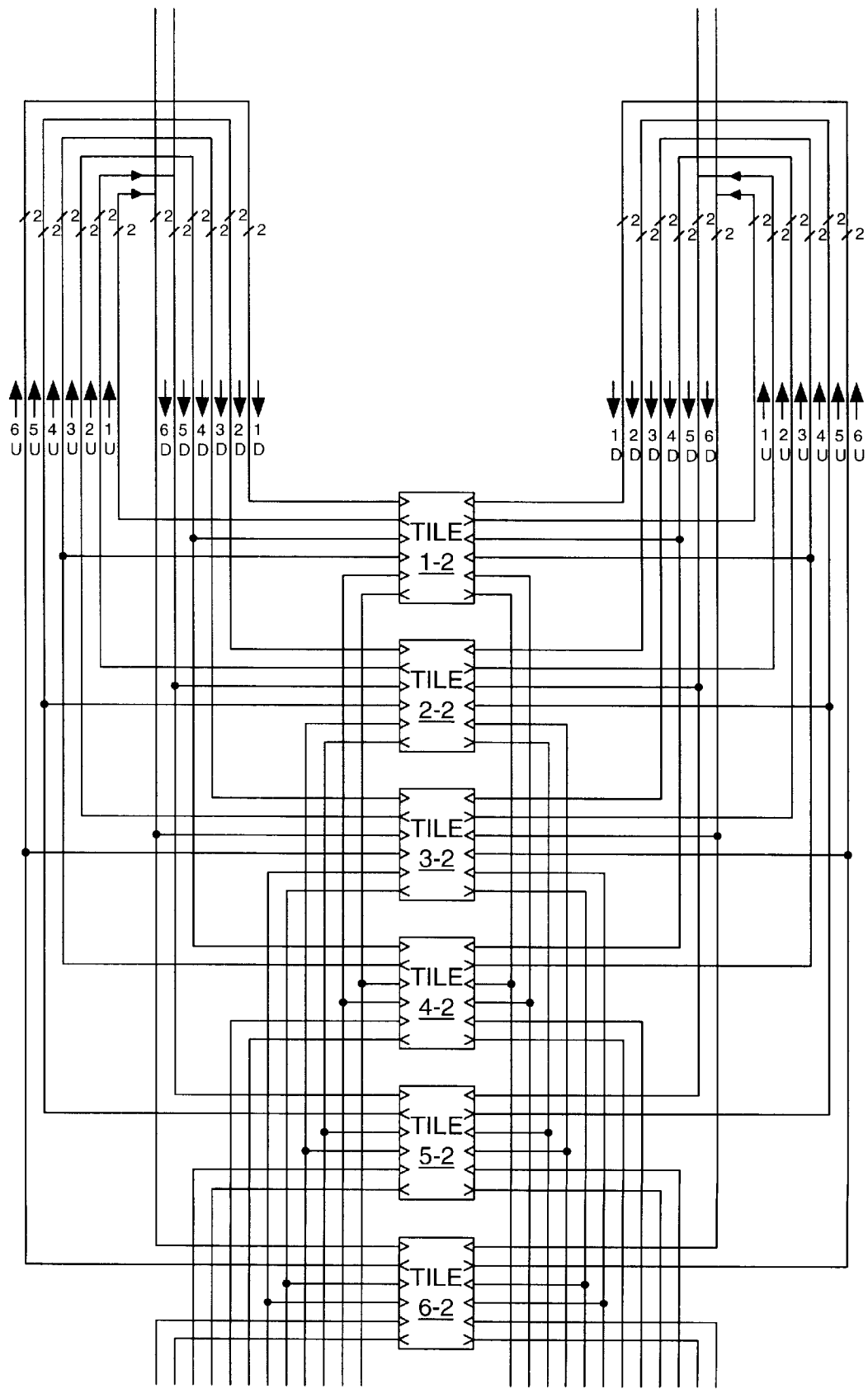
FIG. 16A is a circuit diagram illustrating a partial column of tiles, associated unidirectional vertical hex lines and interconnect circuitry for terminating these hex lines in the top IOI circuit of FIG. 14.

FIG. 16A is a circuit diagram illustrating the routing of the unidirectional hex lines 1407 from the first six tiles in a column. The bi-directional hex lines 1408 are not shown in FIG. 16A. The unidirectional hex lines 1407 are labeled in FIG. 16A in accordance with the following convention. HEX lines that carry signals in the upward direction are labeled with a number that corresponds to the row of the tile that originates the signals, followed by the suffix "U" (for upward). Thus, hex lines 1U, 2U, 3U, 4U, 5U and 6U originate in tiles 1-2, 2-2, 3-2, 4-2, 5-2 and 6-2, respectively, and carry signals in the upward direction. Similarly, hex lines that carry signals in the downward direction are labeled with a number that corresponds to the row of the tile that last receives the signals, followed by the suffix "D" (for downward). Thus, hex lines 1D, 2D, 3D, 4D, 5D and 6D terminate in tiles 1-2, 2-2, 3-2, 4-2, 5-2 and 6-2, respectively, and carry signals in the downward direction.

A first unidirectional hex bus is formed by hex lines 6U and 1D, which are coupled together using two U-turn configurations. Note that two lines of this first unidirectional hex bus are located to the left of the column of tiles, and two lines of this first unidirectional hex bus are located to the right of the column of tiles. This first unidirectional hex bus carries up to four signals from tile 6-2, to tile 3-2 and/or tile 1-2. Although the signals on this first unidirectional hex bus travel both upward and downward, the signal transfer is still unidirectional (i.e., from tile 6-2 to tile 3-2 to tile 1-2). Second, third, fourth, fifth and sixth unidirectional hex buses are formed by hex lines 5U/2D, 4U/3D, 1U/6D, 2U/5D, and 3U/4D, respectively. Note that unidirectional hex buses 1U/6D and 2U/5D include buffered PIPs 1601–1604 in IOI circuit 13-T. Buffered PIPs 1601–1604 can be enabled, thereby enabling hex lines 1U and 2U to drive signals onto hex lines 6D and 5D, respectively. Alternatively, buffered PIPs 1601–1604 can be disabled, thereby enabling other signals from top IOI circuit 13-T to drive signals onto hex lines 6D and 5D. The pattern of hex lines illustrated in FIGS. 15 and 16 efficiently terminates the pattern of unidirectional hex lines at the top edge of the array of tiles, thereby enabling each of the tiles to have the same pattern of conductors. Note that each of the tiles has the same pattern of input terminals and output terminals (as identified by the < and > arrows).

Figure 16B:
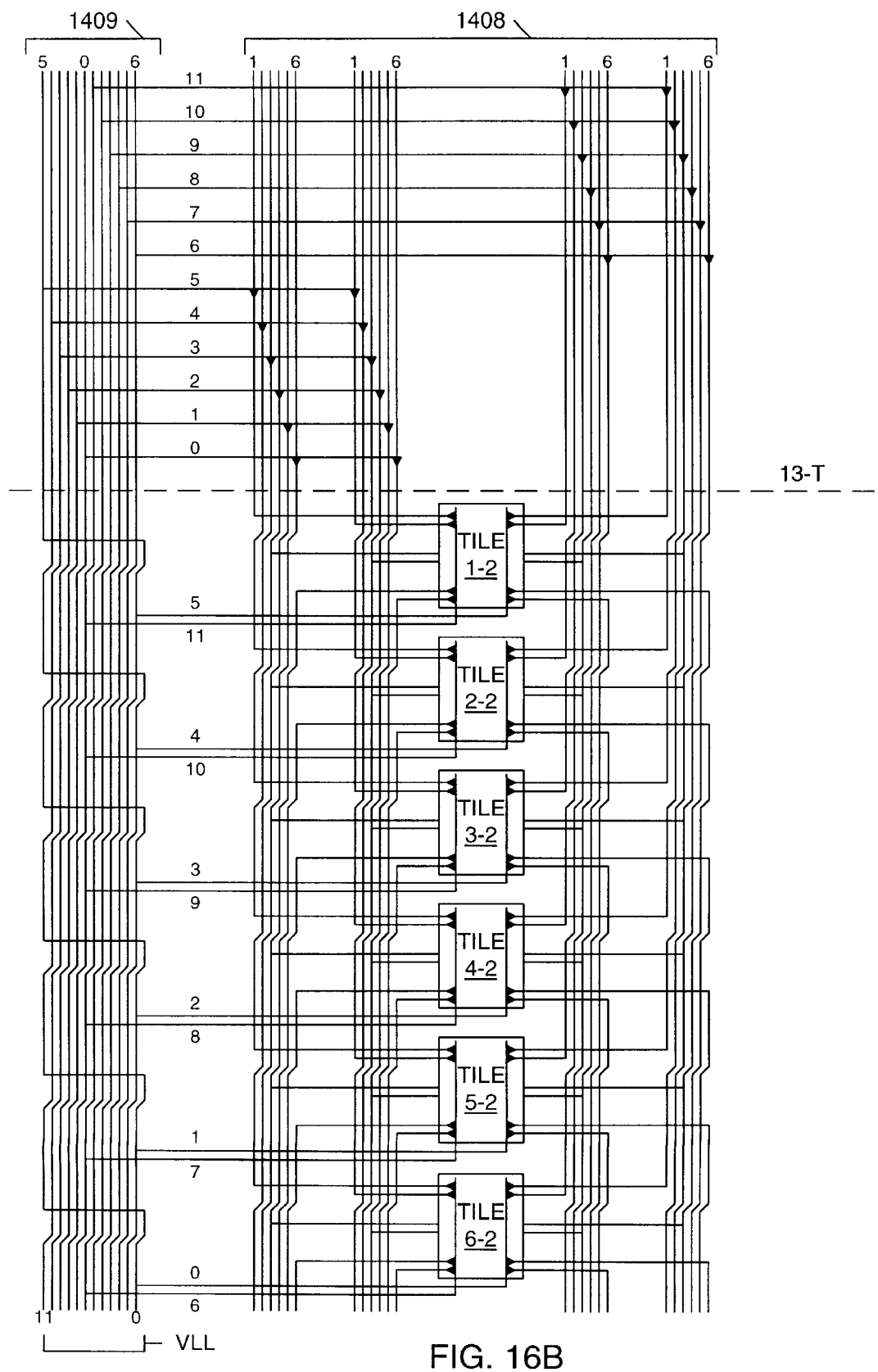
FIG. 16B is a circuit diagram illustrating a partial column of tiles, associated vertical long lines, associated bi-directional vertical hex lines, and interconnect circuitry for terminating these hex lines in the top IOI circuit of FIG. 14.

FIG. 16B is a circuit diagram illustrating the routing of the bi-directional hex lines 1408 from the first six tiles in a column. The unidirectional hex lines 1407 are not shown in FIG. 16B. Each tile is coupled to receive signals from two of the vertical long lines. The vertical long lines are labeled 0–11 in FIG. 16B. Table 1 defines the manner in which the twelve vertical long lines 0–11 are routed to the various tiles in the described embodiment.

TABLE 1

| VERTICAL LONG LINE | TILE |
| --- | --- |
| 0 | 6-2 (Right Side) |
| 1 | 5-2 (Right Side) |
| 2 | 4-2 (Right Side) |
| 3 | 3-2 (Right Side) |
| 4 | 2-2 (Right Side) |
| 5 | 1-2 (Right Side) |
| 6 | 6-2 (Left Side) |

TABLE 1-continued

| VERTICAL LONG LINE | TILE |
|---|---|
| 7 | 5-2 (Left Side) |
| 8 | 4-2 (Left Side) |
| 9 | 3-2 (Left Side) |
| 10 | 2-2 (Left Side) |
| 11 | 1-2 (Left Side) |

Within each tile, four PIPs are provided to couple each of the vertical long lines 0–11 to associated bi-directional hex lines. For example, four PIPs are provided in Tile 1-2 to couple vertical long line 11 to two lines of a hex bus that extends upward, and to two lines of a hex bus that extends downward. Note that a bi-directional hex bus is defined by four bi-directional hex lines. For example, one bi-directional hex bus is defined by the hex lines coupled to the four uppermost PIPs in Tile 6-2. Another bi-directional hex bus is defined by the hex lines coupled to the four lowermost PIPs in Tile 6-2.

As evidenced in Table 1, the vertical long lines are coupled to the tiles in a predetermined, regular pattern. Top IOI circuit 13-T provides a configuration that terminates this predetermined pattern in a manner consistent with the pattern. Within top IOI circuit 13-T, vertical long lines 1409 and vertical bi-directional hex lines 1408 are configured to provide the programmable connections listed in Table 2. Bi-directional hex lines 1408 include PIPs that provide the listed programmable connections. In short, top IOI circuit 13-T maintains the regular pattern of connections by providing the same interconnections between vertical long lines 1409 and vertical bi-directional hex lines 1408 as would be provided if the column of tiles continued for six more tiles.

TABLE 2

| VERTICAL LONG LINE | TILE |
|---|---|
| 0 | 6-2 (Left Side) |
| 1 | 5-2 (Left Side) |
| 2 | 4-2 (Left Side) |
| 3 | 3-2 (Left Side) |
| 4 | 2-2 (Left Side) |
| 5 | 1-2 (Left Side) |
| 6 | 6-2 (Right Side) |
| 7 | 5-2 (Right Side) |
| 8 | 4-2 (Right Side) |
| 9 | 3-2 (Right Side) |
| 10 | 2-2 (Right Side) |
| 11 | 1-2 (Right Side) |

The combined patterns of Table 1 and Table 2 are listed below in Table 3.

TABLE 3

| VERTICAL LONG LINE | TILE (LEFT SIDE) | TILE (RIGHT SIDE) |
|---|---|---|
| 0 | 6-2 (In 13-T) | 6-2 (In Array) |
| 1 | 5-2 (In 13-T) | 5-2 (In Array) |
| 2 | 4-2 (In 13-T) | 4-2 (In Array) |
| 3 | 3-2 (In 13-T) | 3-2 (In Array) |
| 4 | 2-2 (In 13-T) | 2-2 (In Array) |
| 5 | 1-2 (In 13-T) | 1-2 (In Array) |
| 6 | 6-2 (In Array) | 6-2 (In 13-T) |
| 7 | 5-2 (In Array) | 5-2 (In 13-T) |
| 8 | 4-2 (In Array) | 4-2 (In 13-T) |

TABLE 3-continued

| VERTICAL LONG LINE | TILE (LEFT SIDE) | TILE (RIGHT SIDE) |
|---|---|---|
| 9 | 3-2 (In Array) | 3-2 (In 13-T) |
| 10 | 2-2 (In Array) | 2-2 (In 13-T) |
| 11 | 1-2 (In Array) | 1-2 (In 13-T) |

Thus, Table 3 illustrates that the described interconnect pattern enables vertical long lines 0–11 to be coupled to the bi-directional hex buses in a repeatable, regular pattern that is successfully continued within the top IOI circuit 13-T.

Moreover, the pattern of vertical long lines 1409 and hex lines 1408 illustrated in FIG. 16B efficiently terminates the pattern of bi-directional hex lines and vertical long lines at the top edge of the array of tiles, thereby enabling each of the tiles to have the same pattern of conductors.

Returning now to FIG. 14, sets of lines extend vertically downward from IO blocks 1311–1314 and cross horizontal long lines 1402, high fanout hex lines 1403 and horizontal hex lines 1404. The sets of lines extending vertically downward from IO blocks 1311–1314 are labeled as line sets 1411–1414, respectively.

Line sets 1411–1414 are tapped as illustrated to form horizontal line sets 1415–1418. Horizontal line set 1415 is coupled to the input data terminals I and IQ of IO blocks 1311–1314. Horizontal line set 1416 is coupled to the T and O terminals of IO blocks 1311–1314. Horizontal line set 1417 is coupled to the TCE, ICE and OCE terminals of IO blocks 1311–1314. Horizontal line set 1418 is coupled to the CLK and SR terminals of IO blocks 1311–1314.

Figure 17:
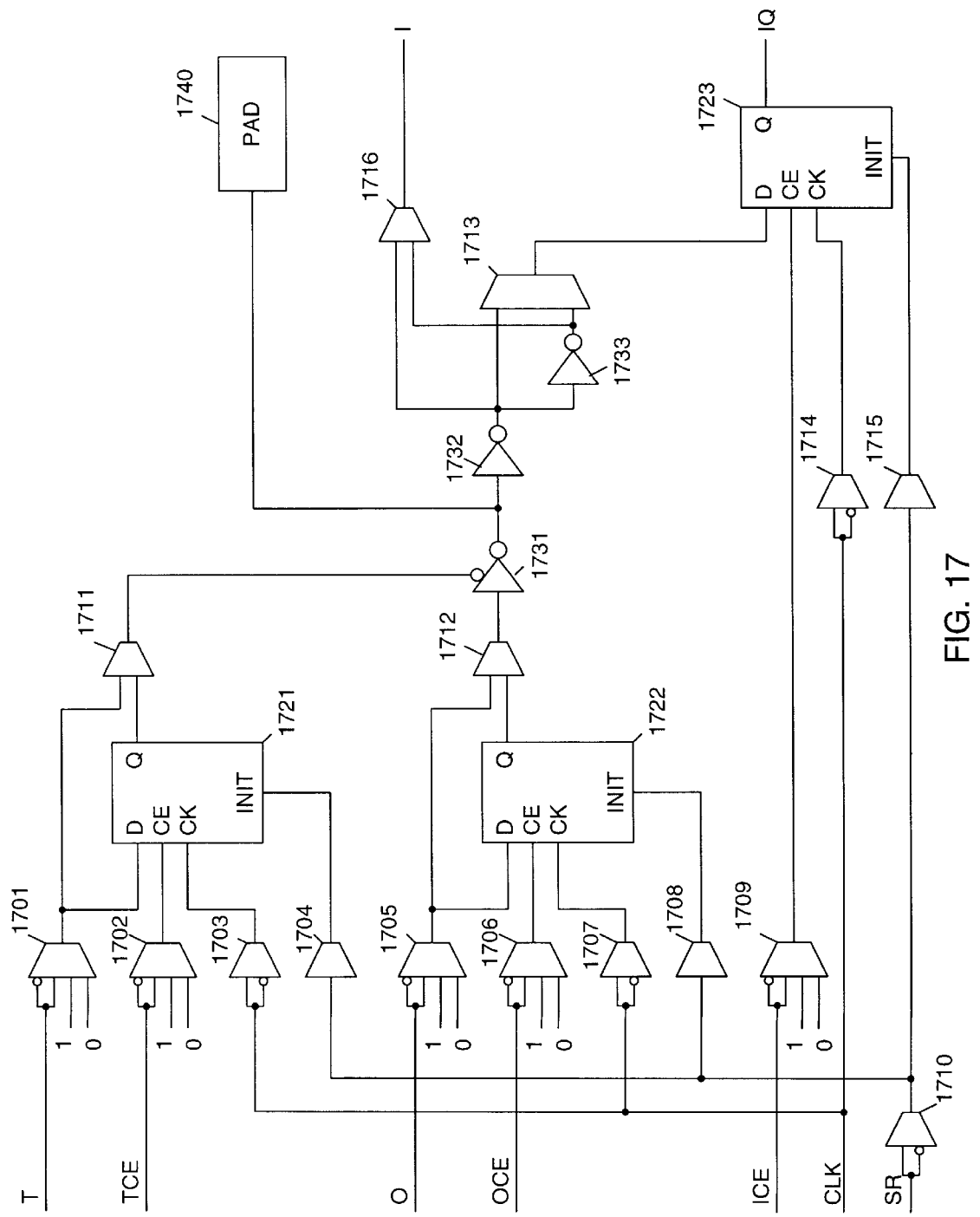
FIG. 17 is a schematic diagram of an IO block in accordance with one embodiment of the invention.

FIG. 17 is a schematic diagram of IO block 1311 in accordance with one embodiment of the invention. In the described embodiment, all of the IO blocks are identical to IO block 1311. IO block 1311 receives signals on the clock (CLK) terminal, the set/reset (SR) terminal, the tri-state data (T) terminal, the tri-state clock enable (TCE) terminal, the output (O) terminal, the output clock enable (OCE) terminal, and the input clock enable (ICE) terminal. IO block 1311 provides signals on the input data (I) terminal and the registered input data (IQ) terminal. IO block 1311 includes multiplexers 1701–1716, flip-flops 1721–1723, tri-state buffer 1731, inverter 1732, delay chain 1733 and IO pad 1740, which are connected as illustrated. The control terminals (not shown) of multiplexers 1701–1716 are coupled to configuration memory cells, which are programmed during the configuration of the FPGA. The contents of the configuration memory cells determine the manner in which multiplexers 1701–1716 route the various signals. In an output mode of operation, IO block 1311 can be controlled to provide asynchronous or synchronous output signals to pad 1740 in response to the O, OCE, CLK and SR signals. The output mode can optionally include tri-state operation under the control of the T, TCE, CLK and SR signals. In an input mode of operation, IO block 1311 can be controlled to provide asynchronous or synchronous input signals to the FPGA in response to signals on pad 1740 and the ICE, CLK, and SR signals. The manner of operating IO block 1311 would be apparent to one of ordinary skill in the art, particularly in view of such references as "The Programmable Logic Data Book" (1998), pp. 4-177 to 4-180, available from Xilinx, Inc., 2100 Logic Drive, San Jose, Calif. 95124, which is hereby incorporated by reference.

The various terminals of IO blocks 1311–1314 can be coupled to the various interconnect lines of IOI circuit 13-T as follows.

CLK Terminal

PIPs are provided to enable each of the clock (CLK) terminals of IO blocks 1311–1314 to be driven by:

(1) any one of the four global clock lines 1401;
(2) any one of four selected single length lines 1406;
(3) any one of six selected bi-directional hex lines 1408; or
(4) any one of six selected bi-directional horizontal hex lines 1404.

Set/Reset Terminal

PIPs are also provided to enable each of the set/reset (SR) terminals of IO blocks 1311–1314 to be driven by:

(1) any one of four selected single length lines 1406;
(2) any one of six selected bi-directional hex lines 1408; or
(3) any one of six selected bi-directional horizontal hex lines 1404.

Tri-State Terminal

PIPs are provided to enable each of the tri-state (T) terminals of IO blocks 1311–1314 to be driven by:

(1) any one of four selected single length lines 1406;
(2) any one of six selected bi-directional hex lines 1408; or
(3) any one of six selected bi-directional horizontal hex lines 1404.

Tri-State Clock Enable Terminal

PIPs are provided to enable each of the tri-state clock enable (TCE) terminals of IO blocks 1311–1314 to be driven by:

(1) any one of four selected single length lines 1406;
(2) any one of six selected bi-directional hex lines 1408;
(3) any one of six selected bi-directional horizontal hex lines 1404.

Output Terminal

PIPs are provided to enable each of the output (O) terminals of IO blocks 1311–1314 to be driven by:

(1) any one of twelve selected single length lines 1406; or
(2) any one of four selected bi-directional hex lines 1408.

Output Clock Enable Terminal

PIPs are provided to enable each of the output clock enable (OCE) terminals of IO blocks 1311–1314 to be driven by:

(1) any one of four selected single length lines 1406;
(2) any one of six selected bi-directional hex lines 1408; or
(3) any one of six selected bi-directional horizontal hex lines 1404.

Input Clock Enable Terminal

PIPs are provided to enable each of the input clock enable (ICE) terminals of IO blocks 1311–1314 to be driven by:

(1) any one of four selected single length lines 1406;
(2) any one of six selected bi-directional hex lines 1408; or
(3) any one of six selected bi-directional horizontal hex lines 1404.

Input Terminals

PIPs are provided to enable each of the input (I, IQ) terminals of IO blocks 1311–1314 to drive:

(1) any one of three selected single length lines 1406;
(2) any one of two selected unidirectional hex lines 1407;
(3) any one of eight (or nine) selected bi-directional hex lines 1408;
(4) any one of two (or one) selected vertical long lines 1409;
(5) any one of two horizontal long lines 1402;
(6) any one of four selected high fanout hex lines 1403; or
(7) any one of eight selected bi-directional horizontal hex lines 1404.

Additional Programmable Connections

The following additional sets of PIPs are provided in top IOI circuit 13-T:

(1) PIPs that enable eight selected single length lines 1406 to drive one of two selected horizontal long lines 1402;
(2) PIPs that enable four selected single length lines to drive one of four selected high fanout hex lines 1403;
(3) PIPs that enable twelve selected horizontal hex lines 1404 to drive one of two selected single length lines 1406;
(4) PIPs that enable two selected horizontal long lines 1402 to each drive up to two selected high fanout hex lines 1403 and up to four horizontal hex lines 1404;
(5) PIPs that enable twelve horizontal hex lines 1404 to drive one of two selected unidirectional hex lines 1407;
(6) PIPs that enable twelve selected high fanout hex lines 1403 to drive a corresponding vertical long line 1409;
(7) PIPs that enable each of the twelve vertical long lines 1409 to drive one of two selected bi-directional hex lines 1408;
(8) PIPs that enable eight selected horizontal hex lines 1404 to be coupled to a corresponding bi-directional hex line 1408 in a bi-directional manner;
(9) PIPs that enable four selected horizontal hex lines 1404 to drive a corresponding bi-directional hex line 1408 in a unidirectional manner; and
(10) PIPs that enable four selected bi-directional hex lines 1408 to drive eight selected horizontal hex lines 1404 in a unidirectional manner.

The above-described PIPs enable a wide variety of programmable connections between IO blocks 1311–1314 and tile 1-2. The above-described PIPs also enable a wide variety of connections between adjacent IOI circuits 13-T (as well as top left IOI circuit 13-TL and top right IOI circuit 13-TR).

Several of the more significant programmable connections are now discussed. As described above, the unidirectional hex lines are effectively re-routed in a U-turn configuration, thereby maintaining the regular configuration of the tiles at the top edge of the array.

As also described above, the programmable connections between the vertical long lines 1409 and the bi-directional hex lines 1408 advantageously provides a boundary termination between the bi-directional hex lines and the vertical long lines.

The programmable connections allowing the high fanout hex lines 1403 to be connected to the vertical long lines 1409 advantageously reduces loading on the horizontal long lines 1402, which would otherwise be required to be coupled to the vertical long lines.

The high fanout hex lines 1403 advantageously provide a low-skew, high fanout structure that can be used to carry global signals (in addition to the four global clock signals carried on the global clock lines 1401). These signals can be clocks or other high fanout signals. Distribution can proceed from an IO block to a horizontal long line to a high fanout hex line to a vertical long line. The signal can then be distributed from the vertical long line to the CLEs using the various distribution networks described above. Other global signals, such as a set/reset (SR) control signal, can be transmitted to all IO blocks in the same manner.

Figure 18:
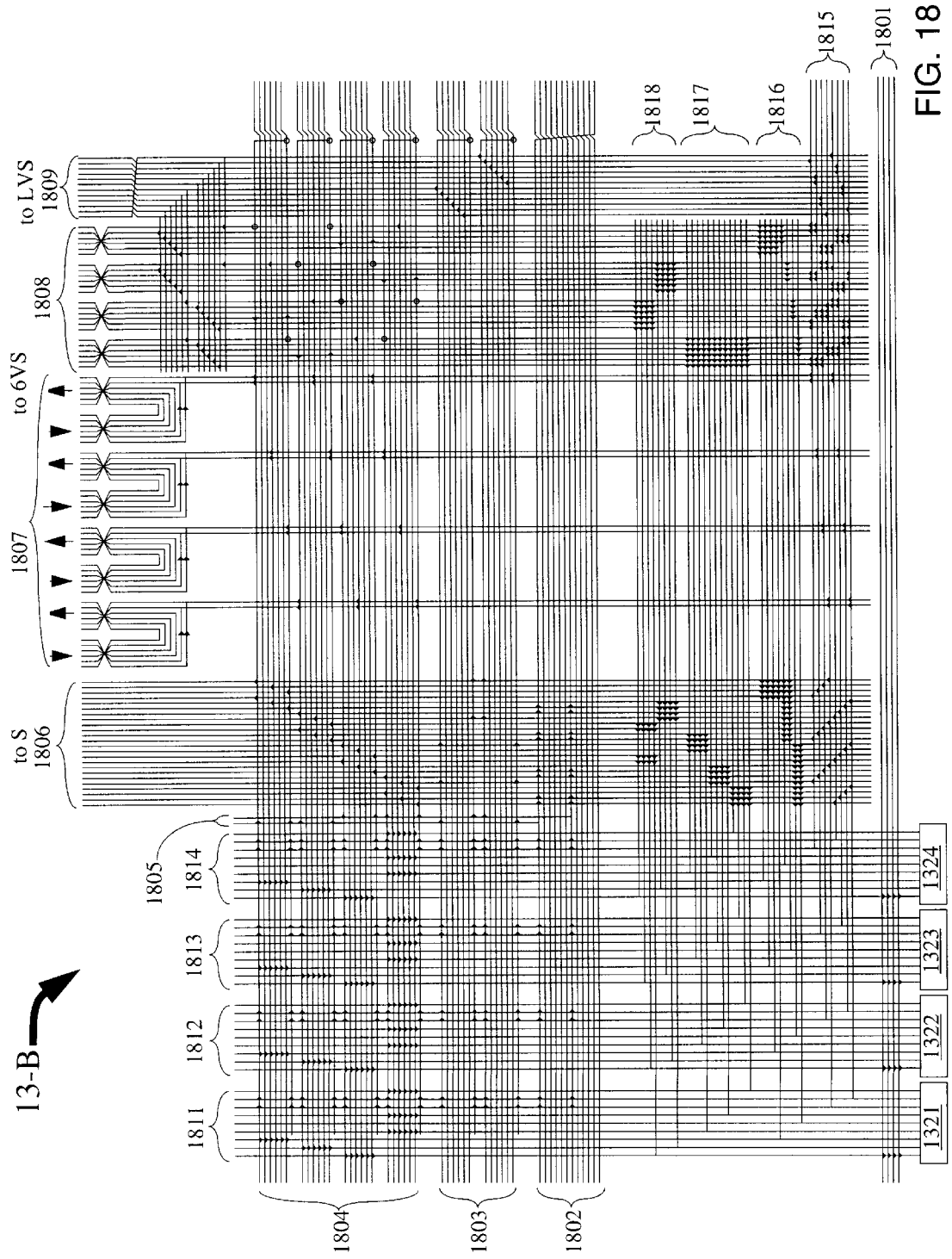
FIG. 18 is a schematic diagram of a bottom IOI circuit and corresponding IO blocks in accordance with one embodiment of the present invention.

FIG. 18 is a schematic diagram of IOI circuit 13-B and IO blocks 1321–1324 in accordance with one embodiment of the present invention. Bottom IOI circuit 13-B provides programmable connections between IO blocks 1321–1324 and the rest of FPGA 1300 in a manner similar to top IOI circuit 13-T. Bottom IOI circuit 13-B is virtually a mirror image of top IOI circuit 13-T, with the exception of the PIP pattern between vertical long lines 1809 and vertical bi-directional hex lines 1808. This PIP pattern is different in bottom IOI circuit 13-B to provide proper termination of the vertical long lines to the bi-directional hex lines (See, e.g., FIG. 16B). Because of the similarities between IOI circuits 13-B and 13-T, these IOI circuits 13-B and 13-T share similar routing resources. More specifically, IOI circuit 13-B includes a set of four global clock lines 1801, a set of twelve horizontal long lines 1802, two sets of six high-fanout hex lines 1803, and four sets of six horizontal hex lines 1804. These sets of lines 1801–1804 extend horizontally across bottom IOI circuit 13-B, and are connected to corresponding sets of lines in an adjacent bottom IOI circuit 13-B (or in bottom left IOI circuit 13-BL or bottom right IOI circuit 13-BR). These sets of lines 1801–1804 operate in the same manner as sets of lines 1401–1404 (FIG. 14).

Bottom IOI circuit 13-B also includes a set of PIPs 1805 that are coupled to the first and seventh horizontal long lines 1802. This set of PIPs 1805 is connected in the same manner as the set of PIPs 1405 (FIG. 14).

Bottom IOI circuit 13-B also includes a plurality of vertical line sets, including a set 1806 of twenty-four vertical single length lines, eight sets 1807 of six unidirectional hex lines, four sets 1808 of six bi-directional hex lines and one set 1809 of twelve vertical long lines. These vertical line sets 1806–1809 are connected to corresponding line sets in tile N-2 in the same manner that vertical line sets 1406–1409 are connected to corresponding line sets in tile 1-2 (FIGS. 14–16). Note that unidirectional and bi-directional hex lines are shifted in IOI tile 13-B, thereby providing the appropriate orientation of these hex lines within IOI tile 13-B. (Note that because IOI tile 13-B is the mirror image of IOI tile 13-T, the unidirectional and bi-directional hex lines 1807 and 1808 must be shifted to properly terminate the vertical lines from the corresponding tile.)

Bottom IOI circuit 13-B also includes sets of lines that extend vertically upward from IO blocks 1321–1324 and cross horizontal long lines 1802, high fanout hex lines 1803 and horizontal hex lines 1804. The sets of lines extending vertically upward from IO blocks 1321–1324 are labeled as line sets 1811–1814, respectively. Line sets 1811–1814 are tapped as illustrated to form horizontal line sets 1815–1818. Line sets 1811–1818 are connected in the same manner as line sets 1411–1418 (FIG. 14).

Bottom IOI circuit 13-B provides the same benefits described above for top IOI circuit 13-T.

Figure 19:
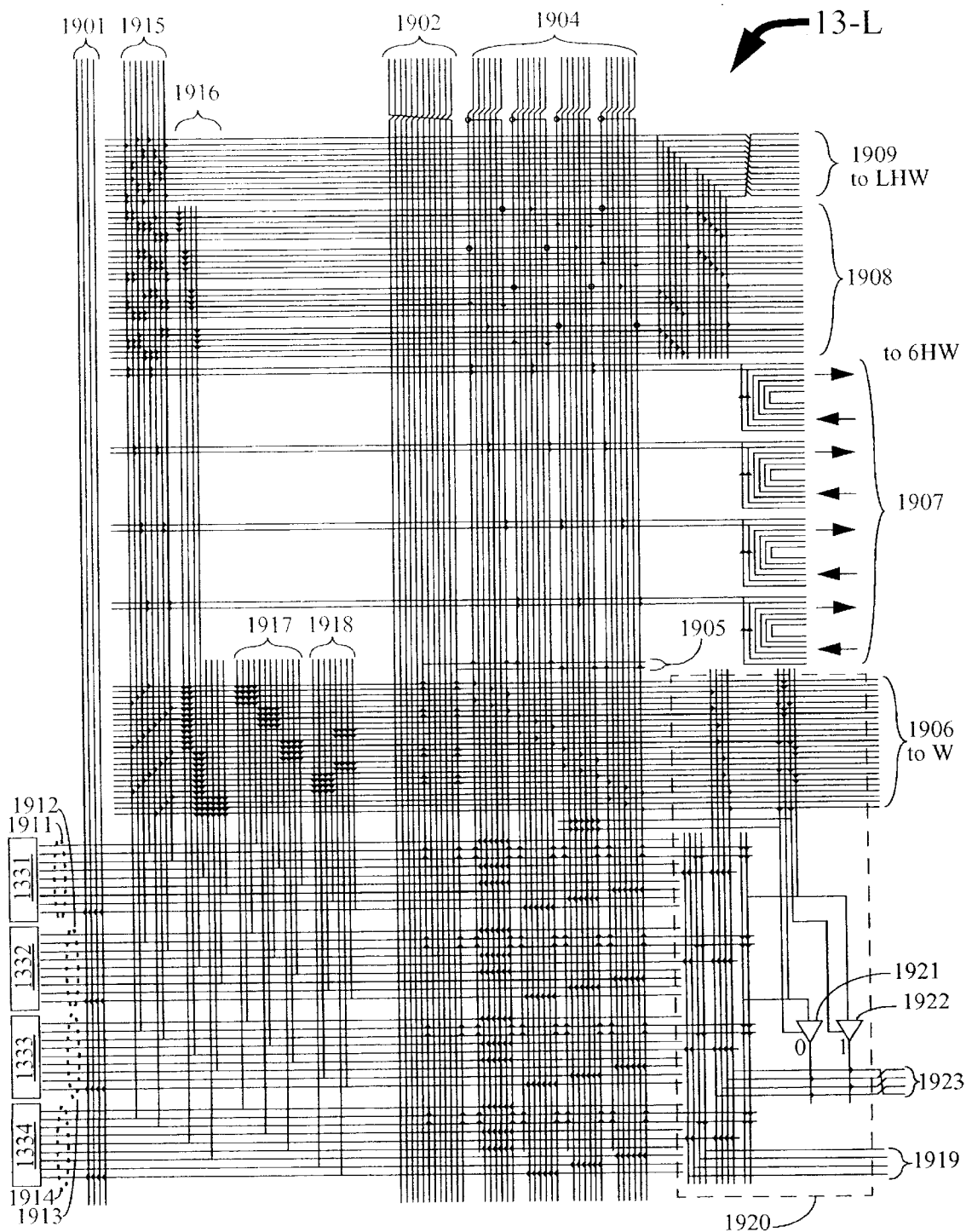
FIG. 19 is a schematic diagram of a left IOI circuit and corresponding IO blocks in accordance with one embodiment of the present invention.

FIG. 19 is a schematic diagram of left IOI circuit 13-L and four associated IO blocks 1331–1334 in accordance with one embodiment of the present invention. Left IOI circuit 13-L provides programmable connections between IO blocks 1331–1334 and the rest of FPGA 1300 in a manner similar to top and bottom IOI circuits 13-T and 13-B. Left IOI circuit 13-L is similar to top IOI circuit 13-T. Left IOI circuit 13-L roughly corresponds to top IOI circuit 13-T, rotated counter-clockwise by ninety degrees. The routing resources of left IOI circuit 13-L are similar to the routing resources of top IOI circuit 13-T. More specifically, left IOI circuit 13-L includes a set of four global clock lines 1901, a set of twelve vertical long lines 1902 (VLL), and four sets of six vertical hex lines 1904. Line sets 1901–1902 and 1904 roughly correspond with line sets 1401–1402 and 1404, respectively, of top IOI circuit 13-T. In the described embodiment, left IOI circuit 13-L does not include a set of high fanout hex lines (corresponding to high fanout hex lines 1403 in top IOI circuit 13-T). However, in another embodiment, such high fanout hex lines can be included. Line sets 1901, 1902 and 1904 extend vertically through left IOI circuit 13-L, and are connected to corresponding sets of lines in an adjacent left IOI circuit 13-L (or in top left IOI circuit 13-TL or bottom left IOI circuit 13-BL). Line sets 1901, 1902 and 1904 provide similar connections to those provided by line sets 1401, 1402 and 1404 (FIG. 14).

Left IOI circuit 13-L also includes a set of PIPs 1905 that are coupled to the first and seventh vertical long lines 1902 and extend rightward to the vertical hex lines 1904. This set of PIPs 1905 is similar to the set of PIPs 1405 (FIG. 14).

Left IOI circuit 13-L also includes a plurality of horizontal line sets, including a set 1906 of twenty-four horizontal single length lines, eight sets 1907 of six unidirectional hex lines, four sets 1908 of six bi-directional hex lines and one set 1909 of twelve horizontal long lines. Horizontal line sets 1906–1909 roughly correspond to line sets 1406–1409, respectively, of top IOI circuit 13-T. Horizontal line sets 1906–1909 are connected to corresponding line sets in tile 2-1 as follows. Single length lines 1906 are connected to single length lines W (FIG. 3) in tile 2-1. Unidirectional hex lines 1907 and bi-directional hex lines 1908 are connected to hex lines 6HW (FIG. 3) in tile 2-1. These hex lines are connected using a routing structure similar to the routing structure illustrated in FIGS. 15–16. Finally, horizontal long lines 1909 are connected to horizontal long lines LHW (FIG. 3) of tile 2-1.

Left IOI circuit 13-L also includes a set of four data lines 1919. Two of these data lines can be programmably connected to the input (I) terminals of IO blocks 1331–1334. These data lines are connected to lines DIW (FIG. 3) in tile 2-1. The other two data lines can be programmably connected to the output (O) terminals of IO blocks 1331–1334. These data lines are connected to lines DOW (FIG. 3) in tile 2-1.

Left IOI circuit 13-L also includes sets of lines that extend horizontally from IO blocks 1331–1334 and cross vertical long lines 1902 and vertical hex lines 1904. The sets of lines extending horizontally from IO blocks 1331–1334 are labeled as line sets 1911–1914, respectively. Line sets 1911–1914 are tapped as illustrated to form vertical line sets 1915–1918. Line sets 1911–1918 are connected in a manner similar to line sets 1411–1418 (FIG. 14).

Left IOI circuit 13-L further includes programmable interconnect circuitry 1920 for a tri-state bus (See FIGS. 3 and 7). Interconnect circuitry 1920 includes a pair of tri-state buffers 1921 and 1922 and a set of four tri-state bus lines 1923. The control terminals of tri-state buffers 1921 and 1922 are coupled to PIPs that provide connections to selected ones of horizontal single length lines 1906 and vertical hex lines 1904. The input terminals of tri-state buffers 1921 and 1922 are coupled to lines that can be driven by the I or IQ terminals of IO blocks 1331–1334 or selected ones of horizontal single length lines 1906 (as illustrated). The output terminals of tri-state buffers 1921 and 1922 are coupled to the tri-state bus lines 1923. These tri-state bus lines 1923 are coupled to tri-state bus TW (FIG. 3) of tile 2-1. The tri-state bus lines 1923 are also coupled to PIPs that provide programmable connections to the output (O) terminals of IO blocks 1331–1334 and to selected ones of the horizontal single length lines 1906.

Left IOI circuit 13-L advantageously enables IO blocks 1331–1334 to be coupled to tile 2-1 in an efficient and regular manner. Note that horizontal unidirectional hex lines 1907 terminate in the manner described above in connection with FIGS. 15 and 16A. Similarly, horizontal long lines 1909 and horizontal bi-directional hex lines 1908 have a termination pattern similar to that described above in connection with FIG. 16B.

Figure 20:
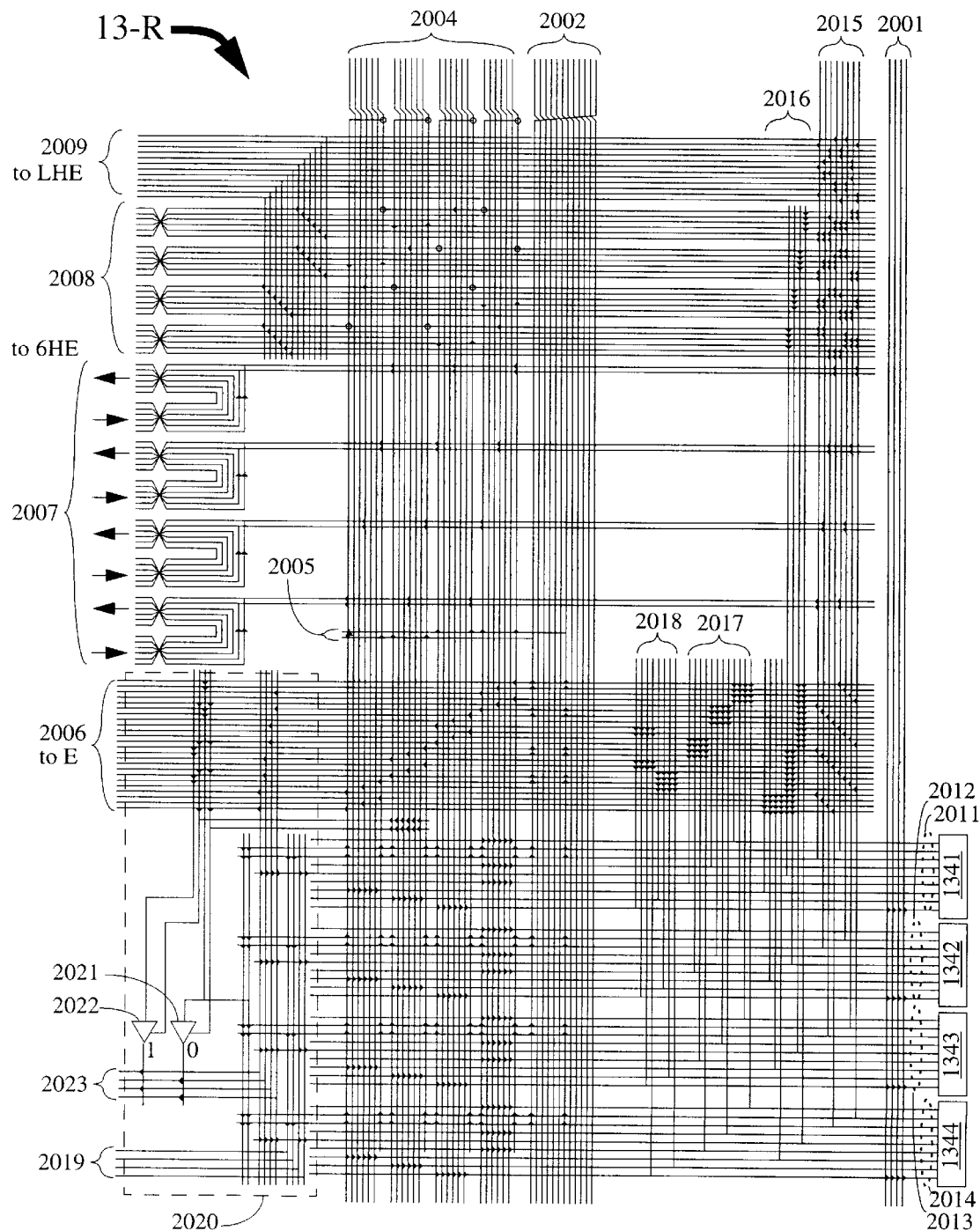
FIG. 20 is a schematic diagram of a right IOI circuit and corresponding IO blocks in accordance with one embodiment of the present invention.

FIG. 20 is a schematic diagram of right IOI circuit 13-R and four associated IO blocks 1341–1344 in accordance with one embodiment of the present invention. Right IOI circuit 13-R is virtually a mirror image of left IOI circuit 13-L (FIG. 19). Right IOI circuit 13-R therefore includes global clock bus 2001, vertical long lines 2002, vertical hex lines 2004, a set of PIPs 2005, horizontal single length lines 2006, unidirectional hex lines 2007 and bi-directional hex lines 2008, horizontal long lines 2009, line sets 2011–2018, data lines 2019, and programmable interconnect circuitry 2020 including tri-state buffers 2021–2022 and tri-state bus lines 2023. Unidirectional hex lines 2007 and bi-directional hex lines 2008 are shifted in right IOI circuit 13-R, thereby providing the proper termination for the corresponding hex lines. The PIP pattern coupling horizontal long lines 2009 and bi-directional hex lines 2008 is also modified to provide the termination pattern described above in connection with FIG. 16B.

Figure 21:
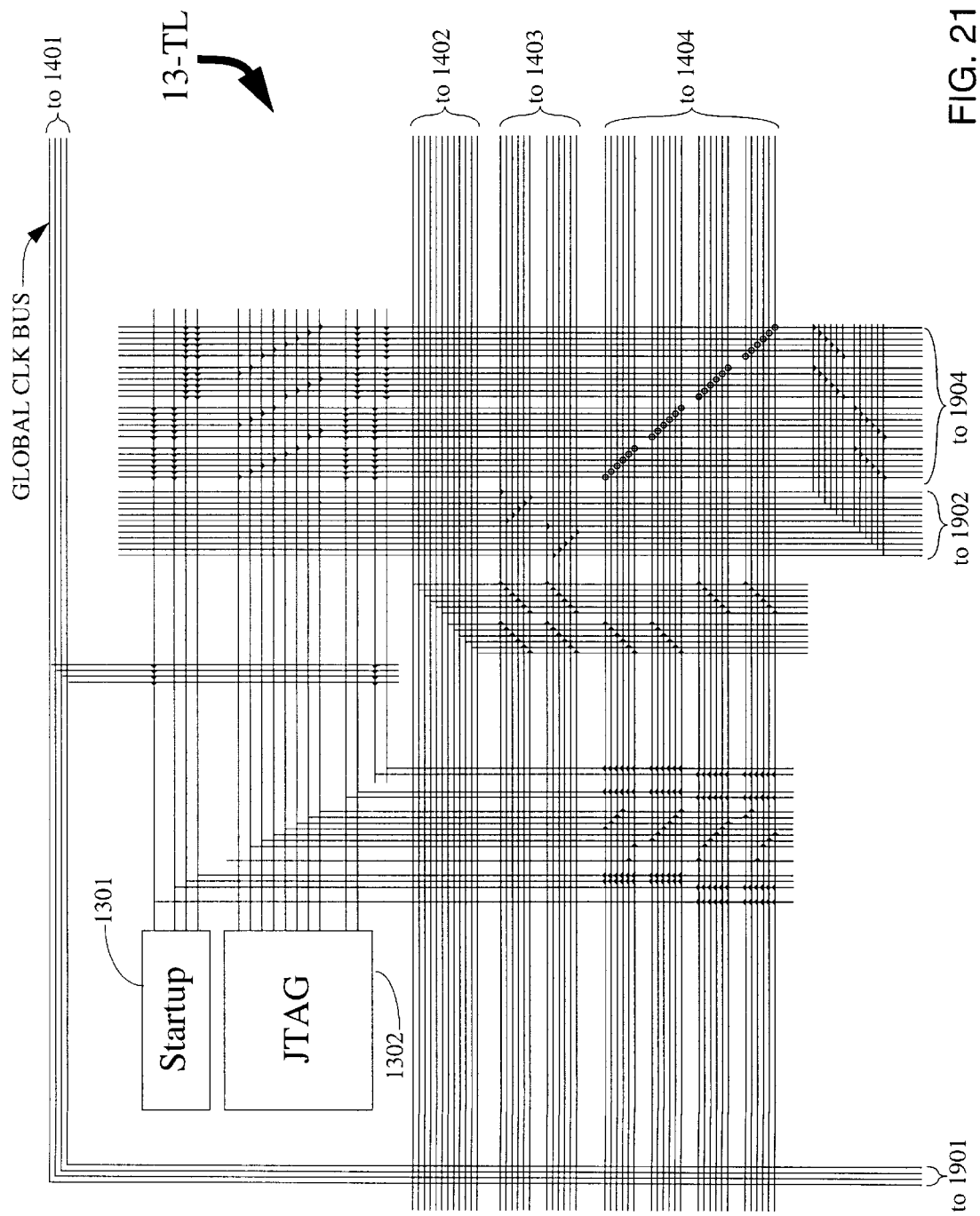
FIG. 21 is a schematic diagram of a top-left IOI circuit in accordance with one embodiment of the present invention.

FIG. 21 is a schematic diagram of top left IOI circuit 13-TL in accordance with one embodiment of the present invention. IOI circuit 13-TL includes a global clock bus that is coupled to global clock bus 1401 in a corresponding top IOI circuit 13-T and to global clock bus 1901 in a corresponding left IOI circuit 13-L. Top-left IOI circuit 13-TL further includes horizontal long lines that are coupled to horizontal long lines 1402 in a corresponding top IOI circuit 13-T (FIG. 14), horizontal high fanout hex lines that are coupled to horizontal high fanout hex lines 1403 in a corresponding top IOI circuit 13-T, and horizontal hex lines that are coupled to horizontal hex lines 1404 in a corresponding top IOI circuit 13-T.

Top-left IOI circuit 13-TL further includes vertical long lines that are coupled to vertical long lines 1902 in a corresponding left IOI circuit 13-L (FIG. 14), vertical hex lines that are coupled to vertical hex lines 1904 in a corresponding left IOI circuit 13-L.

Bi-directional PIPs are provided as illustrated to enable the horizontal hex lines 1404 to be coupled to the vertical hex lines 1904. PIPs are also provided as illustrated to enable high fanout hex lines 1403 to be coupled to the vertical long lines 1902.

PIPs are also provided as illustrated to enable the vertical long lines 1902 to be coupled to the vertical hex lines 1904. These PIPs provide a termination pattern that is similar to the termination pattern described above in connection with FIG. 16B.

PIPs are also provided to enable horizontal long lines 1402 to be coupled to high fanout hex lines 1403 and to horizontal hex lines 1404. These PIPs provide a termination pattern that is similar to the termination pattern described above in connection with FIG. 16B.

Programmable connections are provided as illustrated for coupling startup circuit 1301 and JTAG circuit 1302 to vertical hex lines 1904 and horizontal hex lines 1404.

Figure 22:
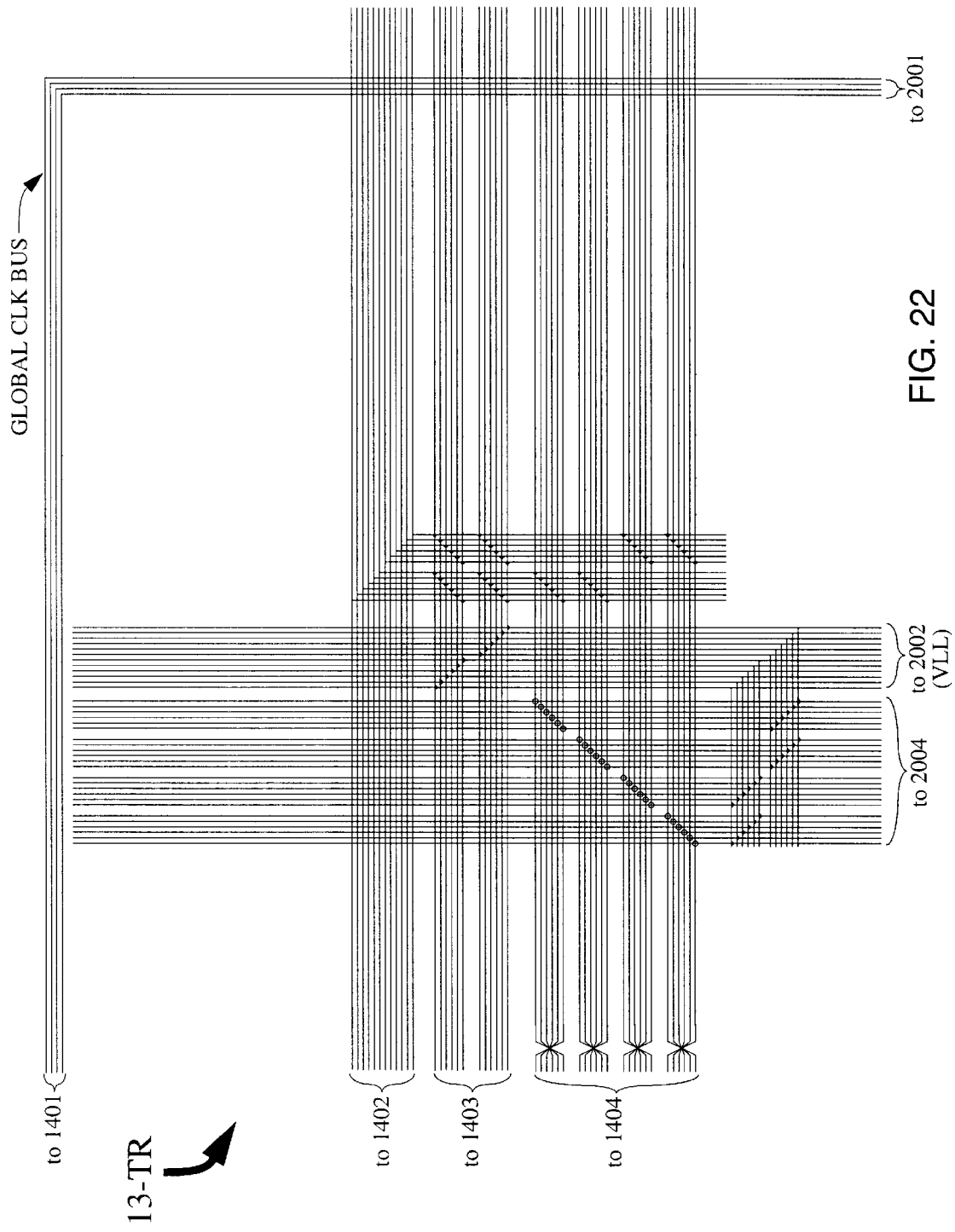
FIG. 22 is a schematic diagram of a top-right IOI circuit in accordance with one embodiment of the present invention.

FIG. 22 is a schematic diagram of top right IOI circuit 13-TR in accordance with one embodiment of the present invention. Top right IOI circuit 13-TR is virtually a mirror image of top left IOI circuit 13-TL (FIG. 21) along the north-south axis. Note that top-right IOI circuit 13-TR does not include startup circuit 1301 and JTAG circuit 1302 or the interconnect circuitry associated with these circuits.

Top-right IOI circuit 13-TR includes a global clock bus (coupled to global clock buses 1401 and 2001), horizontal long lines (coupled to horizontal long lines 1402), horizontal high fanout hex lines (coupled to horizontal high fanout hex lines 1403), and horizontal hex lines (coupled to horizontal hex lines 1404). These horizontal lines are coupled to corresponding lines in an adjacent top IOI circuit 13-T (FIG. 14). Note that the hex lines 1403 and 1404 are shifted in top right IOI circuit 13-TR. Also note that the PIP patterns coupling horizontal long lines 1402 to horizontal hex lines 1403 and 1404 provide the termination pattern described above for FIG. 16B.

Top-right IOI circuit 13-TR further includes vertical long lines (coupled to vertical long lines 2002) and vertical hex lines (coupled to vertical hex lines 2004), which are coupled to corresponding lines in an adjacent right IOI circuit 13-R (FIG. 20). Note that the PIP patterns coupling vertical long lines 2002 to vertical hex lines provide the termination pattern described above for FIG. 16B.

Figure 23:
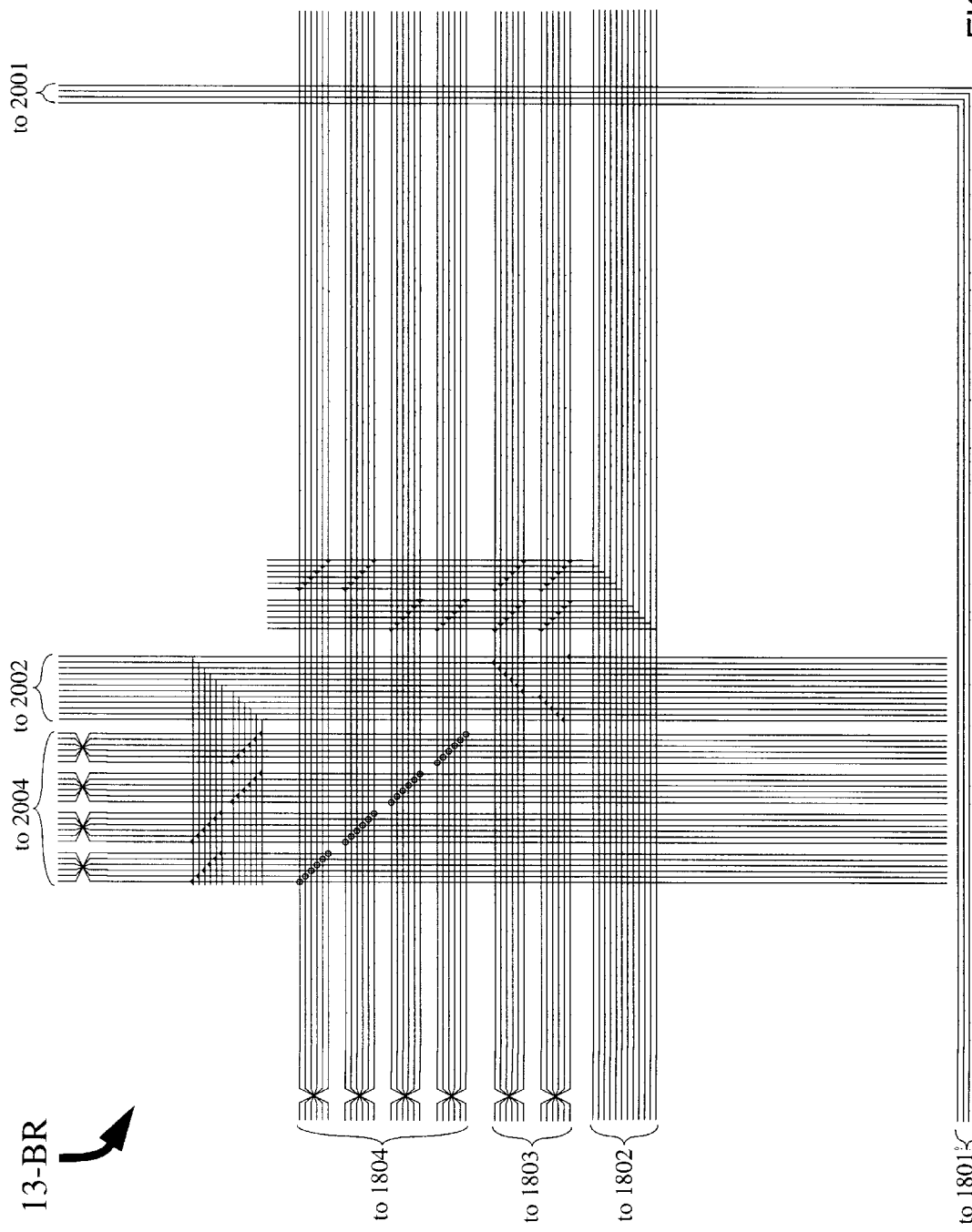
FIG. 23 is a schematic diagram of a bottom-right IOI circuit in accordance with one embodiment of the present invention.

FIG. 23 is a schematic diagram of bottom right IOI circuit 13-BR in accordance with one embodiment of the present invention. Bottom right IOI circuit 13-BR is virtually a mirror image of top right IOI circuit 13-TR (FIG. 22) along the east-west axis.

Bottom-right IOI circuit 13-BR includes a global clock bus (coupled to global clock buses 1801 and 2001), horizontal long lines (coupled to horizontal long lines 1802), horizontal high fanout hex lines (coupled to horizontal high fanout hex lines 1803), and horizontal hex lines (coupled to horizontal hex lines 1804). These horizontal lines are coupled to corresponding lines in an adjacent bottom IOI circuit 13-B (FIG. 18).

Bottom-right IOI circuit 13-BR further includes vertical long lines (coupled to vertical long lines 2002) and vertical hex lines (coupled to vertical hex lines 2004). These vertical lines are coupled to corresponding lines in an adjacent right IOI circuit 13-R (FIG. 20). Vertical hex lines 2004 are shifted in bottom right IOI circuit 13-BR. Horizontal hex lines 1803 and 1804 are also shifted in bottom right IOI circuit 13-BR. The PIP patterns coupling vertical long lines 2002 to vertical hex lines 2004 are configured to provide the termination pattern described above for FIG. 16B. Similarly, the PIP patterns coupling the horizontal long lines 1802 to the horizontal hex lines 1803–1804 provide the termination pattern described above for FIG. 16B.

Figure 24:
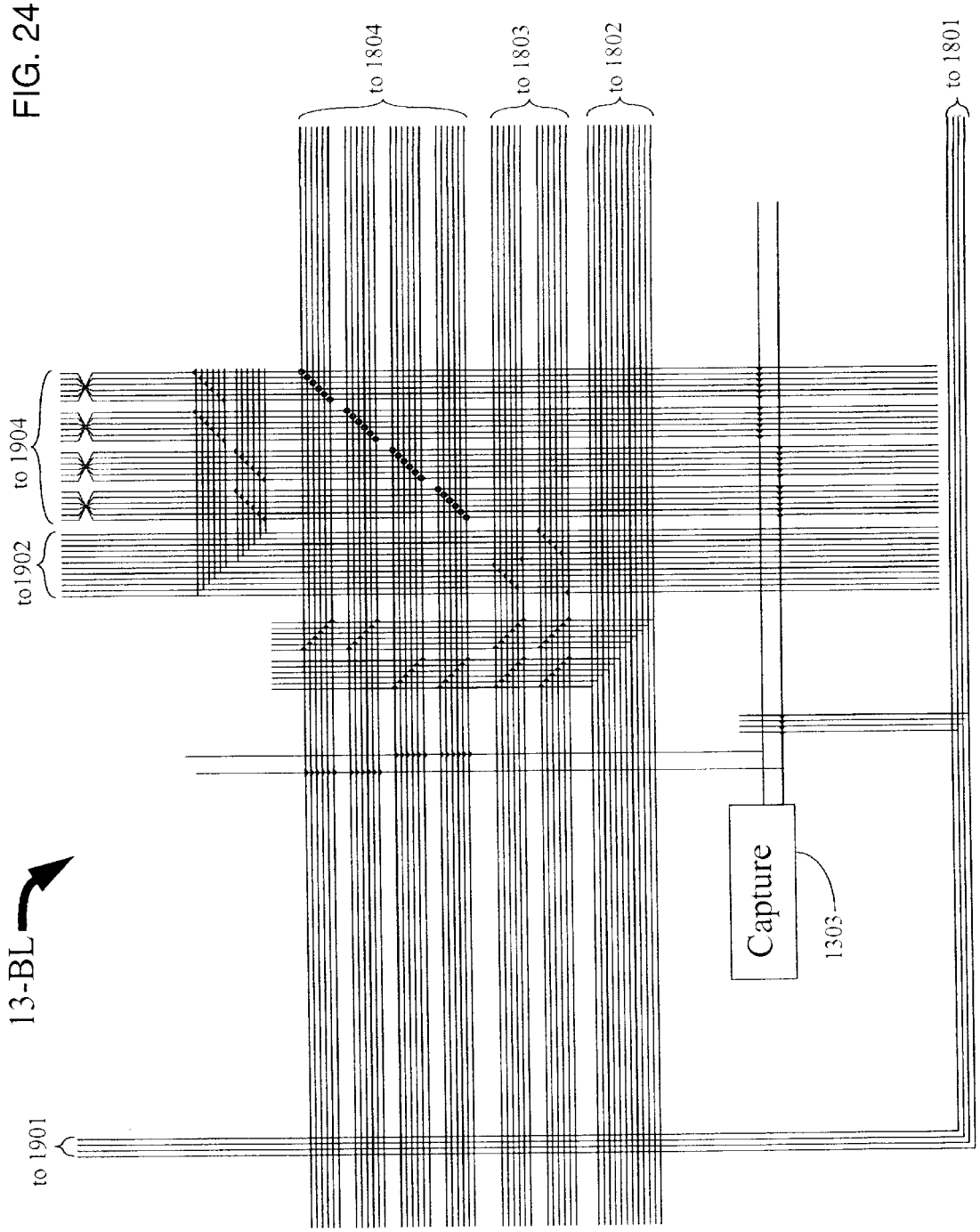
FIG. 24 is a schematic diagram of a bottom-left IOI circuit in accordance with one embodiment of the present invention.

FIG. 24 is a schematic diagram of bottom left IOI circuit 13-BL in accordance with one embodiment of the present invention. Bottom left IOI circuit 13-BL is virtually a mirror image of bottom right IOI circuit 13-BR (FIG. 23) along the north-south axis.

Bottom-left IOI circuit 13-BL includes a global clock bus (coupled to global clock buses 1801 and 1901), horizontal long lines (coupled to horizontal long lines 1802), horizontal high fanout hex lines (coupled to horizontal high fanout hex lines 1803), and horizontal hex lines (coupled to horizontal hex lines 1804). These horizontal lines are coupled to corresponding lines in an adjacent bottom IOI circuit 13-B (FIG. 18).

Bottom-left IOI circuit 13-BL further includes vertical long lines (coupled to vertical long lines 1902) and vertical hex lines (coupled to vertical hex lines 1904). These vertical lines are coupled to corresponding lines in an adjacent left IOI circuit 13-L (FIG. 19). Vertical hex lines 1904 are shifted in bottom left IOI circuit 13-BL. The PIP patterns coupling vertical long lines 1902 to vertical hex lines 1904 are configured to provide the termination pattern described above for FIG. 16B. Similarly, the PIP patterns coupling the horizontal long lines 1802 to the horizontal hex lines 1803–1804 provide the termination pattern described above for FIG. 16B.

Bottom-left IOI circuit 13-BL also includes capture circuit 1303, which has programmable connections to the global clock bus 1801, vertical hex lines 1904 and horizontal hex lines 1804 as illustrated.

Those having skill in the relevant arts of the invention will now perceive various modifications and additions that may be made as a result of the disclosure herein of the preferred embodiment. Accordingly, all such modifications and additions are deemed to be within the scope of the invention, which is to be limited only by the appended claims and their equivalents.

We claim:

1. A programmable logic device comprising:
   an array of configurable logic elements (CLES) arranged in rows and columns;
   a first set of long lines extending along a column of CLEs in a regular pattern;
   a first set of intermediate-length buses extending along the column of CLEs in a regular pattern;
   a first set of programmable interconnection points (PIPs) for coupling the intermediate length buses to CLEs in the column of CLEs in a regular pattern;
   a second set of PIPs for coupling the long lines to the intermediate length buses in a regular pattern; and
   a third set of PIPs located at a first edge of the column of CLEs, wherein the third set of PIPs programmably couples the long lines to the intermediate length buses at the first edge, and wherein the regular pattern of connections between the long lines and the intermediate length buses is maintained by the third set of PIPs.

2. The programmable logic device of claim 1, wherein the intermediate length buses are configured to transmit signals in a bi-directional manner.

3. The programmable logic device of claim 1, further comprising a fourth set of PIPs located at a second edge of the column of CLEs, wherein the fourth set of PIPs programmably couples the long lines to the intermediate length buses at the second edge, and wherein the regular pattern of connections between the long lines and the intermediate length buses is maintained by the fourth set of PIPs.

4. The programmable logic device of claim 1, further comprising:
   a second set of long lines extending along a row of CLEs in a regular pattern;
   a second set of intermediate-length buses extending along the row of CLEs in a regular pattern;
   a fourth set of programmable interconnection points (PIPs) for coupling the second set of intermediate length buses to CLEs in the row of CLEs in a regular pattern;
   a fifth set of PIPs for coupling the second set of long lines to the second set of intermediate length buses in a regular pattern; and
   a sixth set of PIPs located at a first edge of the row of CLEs, wherein the sixth set of PIPs programmably couples the long lines to the intermediate length buses at the first edge of the row, and wherein the regular pattern of connections between the second set of long lines and the second set of intermediate length buses is maintained by the sixth set of PIPs.

5. An interconnect circuit for a programmable logic device comprising:
   a plurality of intermediate-length buses located in parallel with a column of logic blocks, the intermediate-length buses being staggered along the column of logic blocks, wherein only a subset of intermediate-length buses adjacent to a logic block is connected to the logic block; and
   a first routing circuit connecting a first set of the intermediate-length buses to a second set of the intermediate-length buses at a first end of the column of logic blocks.

6. The interconnect circuit of claim 5, further comprising:
   a plurality of intermediate-length buses located in parallel with a row of logic blocks, the intermediate-length buses being staggered along the row of logic blocks, wherein only a subset of intermediate-length buses adjacent to a logic block is connected to the logic block; and
   a second routing circuit connecting a third set of the intermediate-length buses to a fourth set of the intermediate-length buses at a first end of the row of logic blocks.

7. The interconnect circuit of claim 5, further comprising a second routing circuit connecting a third set of the intermediate-length buses to a fourth set of the intermediate-length buses at a second end of the column of logic blocks.

8. The interconnect circuit of claim 5, wherein each of the intermediate-length buses spans at least three logic blocks.

9. The interconnect circuit of claim 5, wherein the routing circuit connects the intermediate-length buses in a U-turn configuration.

10. The interconnect circuit of claim 5, wherein the intermediate-length buses are unidirectional buses.

11. The interconnect circuit of claim 5, wherein the routing circuit comprises one or more buffers for driving one or more of the intermediate-length buses.

12. The interconnect circuit of claim 5, wherein the intermediate-length buses have the same pattern adjacent to each of the logic blocks.

13. The interconnect circuit of claim 5, further comprising one or more input/output blocks coupled to the routing circuit.

14. The interconnect circuit of claim 5, wherein each intermediate-length bus spans a fixed number logic blocks.

15. The interconnect circuit of claim 5, wherein the intermediate length buses form an identical pattern adjacent to each of the logic blocks.

16. A programmable logic device comprising:
   an array of configurable logic elements (CLEs) arranged in rows and columns;
   a first set of long lines extending along a first edge of the array in a regular pattern;
   a first set of intermediate-length buses extending along the first edge of the array in a regular pattern;
   a first set of programmable interconnection points (PIPs) for coupling the long lines to the intermediate length buses in a regular pattern along the first edge of the array; and a second set of PIPs located at a first end of the first edge, wherein the second set of PIPs is configured to terminate the long lines to the intermediate length buses at the first end, the regular pattern of connections between the long lines and the intermediate length buses established by the first set of PIPs being maintained by the second set of PIPs.

17. The programmable logic device of claim 16, wherein the intermediate length buses are configured to transmit signals in a bi-directional manner.

18. The programmable logic device of claim 16, further comprising a third set of PIPs located at a second end of the first edge, wherein the third set of PIPs is configured to terminate the long lines to the intermediate length buses at the second end, the regular pattern of connections between the long lines and the intermediate length buses established by the first set of PIPs being maintained by the third set of PIPs.

19. The programmable logic device of claim 16, further comprising:

a second set of long lines extending along a second edge of the array in a regular pattern, the second edge being perpendicular to the first edge;

a second set of intermediate-length buses extending along the second edge of the array in a regular pattern;

a third set of programmable interconnection points (PIPs) for coupling the second set of long lines to the second set of intermediate length buses in a regular pattern along the second edge of the array; and a fourth set of PIPs located at a first end of the second edge, wherein the fourth set of PIPs is configured to terminate the second set of long lines to the second set of intermediate length buses at the first end of the second edge, the regular pattern of connections between the second set of long lines and the second set of intermediate length buses established by the third set of PIPs being maintained by the fourth set of PIPs.

20. An interconnect circuit comprising:

an array of configurable logic elements (CLEs) arranged along a first axis and a second axis, wherein the first axis is perpendicular to the second axis;

a first set of long lines extending the length of the array along the first axis;

a second set of long lines extending the length of the array along the second axis;

a set of intermediate-length buses extending along the first axis in a regular pattern, wherein each of the intermediate-length buses extends past at least three CLEs;

a first set of programmable interconnection points (PIPs) for coupling the first set of long lines to the set of intermediate-length buses; and a second set of PIPs for coupling the set of intermediate-length buses to the second set of long lines.

21. The interconnect circuit of claim 20, further comprising interconnect circuitry for coupling the second set of long lines to the CLEs.

* * * * *